(12) United States Patent
Yamazaki et al.

(10) Patent No.: US 12,324,189 B2
(45) Date of Patent: Jun. 3, 2025

(54) SEMICONDUCTOR DEVICE AND MANUFACTURING METHOD THEREOF

(71) Applicant: SEMICONDUCTOR ENERGY LABORATORY CO., LTD., Atsugi (JP)

(72) Inventors: Shunpei Yamazaki, Tokyo (JP); Kengo Akimoto, Atsugi (JP); Daisuke Kawae, Chiba (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 560 days.

(21) Appl. No.: 17/582,038

(22) Filed: Jan. 24, 2022

(65) Prior Publication Data
US 2022/0149164 A1    May 12, 2022

Related U.S. Application Data

(63) Continuation of application No. 16/846,569, filed on Apr. 13, 2020, now Pat. No. 11,239,332, which is a
(Continued)

(30) Foreign Application Priority Data

Nov. 7, 2008   (JP) ................................. 2008-287187

(51) Int. Cl.
*H10D 30/67*   (2025.01)
*H01L 21/02*   (2006.01)
(Continued)

(52) U.S. Cl.
CPC ......... *H10D 30/6729* (2025.01); *H10D 30/67* (2025.01); *H10D 30/6713* (2025.01);
(Continued)

(58) Field of Classification Search
CPC ............ H01L 27/1225; H01L 27/1288; H01L 29/4908; H01L 29/786; H01L 29/41733;
(Continued)

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

CN    001573489 A    2/2005
CN    101283444 A    10/2008
(Continued)

OTHER PUBLICATIONS

Dembo.H et al., "RFCPUs on Glass and Plastic Substrates Fabricated By TFT Transfer Technology", IEDM 05: Technical Digest of International Electron Devices Meeting, Dec. 5, 2005, pp. 1067-1069.
(Continued)

*Primary Examiner* — Peter Bradford
*Assistant Examiner* — Ryan T. Fortin
(74) *Attorney, Agent, or Firm* — Fish & Richardson P.C.

(57) ABSTRACT

A structure by which electric-field concentration which might occur between a source electrode and a drain electrode in a bottom-gate thin film transistor is relaxed and deterioration of the switching characteristics is suppressed, and a manufacturing method thereof. A bottom-gate thin film transistor in which an oxide semiconductor layer is provided over a source and drain electrodes is manufactured, and angle θ1 of the side surface of the source electrode which is in contact with the oxide semiconductor layer and angle θ2 of the side surface of the drain electrode which is in contact with the oxide semiconductor layer are each set to be greater than or equal to 20° and less than 90°, so that the
(Continued)

distance from the top edge to the bottom edge in the side surface of each electrode is increased.

3 Claims, 37 Drawing Sheets

Related U.S. Application Data continuation of application No. 16/180,580, filed on Nov. 5, 2018, now Pat. No. 10,665,684, which is a continuation of application No. 15/841,891, filed on Dec. 14, 2017, now Pat. No. 10,411,102, which is a continuation of application No. 15/074,287, filed on Mar. 18, 2016, now Pat. No. 9,847,396, which is a continuation of application No. 14/451,680, filed on Aug. 5, 2014, now Pat. No. 9,293,545, which is a continuation of application No. 13/763,874, filed on Feb. 11, 2013, now Pat. No. 8,803,146, which is a continuation of application No. 12/613,769, filed on Nov. 6, 2009, now Pat. No. 8,373,164, which is a continuation of application No. 12/606,262, filed on Oct. 27, 2009, now abandoned.

(51) Int. Cl.
   *H10D 86/01*    (2025.01)
   *H10D 86/40*    (2025.01)
   *H10D 86/60*    (2025.01)
   *H10K 10/46*    (2023.01)
   *H10K 10/84*    (2023.01)

(52) U.S. Cl.
   CPC ..... *H10D 30/6739* (2025.01); *H10D 30/6755* (2025.01); *H10D 30/6757* (2025.01); *H10D 86/0231* (2025.01); *H10D 86/423* (2025.01); *H10D 86/60* (2025.01); *H10K 10/46* (2023.02); *H10K 10/462* (2023.02); *H10K 10/466* (2023.02); *H10K 10/84* (2023.02); *H01L 21/02554* (2013.01); *H01L 21/02565* (2013.01); *H01L 21/02631* (2013.01)

(58) Field of Classification Search
   CPC ........... H01L 29/78618; H01L 29/7869; H01L 29/78696; H01L 21/02554; H01L 21/02565; H01L 21/02631; H10K 10/46; H10K 10/462; H10K 10/466; H10K 10/84; H10K 59/1213; H10K 59/1216; H10K 59/124; G02F 1/1368; G02F 1/136213; H10D 30/6729; H10D 30/67; H10D 30/6713; H10D 30/6739; H10D 30/6755; H10D 30/6757; H10D 86/0231; H10D 86/423; H10D 86/60
   See application file for complete search history.

(56) References Cited

U.S. PATENT DOCUMENTS

| | | |
|---|---|---|
| 5,847,410 A | 12/1998 | Nakajima |
| 6,294,274 B1 | 9/2001 | Kawazoe et al. |
| 6,462,722 B1 | 10/2002 | Kimura et al. |
| 6,522,315 B2 | 2/2003 | Ozawa et al. |
| 6,532,045 B2 | 3/2003 | Chung et al. |
| 6,563,174 B2 | 5/2003 | Kawasaki et al. |
| 6,586,346 B1 | 7/2003 | Yamazaki et al. |
| 6,620,719 B1 | 9/2003 | Andry et al. |
| 6,727,522 B1 | 4/2004 | Kawasaki et al. |
| 6,839,045 B2 | 1/2005 | Ozawa et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,081,641 B2 | 7/2006 | Kawasaki et al. |
| 7,095,460 B2 | 8/2006 | Choi et al. |
| 7,105,868 B2 | 9/2006 | Nause et al. |
| 7,170,576 B2 | 1/2007 | Jun et al. |
| 7,180,483 B2 | 2/2007 | Kimura et al. |
| 7,211,825 B2 | 5/2007 | Shih et al. |
| 7,221,339 B2 | 5/2007 | Ozawa et al. |
| 7,224,333 B2 | 5/2007 | Yamazaki et al. |
| 7,250,928 B2 | 7/2007 | Yamazaki et al. |
| 7,253,793 B2 | 8/2007 | Ozawa et al. |
| 7,282,782 B2 | 10/2007 | Hoffman et al. |
| 7,295,255 B2 | 11/2007 | Jun et al. |
| 7,297,977 B2 | 11/2007 | Hoffman et al. |
| 7,298,084 B2 | 11/2007 | Baude et al. |
| 7,301,170 B2 | 11/2007 | Cho et al. |
| 7,301,211 B2 | 11/2007 | Yamazaki et al. |
| 7,323,356 B2 | 1/2008 | Hosono et al. |
| 7,323,368 B2 | 1/2008 | Takayama et al. |
| 7,365,810 B2 | 4/2008 | Gotoh et al. |
| 7,375,705 B2 | 5/2008 | Morita |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,499,117 B2 | 3/2009 | Maekawa et al. |
| 7,501,293 B2 | 3/2009 | Ito et al. |
| 7,550,768 B2 | 6/2009 | Cho et al. |
| 7,561,243 B2 | 7/2009 | Nakayama et al. |
| 7,564,058 B2 | 7/2009 | Yamazaki et al. |
| 7,566,633 B2 | 7/2009 | Koyama et al. |
| 7,576,394 B2 | 8/2009 | Furuta et al. |
| 7,576,828 B2 | 8/2009 | Nakayama et al. |
| 7,615,783 B2 | 11/2009 | Choi et al. |
| 7,646,015 B2 | 1/2010 | Fujii et al. |
| 7,648,861 B2 | 1/2010 | Yamazaki et al. |
| 7,662,715 B2 | 2/2010 | Cho et al. |
| 7,674,650 B2 | 3/2010 | Akimoto et al. |
| 7,692,245 B2 | 4/2010 | Koo et al. |
| 7,696,513 B2 | 4/2010 | Hayashi et al. |
| 7,710,364 B2 | 5/2010 | Ozawa et al. |
| 7,732,819 B2 | 6/2010 | Akimoto et al. |
| 7,736,936 B2 | 6/2010 | Tanaka |
| 7,772,021 B2 | 8/2010 | Lee et al. |
| 7,820,495 B2 | 10/2010 | Dairiki et al. |
| 7,824,939 B2 | 11/2010 | Hosoya et al. |
| 7,825,407 B2 | 11/2010 | Fujii et al. |
| 7,880,696 B2 | 2/2011 | Ozawa et al. |
| 7,906,784 B2 | 3/2011 | Koyama et al. |
| 7,910,053 B2 | 3/2011 | Inoue et al. |
| 7,960,730 B2 | 6/2011 | Lee et al. |
| 7,968,382 B2 | 6/2011 | Jinbo et al. |
| 7,981,734 B2 | 7/2011 | Furuta et al. |
| 8,003,449 B2 | 8/2011 | Akimoto et al. |
| 8,021,917 B2 | 9/2011 | Akimoto et al. |
| 8,030,663 B2 | 10/2011 | Yamazaki et al. |
| 8,049,206 B2 | 11/2011 | Furukawa et al. |
| 8,053,269 B2 | 11/2011 | Tanaka |
| 8,115,201 B2 | 2/2012 | Yamazaki et al. |
| 8,134,156 B2 | 3/2012 | Akimoto |
| 8,143,115 B2 | 3/2012 | Omura et al. |
| 8,148,721 B2 | 4/2012 | Hayashi et al. |
| 8,154,199 B2 | 4/2012 | Ozawa et al. |
| 8,158,464 B2 | 4/2012 | Akimoto |
| 8,188,647 B2 | 5/2012 | Kimura et al. |
| 8,218,122 B2 | 7/2012 | Takasawa et al. |
| 8,232,552 B2 | 7/2012 | Yano et al. |
| 8,243,055 B2 | 8/2012 | Abe |
| 8,247,967 B2 | 8/2012 | Ozawa et al. |
| 8,330,157 B2 | 12/2012 | Fujii et al. |
| 8,354,978 B2 | 1/2013 | Ozawa et al. |
| 8,361,845 B2 | 1/2013 | Dairiki et al. |
| 8,362,474 B2 | 1/2013 | Furukawa et al. |
| 8,362,489 B2 | 1/2013 | Kimura et al. |
| 8,368,079 B2 | 2/2013 | Akimoto |

(56) References Cited

U.S. PATENT DOCUMENTS

| | | | |
|---|---|---|---|
| 8,373,164 B2 | 2/2013 | Yamazaki et al. | |
| 8,399,313 B2 | 3/2013 | Akimoto et al. | |
| 8,409,905 B2 | 4/2013 | Tanaka | |
| 8,477,085 B2 | 7/2013 | Shishido | |
| 8,502,216 B2 | 8/2013 | Akimoto et al. | |
| 8,525,165 B2 | 9/2013 | Akimoto | |
| 8,803,146 B2 | 8/2014 | Yamazaki et al. | |
| 8,900,970 B2 | 12/2014 | Maruyama et al. | |
| 8,937,580 B2 | 1/2015 | Miyagawa | |
| 8,994,060 B2 | 3/2015 | Jinbo et al. | |
| 9,117,915 B2 | 8/2015 | Lu et al. | |
| 9,153,168 B2 | 10/2015 | Osame et al. | |
| 9,184,221 B2 | 11/2015 | Jinbo et al. | |
| 9,293,545 B2 | 3/2016 | Yamazaki et al. | |
| 9,905,699 B2 | 2/2018 | Hayashi et al. | |
| 10,158,005 B2 | 12/2018 | Akimoto et al. | |
| 10,714,627 B2 | 7/2020 | Hayashi et al. | |
| 2001/0046027 A1 | 11/2001 | Tai et al. | |
| 2002/0044208 A1* | 4/2002 | Yamazaki | H01L 27/14632 348/E5.025 |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2003/0231273 A1 | 12/2003 | Kimura et al. | |
| 2004/0038446 A1 | 2/2004 | Takeda et al. | |
| 2004/0108562 A1 | 6/2004 | Nagayama et al. | |
| 2004/0127038 A1 | 7/2004 | Carcia et al. | |
| 2005/0017302 A1 | 1/2005 | Hoffman | |
| 2005/0050897 A1 | 3/2005 | Lewis | |
| 2005/0056897 A1 | 3/2005 | Kawasaki et al. | |
| 2005/0199959 A1 | 9/2005 | Chiang et al. | |
| 2005/0205870 A1 | 9/2005 | Yamazaki | |
| 2005/0243079 A1* | 11/2005 | Ozaki | G09G 3/2022 345/204 |
| 2006/0027804 A1 | 2/2006 | Yamazaki et al. | |
| 2006/0033098 A1 | 2/2006 | Shih et al. | |
| 2006/0035452 A1 | 2/2006 | Carcia et al. | |
| 2006/0043377 A1 | 3/2006 | Hoffman et al. | |
| 2006/0046336 A1 | 3/2006 | Shoji et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0163743 A1 | 7/2006 | Kuwabara et al. | |
| 2006/0169973 A1 | 8/2006 | Isa et al. | |
| 2006/0170111 A1 | 8/2006 | Isa et al. | |
| 2006/0170622 A1* | 8/2006 | Endo | G09G 5/393 345/76 |
| 2006/0197092 A1 | 9/2006 | Hoffman et al. | |
| 2006/0202206 A1 | 9/2006 | Koyama et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0275618 A1 | 12/2006 | Kugimiya et al. | |
| 2006/0284171 A1 | 12/2006 | Levy et al. | |
| 2006/0284172 A1 | 12/2006 | Ishii | |
| 2006/0292726 A1 | 12/2006 | Akimoto et al. | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0046590 A1 | 3/2007 | Umezaki et al. | |
| 2007/0052025 A1 | 3/2007 | Yabuta | |
| 2007/0054507 A1 | 3/2007 | Kaji et al. | |
| 2007/0072439 A1* | 3/2007 | Akimoto | H01L 29/045 438/795 |
| 2007/0075372 A1 | 4/2007 | Terashima et al. | |
| 2007/0089028 A1 | 4/2007 | Ito et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0158652 A1 | 7/2007 | Lee et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0036698 A1 | 2/2008 | Kawasaki et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0062112 A1* | 3/2008 | Umezaki | H01L 27/124 345/100 |
| 2008/0073653 A1 | 3/2008 | Iwasaki | |
| 2008/0079001 A1* | 4/2008 | Umezaki | G02F 1/1368 257/E27.111 |
| 2008/0079685 A1* | 4/2008 | Umezaki | G09G 3/3677 345/100 |
| 2008/0083950 A1 | 4/2008 | Pan et al. | |
| 2008/0090341 A1 | 4/2008 | Tanaka et al. | |
| 2008/0099757 A1 | 5/2008 | Furukawa et al. | |
| 2008/0106191 A1 | 5/2008 | Kawase | |
| 2008/0123383 A1 | 5/2008 | Shionoiri | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0203387 A1 | 8/2008 | Kang et al. | |
| 2008/0224133 A1 | 9/2008 | Park et al. | |
| 2008/0237598 A1 | 10/2008 | Nakayama | |
| 2008/0246700 A1 | 10/2008 | Ozawa et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0299683 A1 | 12/2008 | Qu | |
| 2008/0299693 A1 | 12/2008 | Toyota et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0004772 A1 | 1/2009 | Jinbo et al. | |
| 2009/0008639 A1 | 1/2009 | Akimoto et al. | |
| 2009/0065771 A1 | 3/2009 | Iwasaki et al. | |
| 2009/0068773 A1 | 3/2009 | Lai et al. | |
| 2009/0073325 A1 | 3/2009 | Kuwabara et al. | |
| 2009/0073653 A1 | 3/2009 | Hiroi | |
| 2009/0114910 A1 | 5/2009 | Chang | |
| 2009/0114917 A1 | 5/2009 | Yamazaki et al. | |
| 2009/0134383 A1 | 5/2009 | Imahayashi et al. | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0186445 A1 | 7/2009 | Akimoto | |
| 2009/0189155 A1 | 7/2009 | Akimoto | |
| 2009/0189156 A1 | 7/2009 | Akimoto | |
| 2009/0278122 A1 | 11/2009 | Hosono et al. | |
| 2009/0280600 A1 | 11/2009 | Hosono et al. | |
| 2010/0003783 A1 | 1/2010 | Akimoto | |
| 2010/0025678 A1 | 2/2010 | Yamazaki et al. | |
| 2010/0025679 A1 | 2/2010 | Yamazaki et al. | |
| 2010/0044711 A1 | 2/2010 | Imai | |
| 2010/0065844 A1 | 3/2010 | Tokunaga | |
| 2010/0090217 A1 | 4/2010 | Akimoto | |
| 2010/0092800 A1 | 4/2010 | Itagaki et al. | |
| 2010/0109002 A1 | 5/2010 | Itagaki et al. | |
| 2010/0117075 A1 | 5/2010 | Akimoto et al. | |
| 2010/0117086 A1 | 5/2010 | Akimoto et al. | |
| 2011/0057958 A1 | 3/2011 | Morita | |
| 2011/0062419 A1 | 3/2011 | Kikuchi et al. | |
| 2011/0318916 A1 | 12/2011 | Akimoto et al. | |
| 2012/0058599 A1 | 3/2012 | Yamazaki et al. | |
| 2012/0132910 A1 | 5/2012 | Yamazaki et al. | |

(56) References Cited

U.S. PATENT DOCUMENTS

| | | | |
|---|---|---|---|
| 2012/0168750 A1 | 7/2012 | Hayashi et al. | |
| 2012/0299902 A1 | 11/2012 | Ozawa et al. | |
| 2013/0299824 A1 | 11/2013 | Akimoto et al. | |
| 2014/0339556 A1 | 11/2014 | Yamazaki et al. | |
| 2015/0123109 A1 | 5/2015 | Miyagawa | |
| 2015/0248859 A1 | 9/2015 | Miyagawa | |

FOREIGN PATENT DOCUMENTS

| | | |
|---|---|---|
| EP | 0895219 A | 2/1999 |
| EP | 0917127 A | 5/1999 |
| EP | 1255240 A | 11/2002 |
| EP | 1336953 A | 8/2003 |
| EP | 1337131 A | 8/2003 |
| EP | 1359789 A | 11/2003 |
| EP | 1363265 A | 11/2003 |
| EP | 1619654 A | 1/2006 |
| EP | 1624333 A | 2/2006 |
| EP | 1737044 A | 12/2006 |
| EP | 1830342 A | 9/2007 |
| EP | 1830343 A | 9/2007 |
| EP | 1830344 A | 9/2007 |
| EP | 2096666 A | 9/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 07-064112 A | 3/1995 |
| JP | 08-236775 A | 9/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-308345 A | 11/2001 |
| JP | 2002-076356 A | 3/2002 |
| JP | 2002-289859 A | 10/2002 |
| JP | 2003-037268 A | 2/2003 |
| JP | 2003-066488 A | 3/2003 |
| JP | 2003-086000 A | 3/2003 |
| JP | 2003-086808 A | 3/2003 |
| JP | 2003-195814 A | 7/2003 |
| JP | 2003-280587 A | 10/2003 |
| JP | 2004-046218 A | 2/2004 |
| JP | 2004-103957 A | 4/2004 |
| JP | 2004-273614 A | 9/2004 |
| JP | 2004-273732 A | 9/2004 |
| JP | 2005-077822 A | 3/2005 |
| JP | 2005-092188 A | 4/2005 |
| JP | 2005-093542 A | 4/2005 |
| JP | 2005-223049 A | 8/2005 |
| JP | 2005-266346 A | 9/2005 |
| JP | 2005-285890 A | 10/2005 |
| JP | 2005-354036 A | 12/2005 |
| JP | 2006-023388 A | 1/2006 |
| JP | 2006-080494 A | 3/2006 |
| JP | 2006-080495 A | 3/2006 |
| JP | 2006-080505 A | 3/2006 |
| JP | 2006-165527 A | 6/2006 |
| JP | 2006-179878 A | 7/2006 |
| JP | 2006-227238 A | 8/2006 |
| JP | 2006-270077 A | 10/2006 |
| JP | 2006-286719 A | 10/2006 |
| JP | 2007-017926 A | 1/2007 |
| JP | 2007-043121 A | 2/2007 |
| JP | 2007-096055 A | 4/2007 |
| JP | 2007-123861 A | 5/2007 |
| JP | 2007-165861 A | 6/2007 |
| JP | 2007-250983 A | 9/2007 |
| JP | 2007-250984 A | 9/2007 |
| JP | 2007-317934 A | 12/2007 |
| JP | 2007-318105 A | 12/2007 |
| JP | 2008-042043 A | 2/2008 |
| JP | 2008-085313 A | 4/2008 |
| JP | 2008-089874 A * | 4/2008 ....... G02F 1/133345 |
| JP | 2008-135731 A | 6/2008 |
| JP | 2008-151963 A | 7/2008 |
| JP | 2008-166716 A | 7/2008 |
| JP | 2008-176287 A | 7/2008 |
| JP | 2008-535205 | 8/2008 |
| JP | 2008-205451 A | 9/2008 |
| JP | 2008-211191 A | 9/2008 |
| JP | 2008-216529 A | 9/2008 |
| JP | 2008-241783 A | 10/2008 |
| JP | 2008-243928 A | 10/2008 |
| JP | 2009-124124 A | 6/2009 |
| KR | 2003-0027302 A | 4/2003 |
| KR | 2006-0012942 A | 2/2006 |
| KR | 2007-0057505 A | 6/2007 |
| KR | 2008-0048936 A | 6/2008 |
| KR | 2008-0070811 A | 7/2008 |
| KR | 2009-0098341 A | 9/2009 |
| TW | 200525263 | 8/2005 |
| TW | 200800892 | 1/2008 |
| TW | 200802888 | 1/2008 |
| TW | 201034201 | 9/2010 |
| WO | WO-1998/036407 | 8/1998 |
| WO | WO-2003/036376 | 5/2003 |
| WO | WO-2004/114391 | 12/2004 |
| WO | WO-2005/038931 | 4/2005 |
| WO | WO-2005/047966 | 5/2005 |
| WO | WO-2006/126363 | 11/2006 |
| WO | WO-2007/058329 | 5/2007 |
| WO | WO-2007/086534 | 8/2007 |
| WO | WO-2007/089048 | 8/2007 |
| WO | WO-2007/119321 | 10/2007 |
| WO | WO-2007/119386 | 10/2007 |
| WO | WO-2008/069056 | 6/2008 |
| WO | WO-2008/069255 | 6/2008 |
| WO | WO-2008/075697 | 6/2008 |
| WO | WO-2008/081806 | 7/2008 |
| WO | WO-2010/053060 | 5/2010 |

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IgZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Lee.J et al., "World's Largest (15-Inch) XGA AMLCD Panel Using IgZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Kurokawa.Y et al., "UHF RFCPUs on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors By DC Sputtering", SID Digest '09 : SID International Symposium Digest of Technical Papers, May 31, 2009, pp. 191-193.
Jin.D et al., "65.2: Distinguished Paper: World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AMOLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—G—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "p. 9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper: Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. a (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies In ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects In ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

(56) References Cited

OTHER PUBLICATIONS

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "p. 29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GiZO (Ga2O3—In2O3—ZnO) TFT", SID Digest '08 : SID International Symposium Digest of Technical Papers, May 20, 2008, vol. 39, pp. 633-636.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Chinese Office Action (Application No. 200910206768.3) Dated Mar. 15, 2013.
Korean Office Action (Application No. 2016-0089231) Dated Jul. 27, 2016.
Taiwanese Office Action (Application No. 106129813) Dated Jun. 5, 2018.
Petition for Inter Partes Review U.S. Pat. No. 9,293,545 B2, Dated Jul. 13, 2018, p. 63.
Power of Attorney, Dated Jul. 13, 2018, p. 2.
Ex. 1003 Expert Declaration of Richard A. Flasck, Dated Jul. 13, 2018, p. 75.
Ex. 1001 U.S. Pat. No. 9,293,545 B2, Dated Jul. 13, 2018, p. 66.
Ex. 1002 Prosecution History of U.S. Pat. No. 9,293,545 B2(pp. 1-246), Dated Jul. 13, 2018, pp. 1-246.
Ex. 1002 Continued Prosecution History of U.S. Pat. No. 9,293,545 B2(pp. 247-490), Dated Jul. 13, 2018, pp. 247-490.
Ex. 1004 US Patent Application Publication No. 20080299693 A1 Toyota et al., Dated Jul. 13, 2018, p. 24.
Ex. 1005 US Patent Application Publication No. 20070072439 A1 Akimoto et al., Dated Jul. 13, 2018, p. 48.
Ex. 1006 US Patent Application Publication No. 20050173752 A1 Chung et al., Dated Jul. 13, 2018, p. 38.
Mandatory Notice, Dated Aug. 3, 2018, p. 4.
Power of Attorney, Dated Aug. 3, 2018, p. 1.
Notice of Accord Filing Date, Dated Aug. 31, 2018, p. 5.
Taiwanese Office Action (Application No. 107144197) Dated Mar. 23, 2020.
Taiwanese Office Action (Application No. 109104574) Dated Mar. 24, 2020.
Taiwanese Office Action (Application No. 109132559) Dated Jun. 29, 2021.
Taiwanese Office Action (Application No. 110134464) Dated Jun. 27, 2023.

\* cited by examiner

FIG. 9A1
FIG. 9A2
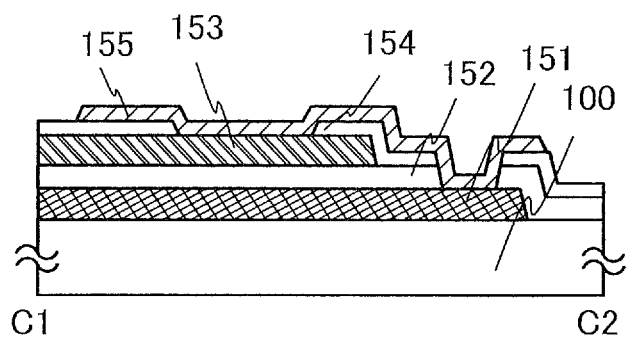
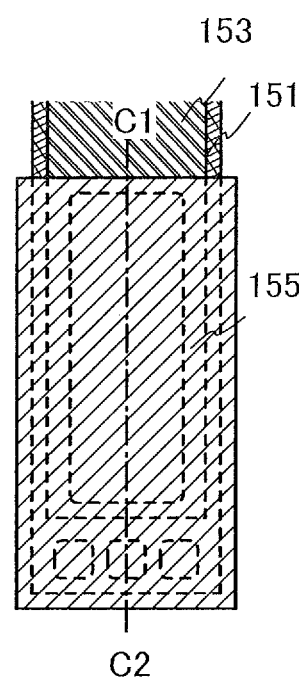
FIG. 9B1
FIG. 9B2
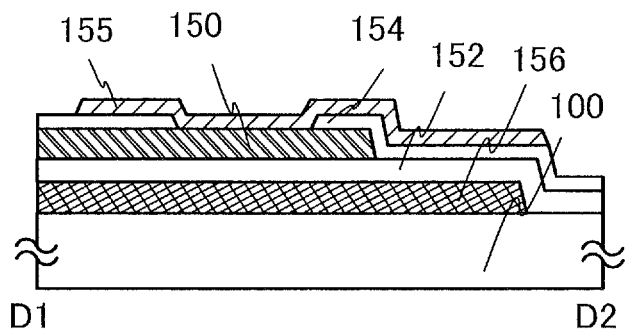
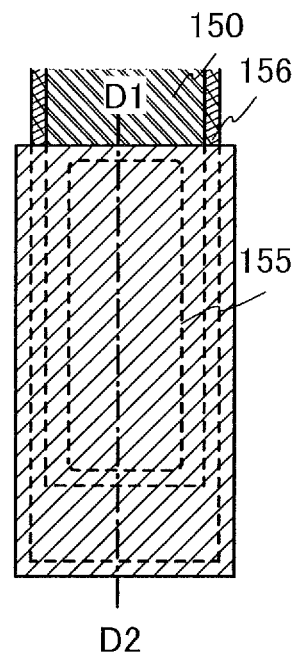

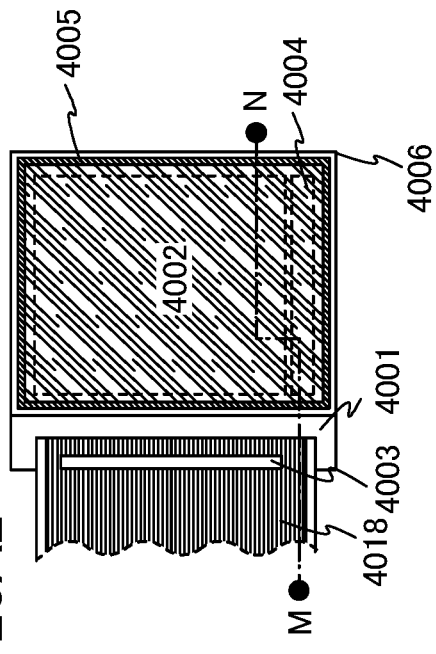
FIG. 20A1
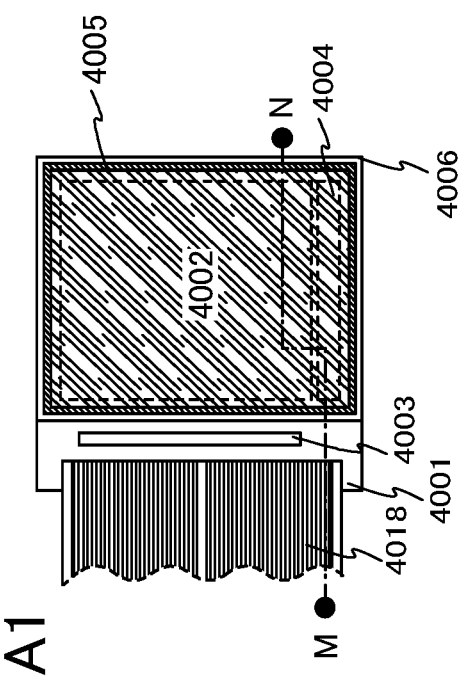
FIG. 20A2
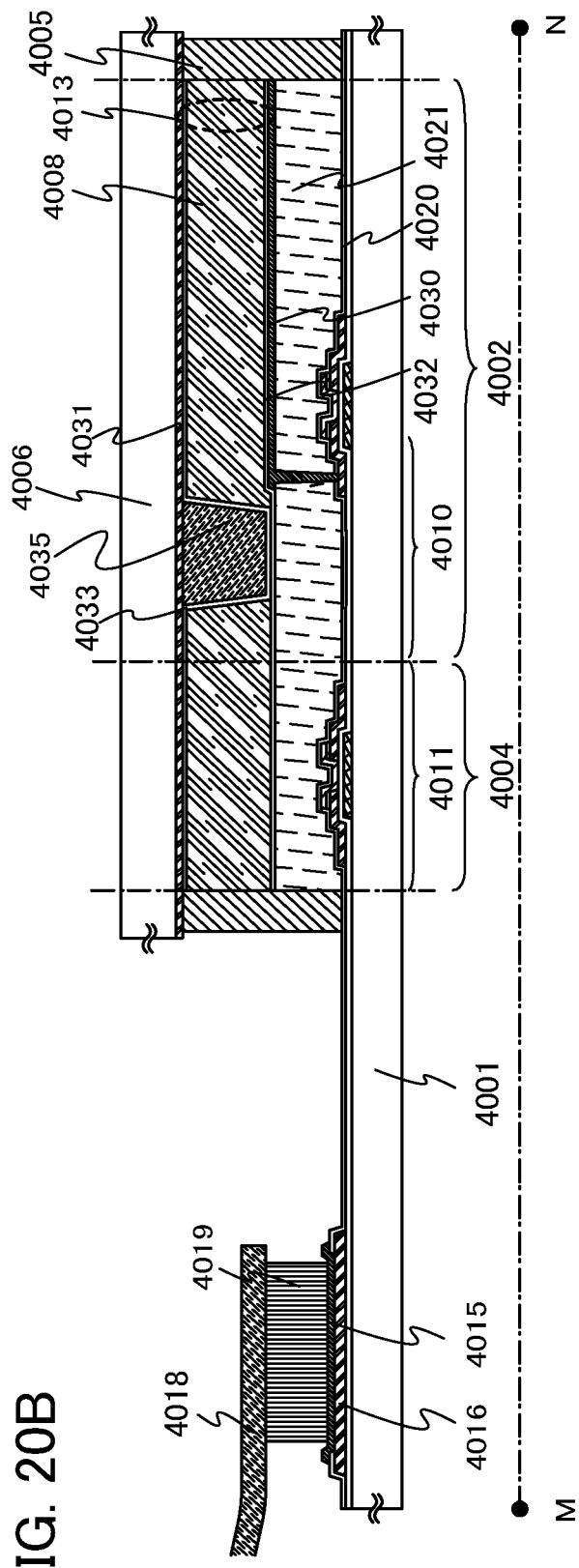
FIG. 20B

SEMICONDUCTOR DEVICE AND MANUFACTURING METHOD THEREOF

CROSS-REFERENCE TO RELATED APPLICATIONS

This application is a continuation of U.S. application Ser. No. 16/846,569, filed Apr. 13, 2020, now allowed, which is a continuation of U.S. application Ser. No. 16/180,580, filed Nov. 5, 2018, now U.S. Pat. No. 10,665,684, which is a continuation of U.S. application Ser. No. 15/841,891, filed Dec. 14, 2017, now U.S. Pat. No. 10,411,102, which is a continuation of U.S. application Ser. No. 15/074,287, filed Mar. 18, 2016, now U.S. Pat. No. 9,847,396, which is a continuation of U.S. application Ser. No. 14/451,680, filed Aug. 5, 2014, now U.S. Pat. No. 9,293,545, which is a continuation of U.S. application Ser. No. 13/763,874, filed Feb. 11, 2013, now U.S. Pat. No. 8,803,146, which is a continuation of U.S. application Ser. No. 12/613,769, filed Nov. 6, 2009, now U.S. Pat. No. 8,373,164, which is a continuation of U.S. application Ser. No. 12/606,262, filed Oct. 27, 2009, now abandoned, which claims the benefit of a foreign priority application filed in Japan as Serial No. 2008-287187 on Nov. 7, 2008, all of which are incorporated by reference.

BACKGROUND OF THE INVENTION

1. Field of the Invention

The present invention relates to a display device using an oxide semiconductor and a method for manufacturing the same.

2. Description of the Related Art

As typically seen in liquid crystal display devices, a thin film transistor formed over a flat plate such as a glass substrate is manufactured using amorphous silicon or polycrystalline silicon. A thin film transistor manufactured using amorphous silicon has low field effect mobility, but can be formed over a larger glass substrate. In contrast, a thin film transistor manufactured using crystalline silicon has high field effect mobility, but due to the necessity of a crystallization step such as laser annealing, such a transistor is not always suitable for being formed over a larger glass substrate.

In view of the foregoing, attention has been drawn to a technique in which a thin film transistor is manufactured using an oxide semiconductor and applied to electronic appliances or optical devices. For example, Patent Document 1 and Patent Document 2 disclose a technique in which a thin film transistor is manufactured using zinc oxide or an In—Ga—Zn—O-based oxide semiconductor for forming an oxide semiconductor film and such a transistor is used as a switching element or the like of an image display device.

Patent Document 1: Japanese Published Patent Application No. 2007-123861

Patent Document 2: Japanese Published Patent Application No. 2007-096055

SUMMARY OF THE INVENTION

It is one object of the present invention to provide a structure by which electric-field concentration which might occur between a source electrode and a drain electrode in a bottom-gate thin film transistor is relaxed and deterioration of the switching characteristics is suppressed, and a manufacturing method thereof.

Further, it is one object of the present invention to provide a structure by which coverage by an oxide semiconductor layer is improved and a manufacturing method thereof.

In accordance with the present invention, a bottom-gate thin film transistor in which an oxide semiconductor layer is provided over a source and drain electrodes is manufactured, and angle θ1 of the side surface of the source electrode which is in contact with the oxide semiconductor layer and angle θ2 of the side surface of the drain electrode which is in contact with the oxide semiconductor layer are each set to be greater than or equal to 20° and less than 90°, so that the distance from the top edge to the bottom edge in the side surface of each electrode is increased.

One embodiment of the present invention disclosed in this specification is a semiconductor device wherein a gate electrode is formed over a substrate having an insulating surface, an insulating layer is formed over the gate electrode, a source and drain electrodes are formed over the insulating layer, an oxide semiconductor layer is formed between their respective side surfaces of the source and drain electrodes, which face each other, so as to overlap with the gate electrode with the insulating layer interposed therebetween, and the angle formed between the surface of the substrate and the side surface of the source electrode and the angle formed between the surface of the substrate and the side surface of the drain electrode are each greater than or equal to 20° and less than 90°.

With the above embodiment, at least one of the objects can be achieved.

A native oxide film is formed at least on the side surfaces of the source and drain electrodes, which depends on a metal material of the source and drain electrodes. This native oxide film is formed by exposure to an atmosphere containing oxygen, such as the air, after etching for forming the source and drain electrodes. The native oxide film is also formed with oxygen contained in the atmosphere for deposition of the oxide semiconductor layer after etching for forming the source and drain electrodes.

In order to prevent formation of the native oxide film on the electrodes, it is preferable that a buffer layer (also called an n$^+$ layer) is formed successively without exposure to the air on and in contact with a metal film formed by a sputtering method. This buffer layer is an oxide semiconductor layer which has lower resistance than the oxide semiconductor layer which is formed thereover, and functions as a source and drain regions.

In the above-described embodiment, the buffer layer is provided on the top surfaces of the source and drain electrodes and the oxide semiconductor layer is provided on the buffer layer. The buffer layer (also called the n$^+$ layer) is formed successively without exposure to the air, which prevents a native oxide film from being formed on the top surfaces of the source and drain electrodes.

Further, in the bottom-gate thin film transistor, the pathway of a drain current (current pathway in the channel length direction) when the transistor is turned on by applying a voltage which is sufficiently higher than the threshold voltage to the gate electrode starts from the drain electrode and leads to the source electrode through the oxide semiconductor layer in the vicinity of the interface with the gate insulating film.

Note that here the channel length of the bottom-gate thin film transistor in which the oxide semiconductor layer is provided over the source and drain electrodes corresponds to the shortest distance between the source and drain electrodes, and is the distance of the part of the oxide semiconductor layer in the vicinity of the interface with the gate insulating film, positioned between the source and drain electrodes.

In the case where the n+ layer is formed on and in contact with the top surface of each of the drain and source electrodes, when the conductivity of the native oxide film formed on the side surface of each electrode is low, a main pathway of a drain current starts from the drain electrode and leads through the n+ layer, a part of the oxide semiconductor layer in the vicinity of the interface with the side surface of the drain electrode, a part of the oxide semiconductor layer in the vicinity of the interface with the gate insulating film, a part of the oxide semiconductor layer in the vicinity of the interface with the side surface of the source electrode, and the n+ layer to the source electrode. As for the oxide semiconductor layer formed by a sputtering method, the film quality in the vicinity of the interface with a surface on which the film is formed tends to be affected by the material of the surface on which the film is formed. The oxide semiconductor layer here has at least three interfaces with different materials: the interface with the n+ layer, the interface with the side surface of each of the source and drain electrodes, and the interface with the gate insulating film. Therefore, in the oxide semiconductor layer, the interfacial state with the native oxide film on the side surface of the drain electrode is different from the interfacial state with the gate insulating film, so that a part of the oxide semiconductor layer, which is in the vicinity of the interface with the side surface of the drain electrode functions as a first electric-field relaxation region. Similarly, in the oxide semiconductor layer, the interfacial state with the native oxide film on the side surface of the source electrode is different from the interfacial state with the gate insulating film, so that a part of the oxide semiconductor layer, which is in the vicinity of the interface with the side surface of the source electrode functions as a second electric-field relaxation region.

As described above, the regions of the oxide semiconductor layer, which overlap with the side surfaces of the source electrode and the drain electrode function as electric-field relaxation regions.

With an oxide semiconductor used in this specification, a thin film of a material described as $InMO_3(ZnO)_m$ (m>0) is formed, and a thin film transistor in which the thin film is used as a semiconductor layer is manufactured. Note that M denotes a single metal element or a plurality of metal elements selected from Ga, Fe, Ni, Mn, and Co. For example, M is Ga in some cases, and M includes another metal element in addition to Ga, such as either Ga and Ni or Ga and Fe, in some cases. Moreover, in the oxide semiconductor, in some cases, a transition metal element such as Fe or Ni or an oxide of the transition metal is contained as an impurity element in addition to the metal element contained as M. In this specification, this thin film is also referred to as an In—Ga—Zn—O-based non-single-crystal film.

An amorphous structure is observed by X-ray diffraction (XRD), as the crystal structure of the In—Ga—Zn—O-based non-single-crystal film. Note that heat treatment is performed on the In—Ga—Zn—O non-single-crystal film to be observed at 200 to 500° C., typically 300 to 400° C., for 10 minutes to 100 minutes after the film deposition by a sputtering method.

The angle $\theta 1$ of the side surface of the source electrode which is in contact with the oxide semiconductor layer and the angle $\theta 2$ of the side surface of the drain electrode which is in contact with the oxide semiconductor layer are each set to be greater than or equal to 20° and less than 90°, so that the distance from the top edge to the bottom edge of the electrode in the side surface of each electrode is increased, thereby increasing the lengths of the first and second electric-field relaxation regions to relax the electric-field concentration. Moreover, the distance from the top edge to the bottom edge of the electrode in the side surface of each electrode can also be increased by increasing the thickness of the electrode.

Further, in the case where the oxide semiconductor layer is formed by a sputtering method, if the side surface of the electrode is vertical to the substrate surface, the thickness of a part of the oxide semiconductor layer, which is formed on the side surface of the electrode might be smaller than that of a part of the same, which is formed on the top surface of the electrode. Therefore, the angle $\theta 1$ of the side surface of the source electrode which is in contact with the oxide semiconductor layer and the angle $\theta 2$ of the side surface of the drain electrode which is in contact with the oxide semiconductor layer are each set to be greater than or equal to 20° and less than 90°, so that the thickness uniformity of the oxide semiconductor layer can be improved even over the side surface of each electrode and electric-field concentration can be relaxed.

Further, in the case where the straight line which connects the top edge of the side surface of the source electrode to the bottom edge of the side surface of the source electrode substantially coincides with the slope of the side surface of the source electrode as shown in FIG. 1, it can be said that the source electrode has a tapered shape, and the angle $\theta 1$ of the side surface of the source electrode with respect to the surface of the substrate can also be called a first taper angle. Similarly, in the case where the straight line which connects the top edge of the side surface of the drain electrode to the bottom edge of the side surface of the drain electrode substantially coincides with the slope of the slope of the side surface of the drain electrode, it can be said that the drain electrode has a tapered shape, and the angle $\theta 2$ of the side surface of the drain electrode with respect to the surface of the substrate can also be called a second taper angle.

Further, the present invention is not limited to the shape in which the side surface of the electrode has only one angle, the side surface of the electrode may have a step as long as the angle $\theta 1$ of the side surface of the bottom edge of the source electrode and the angle $\theta 2$ of the side surface of the bottom edge of the drain electrode each are greater than or equal to 20° and less than 90°.

Another embodiment of the present invention is a semiconductor device wherein a gate electrode is formed over a substrate having an insulating surface, an insulating layer is formed over the gate electrode, a source and drain electrodes are formed over the insulating layer, an oxide semiconductor layer is formed between their respective side surfaces of the source and drain electrodes, which face each other, so as to overlap with the gate electrode with the insulating layer interposed therebetween, and the angle formed between the surface of the substrate and the side surface of a bottom edge of the source electrode and the angle formed between the surface of the substrate and the side surface of a bottom edge of the drain electrode each are greater than or equal to 20° and less than 90°.

In the above embodiment, the angle formed between the surface of the substrate and the side surface of the bottom edge of the source electrode is made to be different from the angle formed between the surface of the substrate and the side surface at a top edge of the source electrode. In addition, the angle formed between the surface of the substrate and the side surface of the bottom edge of the drain electrode is made to be different from the angle formed between the surface of the substrate and the side surface at a top edge of the drain electrode. The cross section of the side surface of the source electrode and that of the side surface of the drain electrode, which face each other with the oxide semiconductor layer interposed therebetween, have substantially the same shape as each other because the same etching step is performed thereon.

For example, their respective angles of the side surfaces of the top edges of the source electrode and the drain electrode may be set to 90° so that their respective angles of the side surfaces of the bottom edges of the source electrode and the drain electrode are different from their respective angles of the side surfaces of the top edges of the source electrode and the drain electrode. By increasing their respective angles of the side surfaces of the top edges of the source electrode and the drain electrode to be greater than their respective angles of the side surfaces of the bottom edges of the source electrode and the drain electrodes, the interval between masks for forming the source and drain electrodes can be designed to be small, which can result in shorter design of the channel length, for example, a channel length of 1 to 10 μm.

The side surface of each of the source and drain electrodes may have a curved surface; for example, in the cross-sectional shape of each of the source and drain electrodes, the bottom edge portion of the electrode may have one curved surface at least partly which originates from a center of a curvature radius, which is positioned outside the electrode. The side surface of each of the source and drain electrodes may have a cross-sectional shape which spreads toward the substrate from the top surface of each electrode.

The electrodes, which can have various cross-sectional shapes as described above, are formed by dry etching or wet etching. As an etching apparatus used for the dry etching, an etching apparatus using a reactive ion etching method (an RIE method), or a dry etching apparatus using a high-density plasma source such as ECR (electron cyclotron resonance) or ICP (inductively coupled plasma) can be used. As a dry etching apparatus by which uniform electric discharge can be obtained over a wider area as compared to an ICP etching apparatus, there is an ECCP (enhanced capacitively coupled plasma) mode apparatus in which an upper electrode is grounded, a high-frequency power source at 13.56 MHz is connected to a lower electrode, and further a low-frequency power source at 3.2 MHz is connected to the lower electrode. This ECCP mode etching apparatus can be applied even when, as the substrate, a substrate, the size of which exceeds 3 m of the tenth generation, is used, for example.

Each of the source and drain electrodes may be a single layer or a stacked layer of at least two layers formed using two different materials.

Another embodiment of the present invention, which relates to the manufacturing method to realize the above structure, is a method for manufacturing a semiconductor device, wherein a gate electrode is formed over a substrate having an insulating surface, a gate insulating layer is formed to cover the gate electrode, a conductive layer and a buffer layer are formed to be stacked over the gate insulating layer without exposure to the air, the conductive layer and the buffer layer are selectively etched to form a source and drain electrodes each having a side surface which forms an angle greater than or equal to 20° and less than 90° with respect to the surface of the substrate, and an oxide semiconductor layer is formed over the gate insulating layer, the source electrode, and the drain electrode.

In the above-described embodiment which relates to the manufacturing method, the buffer layer contains indium, gallium, and zinc, and can be used using the same target as a target used for the oxide semiconductor layer formed over the buffer layer. The buffer layer and the oxide semiconductor layer can be separately formed by changing the film deposition atmosphere, and the manufacturing cost can be decreased by using the same target.

According to the above-described embodiment which relates to the manufacturing method, the conductive layer and the buffer layer are formed to be stacked over the gate insulating layer without exposure to the air, that is, successive film deposition is performed.

In the above-described embodiment which relates to the manufacturing method, the conductive layer, which forms the source and drain electrodes, is formed using a metal material such as aluminum, tungsten, chromium, tantalum, titanium, or molybdenum, or an alloy material thereof. The conductive layer may be a stacked layer of at least two layers; for example, a stacked layer in which an aluminum layer as a bottom layer and a titanium layer as an upper layer are stacked, a stacked layer in which a tungsten layer as a bottom layer and a molybdenum layer as an upper layer are stacked, a stacked layer in which an aluminum layer as a bottom layer and a molybdenum layer as an upper layer are stacked, or the like can be used.

Successive film deposition in this specification means that a series of steps from a first film deposition step by a sputtering method to a second film deposition step by a sputtering method are performed by controlling an atmosphere in which a process substrate is disposed so that it is constantly in vacuum or an inert gas atmosphere (a nitrogen atmosphere or a rare gas atmosphere) without being exposed to a contaminated atmosphere such as the air. By the successive film deposition, film deposition can be performed on the process substrate which has been cleaned, without further adhesion of moisture or the like.

Performing the series of steps from the first deposition step to the second deposition step in the same chamber is within the scope of the successive film deposition in this specification.

In addition, the following is also within the scope of the successive film deposition in this specification: in the case of performing the series of steps from the first film deposition step to the second film deposition step in different chambers, the process substrate is transferred to another chamber without being exposed to the air after the first film deposition step and subjected to the second film deposition.

Further, the following is also within the scope of the successive film deposition in this specification: a substrate transfer step, an alignment step, a slow-cooling step, a step of heating or cooling the substrate to a temperature which is necessary for the second film deposition step, or the like is provided between the first film deposition step and the second film deposition step.

However, the case in which a step in which liquid is used, such as a cleaning step, wet etching, or resist formation, is provided between the first film deposition step and the second film deposition step is not within the scope of the successive film deposition in this specification.

In this specification, a word which expresses a direction, such as "over", "below", "side", "horizontal", or "vertical", indicates a direction based on the substrate surface in the case where a device is provided over the surface of the substrate.

Note that the ordinal numerals such as "first" and "second" in this specification are used for convenience and do not denote the order of steps or the stacking order of layers. In addition, the ordinal numbers in this specification do not denote particular names which specify the present invention.

The angle formed by the surface of the substrate and the side surface of the source electrode and the angle formed by the surface of the substrate and the side surface of the drain electrode are adjusted, so that the coverage by the oxide semiconductor layer provided over the source and drain electrodes is improved.

An electric-field relaxation region is provided, so that electric-field concentration which might occur between the source and drain electrodes is relaxed and degradation of the switching characteristics of the thin film transistor is suppressed.

BRIEF DESCRIPTION OF THE DRAWINGS

FIGS. 9A1 and 9B1 are views showing one example of a cross-sectional view of a terminal portion and FIGS. 9A2 and 9B2 are views showing one example of a top view of the terminal portion.

FIGS. 20A1 and 20A2 are top views showing examples of a semiconductor device, and FIG. 20B is a cross-sectional view showing one example of a semiconductor device.

DETAILED DESCRIPTION OF THE INVENTION

Embodiments and examples of the present invention will be hereinafter described.

Embodiment 1

Figure 1:
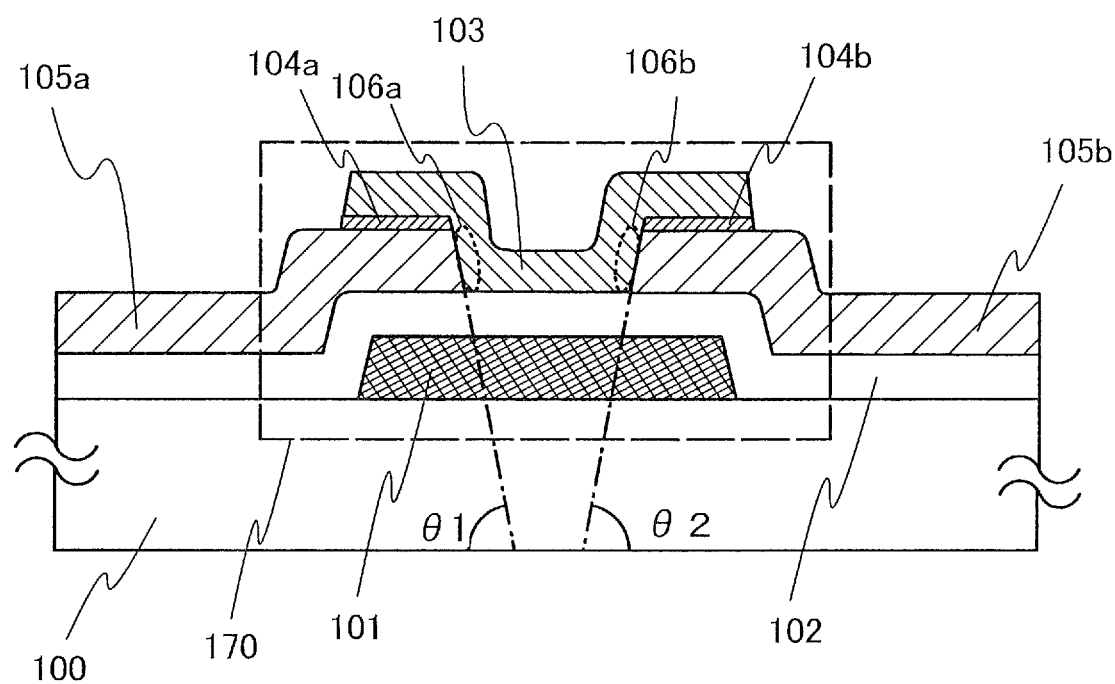
FIG. 1 is a cross-sectional view showing one example of a semiconductor device.

The case in which a thin film transistor 170 is provided over a substrate is illustrated in FIG. 1. FIG. 1 is one example of a cross-sectional view of a thin film transistor.

A gate electrode 101 provided over a substrate 100 having an insulating surface is covered with a gate insulating layer 102, and a first wiring and a second wiring are provided over the gate insulating layer 102 which overlaps with the gate electrode 101. A buffer layer is provided over each of the first wiring and the second wiring which function as a source electrode layer 105a and a drain electrode layer 105b. A first buffer layer 104a is provided over the source electrode layer 105a, and a second buffer layer 104b is provided over the drain electrode layer 105b. An oxide semiconductor layer 103 is provided over the first buffer layer 104a and the second buffer layer 104b.

In FIG. 1, as the substrate 100 having a light-transmitting property, a glass substrate of barium borosilicate glass, aluminoborosilicate glass, or the like typified by 7059 glass, 1737 glass, or the like manufactured by Corning, Inc. can be used.

The gate electrode 101 is a single layer or a stacked layer made of different metal materials. As a material of the gate electrode 101, a metal material (an element selected from aluminum (Al), copper (Cu), titanium (Ti), tantalum (Ta), tungsten (W), molybdenum (Mo), chromium (Cr), neodymium (Nd), and scandium (Sc), or an alloy including the element as a component) is used. The angle of the side surface of the gate electrode 101 is set to be greater than or equal to 20° and less than 90°. The gate electrode 101 is formed by etching so as to have a tapered shape at least in the edge portion thereof.

The gate insulating layer 102 may be formed to have a single-layer structure or a stacked-layer structure using an insulating film obtained by a sputtering method or a plasma CVD method, such as a silicon oxide film, a silicon oxynitride film, a silicon nitride film, an aluminum oxide film, or a tantalum oxide film. It is preferable to select a material which can provide an etching selectivity which is high enough for the etching for forming the source electrode layer 105a and the drain electrode layer 105b which are formed over the gate insulating layer 102. In etching the source electrode layer 105a and the drain electrode layer 105b, the surface of the gate insulating layer 102 may be etched off by about 20 nm at a maximum; and it is preferable to etch off the superficial layer of the gate insulating layer 102 by a small thickness in order to remove an etching residue of the metal material.

The source electrode layer 105a and the drain electrode layer 105b each are a single layer or a stacked layer made of different metal materials. As a material of each of the source electrode layer 105a and the drain electrode layer 105b, a metal material (an element selected from aluminum (Al), copper (Cu), titanium (Ti), tantalum (Ta), tungsten (W), molybdenum (Mo), chromium (Cr), neodymium (Nd), and scandium (Sc), or an alloy including the element as a component) is used.

With respect to the cross-sectional shape of the source electrode layer 105a, as shown in FIG. 1, angle θ1 formed between the surface of the substrate and the side surface of the source electrode layer 105a is set to be greater than or equal to 20° and less than 90°. Similarly, with respect to the cross-sectional shape of the drain electrode layer 105b, as shown in FIG. 1, angle θ2 formed between the surface of the substrate and the side surface of the drain electrode layer 105b is set to be greater than or equal to 20° and less than 90°. The angle θ1 and the angle θ2 are substantially the same as each other because the same etching step (dry etching or wet etching) is performed thereon. The angle θ1 of the side surface of the source electrode layer 105a which is in contact with the oxide semiconductor layer and the angle θ2 of the side surface of the drain electrode layer 105b which is in contact with the oxide semiconductor layer are each set to be greater than or equal to 20° and less than 90°, so that the distance from the top edge to the bottom edge in the side surface of each of the source electrode layer 105a and the drain electrode layer 105b is increased.

Although the angles θ1 and θ2 are described when it is assumed that the plane of the back surface of the substrate is the substrate surface in FIG. 1, the present invention is not limited thereto, and the angles θ1 and θ2 are not changed even when it is assumed that the plane of the front surface of the substrate is the substrate surface because the plane of the back surface of the substrate is in parallel to the plane of the front surface of the substrate.

The oxide semiconductor layer 103 is formed over the source electrode layer 105a and the drain electrode layer 105b having the above-described shapes. The oxide semiconductor layer 103 is formed as follows: film deposition is performed using an oxide semiconductor target including In, Ga, and Zn ($In_2O_3$:$Ga_2O_3$:ZnO=1:1:1), under a condition in which the distance between the substrate and the target is 170 mm, the pressure is 0.4 Pa, and the direct-current (DC) power source is 0.5 kW, in an argon atmosphere containing oxygen, and a resist mask is formed and the deposited film is selectively etched off to remove the unnecessary portion thereof. Note that it is preferable to use a pulsed direct-current (DC) power source with which dust can be reduced and thickness distribution can be evened. The thickness of the oxide semiconductor film is set to be 5 to 200 nm. In this embodiment, the thickness of the oxide semiconductor film is 100 nm.

It is preferable to provide the first buffer layer 104a between the source electrode layer 105a and the oxide semiconductor layer 103. It is preferable to provide the second buffer layer 104b between the drain electrode layer 105b and the oxide semiconductor layer 103.

The first buffer layer 104a and the second buffer layer 104b each are an oxide semiconductor layer ($n^+$ layer) which have lower resistance than the oxide semiconductor layer 103, and function as a source and drain regions.

In this embodiment, the $n^+$ layers are each formed as follows: film deposition is performed by a sputtering method using a target in which $In_2O_3$:$Ga_2O_3$:ZnO=1:1:1, under a condition in which the pressure is 0.4 Pa, the power is 500 W, the deposition temperature is room temperature, and the argon-gas flow rate is 40 sccm. Despite the use of the target in which $In_2O_3$:$Ga_2O_3$:ZnO=1:1:1, an In—Ga—Zn—O-based non-single-crystal film including crystal grains with a size of 1 to 10 nm may be formed immediately after the start of the film deposition. Note that it can be said that the presence or absence of crystal grains or the density of crystal grains can be adjusted and the diameter size can be adjusted within the range of 1 to 10 nm by appropriate adjustment of the composition ratio in the target, the film deposition pressure (0.1 to 2.0 Pa), the power (250 to 3000 W: 8 inches ø), the temperature (room temperature to 100° C.), the reactive sputtering deposition conditions, and/or the like. The second In—Ga—Zn—O-based non-single-crystal film has a thickness of 5 to 20 nm. Needless to say, when the film includes crystal grains, the size of each crystal grain does not exceed the thickness of the film. In this embodiment, the thickness of the second In—Ga—Zn—O-based non-single-crystal film is 5 nm.

By forming and stacking the conductive film which forms the source electrode layer 105a and the drain electrode layer 105b and the oxide semiconductor film which forms the $n^+$ layers without exposing to the air, by a sputtering method, the source and drain electrode layers can be prevented from being exposed to the air during the manufacturing process, so that dust can be prevented from attaching thereto.

As for the oxide semiconductor layer 103 formed by a sputtering method, the film quality in the vicinity of the interface with a surface on which the film is formed tends to be affected by the material of the surface on which the film is formed. The oxide semiconductor layer here has at least three interfaces with different materials: the interface with the $n^+$ layer, the interface with the side surface of each of the source and drain electrodes, and the interface with the gate insulating film. Therefore, in the oxide semiconductor layer 103, the interfacial state with the native oxide film on the side surface of the drain electrode layer is different from the interfacial state with the gate insulating film, so that a part of the oxide semiconductor layer, which is in the vicinity of the interface with the side surface of the drain electrode layer functions as the first electric-field relaxation region 106a. Similarly, in the oxide semiconductor layer, the interfacial state with the native oxide film on the side surface of the source electrode is different from the interfacial state with the gate insulating film, so that a part of the oxide semiconductor layer, which is in the interface vicinity with the side surface of the source electrode functions as the second electric-field relaxation region 106b. The angle θ1 of the side surface of the source electrode which is in contact with the oxide semiconductor layer and the angle θ2 of the side surface of the drain electrode which is in contact with the oxide semiconductor layer are each set to be greater than or equal to 20° and less than 90°, so that the distance from the top edge to the bottom edge of the electrode in the side surface of each electrode is increased, thereby increasing length L1 of the first electric-field relaxation region 106a and length L2 of the second electric-field relaxation region 106b to relax the electric-field concentration. The distance from the top edge to the bottom edge of the electrode in the side surface of each electrode can also be increased by increasing the thickness of the electrode.

Further, in the case where the oxide semiconductor layer 103 is formed by a sputtering method, if the side surface of the electrode is vertical to the substrate surface, the thickness of a part of the oxide semiconductor layer 103, which is formed on the side surface of the electrode might be smaller than that of a part of the same, which is formed on the top surface of the electrode. Therefore, the angle θ1 of the side surface of the source electrode which is in contact with the oxide semiconductor layer and the angle θ2 of the side surface of the drain electrode which is in contact with the oxide semiconductor layer are each set to be greater than or equal to 20° and less than 90°, so that the thickness uniformity of the oxide semiconductor layer can be improved even over the side surface of each electrode, a partial reduction in the thickness of the oxide semiconductor layer 103 can be suppressed, and electric-field concentration can be relaxed.

Embodiment 2

The case where the straight line which connects the top edge of the side surface of the source electrode layer (or the drain electrode layer) to the bottom edge of the side surface of the source electrode layer (or the drain electrode layer) substantially coincides with the slope of the side surface of the source electrode layer (or the drain electrode layer) is illustrated in FIG. 1. In Embodiment 2, the case where the side surface of a source electrode layer (or a drain electrode layer) has a step will be described using FIG. 2. The side surface of the electrode may have a step as long as angle θ1 of the side surface of the bottom edge of the source electrode layer and angle θ2 of the side surface of the bottom edge of the drain electrode layer each are greater than or equal to 20° and less than 90°. Note that, in FIG. 2, the same reference numerals are used for the portions that are common to those in FIG. 1.

A gate electrode 101 provided over a substrate 100 having an insulating surface is covered with a gate insulating layer 102, and a first wiring and a second wiring are provided over the gate insulating layer 102 which overlaps with the gate electrode 101. A buffer layer is provided over each of the first wiring and the second wiring which function as a source electrode layer 405a and a drain electrode layer 405b. A first buffer layer 404a is provided over the source electrode 405a, and a second buffer layer 404b is provided over the drain electrode layer 405b. An oxide semiconductor layer 403 is provided over the first buffer layer 404a and the second buffer layer 404b.

The substrate 100 having an insulating surface, the gate electrode 101, and the gate insulating layer 102 are the same as in Embodiment 1, and specific description thereof is omitted in this embodiment.

The source electrode layer 405a and the drain electrode layer 405b each are a single layer or a stacked layer made of different metal materials. As a material of each of the source electrode layer 405a and the drain electrode layer 405b, a metal material (an element selected from aluminum (Al), copper (Cu), titanium (Ti), tantalum (Ta), tungsten (W), molybdenum (Mo), chromium (Cr), neodymium (Nd), and scandium (Sc), or an alloy including the element as a component) is used.

Figure 2:
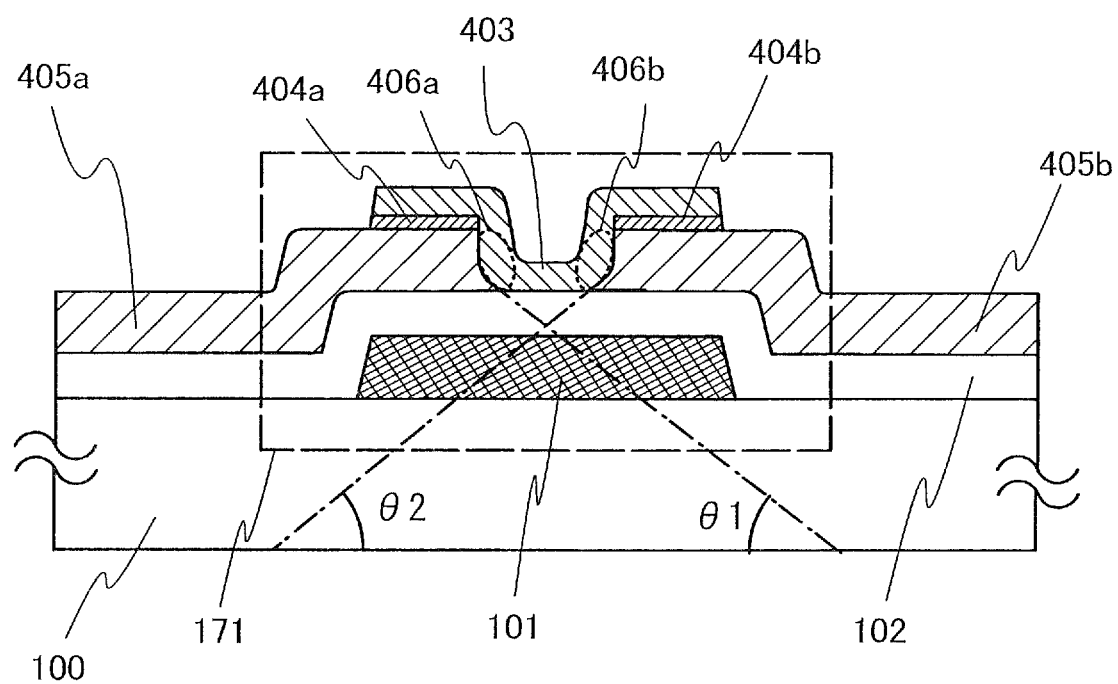
FIG. 2 is a cross-sectional view showing one example of a semiconductor device.

Described in this embodiment is the case where a single layer of a tungsten film with a thickness of 100 nm is used as the source electrode layer 405a and the drain electrode layer 405b, and the side surface shapes of the source electrode layer 405a and the drain electrode layer 405b shown in FIG. 2 are formed by using an ICP etching apparatus using a coiled antenna.

In this embodiment, etching is performed by generating plasma under the following condition: the gas flow rate of $CF_4$ is 25 sccm, the gas flow rate of $Cl_3$ is 25 sccm, the gas flow rate of $O_2$ is 10 sccm, and an RF (13.56 MHz) power of 500 W is applied to a coiled electrode at a pressure of 1.5 Pa. An RF (13.56 MHz) power of 10 W is applied to the substrate side (sample stage), which means that a negative self-bias voltage is substantially applied thereto. This etching is stopped when at least the gate insulating film 102 is exposed to some extent, thereby forming the side surface of the electrode, which has a step.

By the above etching condition, with respect to the cross-sectional shape of the source electrode layer 405a, the angle θ1 formed between the surface of the substrate and the bottom edge of the side surface of the source electrode layer 405a can be made to be greater than or equal to 20° and less than 90°; and as shown in FIG. 2, θ1 is about 40°. Further, the angle formed between the surface of the substrate and the top edge of the side surface of the source electrode layer 405a is about 90°. The cross section of the side surface of the source electrode layer 405a and that of the side surface of the drain electrode layer 405b, which face each other with the oxide semiconductor layer 403 interposed therebetween, have substantially the same shape as each other because the same etching step is performed thereon.

By increasing their respective angles of the side surfaces of the top edges of the source electrode layer 405a and the drain electrode layer 405b to be greater than their respective angles of the side surfaces of the bottom edges of the source electrode layer 405a and the drain electrode layer 405b, the interval between masks for forming the source and drain electrode layers 405a and 405b can be designed to be small, which can result in shorter design of the channel length, for example, a channel length of 1 to 10 μm.

The present invention is not limited to the above-described method, and a step can also be formed in the side surface of each electrode by the following: materials having different etching rates of an etching gas, which form the source electrode layer 405a and the drain electrode layer 405b, are stacked such that a material layer having a low etching rate and a material layer having a high etching rate are stacked as a lower layer and an upper layer respectively, and etching is performed thereon.

The two side surfaces of the electrodes which face each other with the oxide semiconductor layer 403 interposed therebetween each have a step, so that the distance from the top edge to the bottom edge of the electrode in the side surface of each electrode is increased, thereby increasing length L3 of a first electric-field relaxation region 406a and length L4 of a second electric-field relaxation region to relax the electric-field concentration.

In order to further increase the distance from the top edge to the bottom edge of the electrode in the side surface of each of the source electrode layer and the drain electrode layer, wet etching may be performed after the above-described dry etching to provide a curved surface partly for the side surfaces of the electrodes which face each other with the oxide semiconductor layer 403 interposed therebetween.

Alternatively, instead of the above-described dry etching, the source electrode layer and the drain electrode layer may be formed by wet etching so that the angle θ1 of the side surface of the bottom edge of the source electrode layer and the angle θ2 of the side surface of the bottom edge of the drain electrode layer each are greater than or equal to 20° and less than 90°. The side surface of each of the source and drain electrode layers may have a cross-sectional shape which spreads toward the substrate from the top surface of each electrode layer.

This embodiment can be combined with Embodiment 1, as appropriate.

Embodiment 3

In this embodiment, a thin film transistor and a manufacturing process thereof are described with reference to FIGS. 3A and 3B, 4A to 4C, 5 to 8, and FIGS. 9A1 and 9A2 and 9B1 and 9B2.

Figure 3:
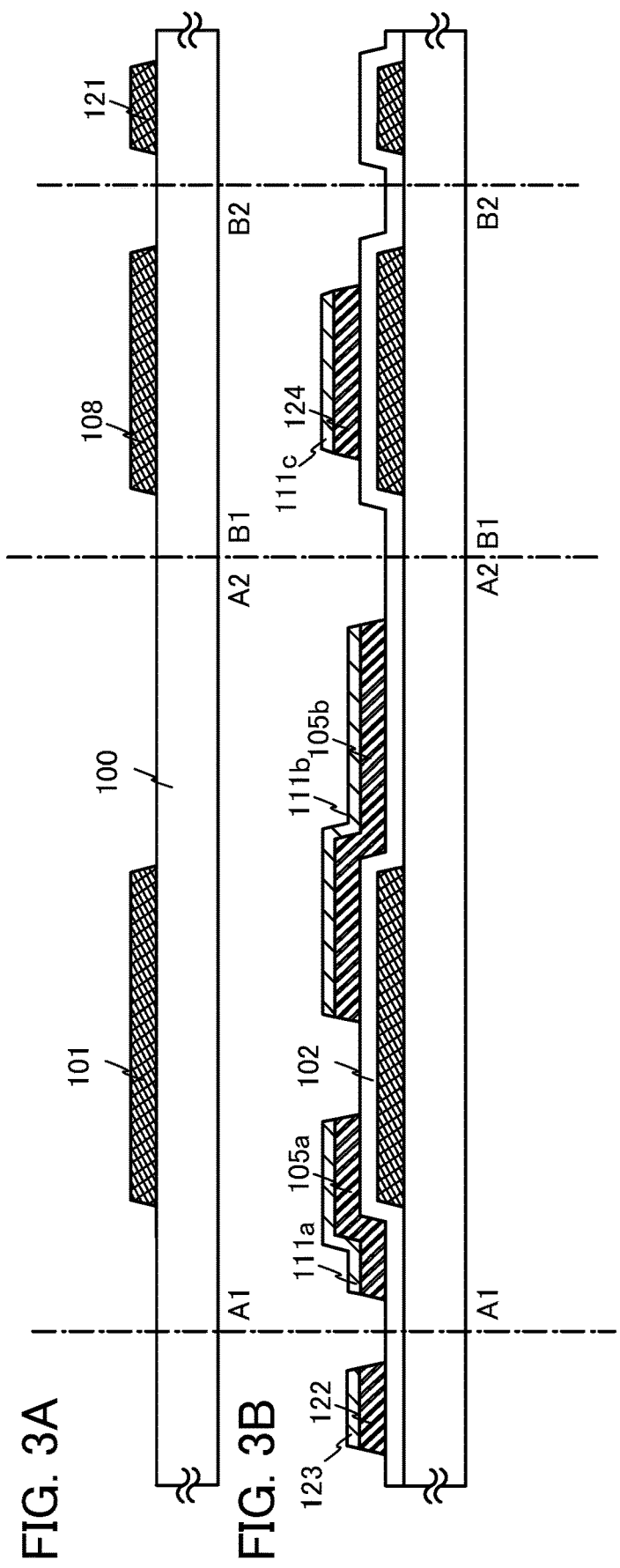
FIGS. 3A and 3B are cross-sectional views showing one example of a method for manufacturing a semiconductor device.

In FIG. 3A, as a substrate 100 having a light-transmitting property, a glass substrate of barium borosilicate glass, aluminoborosilicate glass, or the like can be used.

Then, a conductive layer is formed over the entire surface of the substrate 100, a first photolithography step is performed to form a resist mask, and an unnecessary portion is removed by etching to form wirings and an electrode (a gate wiring including a gate electrode 101, a capacitor wiring 108, and a first terminal 121). At this time, the etching is performed so that at least the edge portion of the gate electrode 101 is tapered. FIG. 3A is a cross-sectional view at this stage. A top view at this stage corresponds to FIG. 5.

The gate wiring including the gate electrode 101, the capacitor wiring 108, and the first terminal 121 in a terminal portion are each formed using an element selected from titanium (Ti), tantalum (Ta), tungsten (W), molybdenum (Mo), chromium (Cr), neodymium (Nd), aluminum (Al), and copper (Cu), or an alloy including the element as a component, an alloy film in which the elements are combined, or a nitride including the element as a component. Among these, it is preferable to use a low-resistance conductive material such as aluminum (Al) or copper (Cu), but however, since aluminum itself has disadvantages such as low heat resistance and a tendency to be corroded, the following is used to form them: an element selected from titanium (Ti), tantalum (Ta), tungsten (W), molybdenum (Mo), chromium (Cr), and neodymium (Nd), aluminum (Al), and copper (Cu), an alloy film including a combination of any or all of these elements, or a nitride including the element as a component.

Then, a gate insulating layer 102 is formed entirely over the gate electrode 101. The gate insulating layer 102 is formed with a thickness of 50 to 250 nm by a sputtering method or the like.

For example, as the gate insulating layer 102, a 100-nm-thick silicon oxide film is formed by a sputtering method. The gate insulating layer 102 is not limited to such a silicon oxide film and may be a single layer or a stacked layer using another insulating film such as a silicon oxynitride film, a silicon nitride film, an aluminum oxide film, or a tantalum oxide film.

Next, a conductive film is formed using a metal material over the gate insulating layer 102 by a sputtering method or a vacuum evaporation method. As the material of the conductive film, there are an element selected from Al, Cr, Ta, Ti, Mo, and W, an alloy including any of these elements as a component, an alloy film including a combination of any or all of these elements, and the like. In this embodiment, the conductive film is formed by stacking an aluminum (Al) film and a titanium (Ti) film in this order. Alternatively, the conductive film may have a three-layer structure in which a titanium film is stacked over a tungsten film. Further alternatively, the conductive film may have a single-layer structure of a titanium film or an aluminum film including silicon.

Next, a first oxide semiconductor film (a first In—Ga—Zn—O-based non-single-crystal film) is formed over the conductive film by a sputtering method. In this embodiment, the first oxide semiconductor film is formed as follows: film deposition is performed by a sputtering method using a target in which $In_2O_3:Ga_2O_3:ZnO=1:1:1$, under a condition in which the pressure is 0.4 Pa, the power is 500 W, the deposition temperature is room temperature, and the argon-gas flow rate is 40 sccm. Despite the use of the target in which $In_2O_3:Ga_2O_3:ZnO=1:1:1$, an In—Ga—Zn—O-based non-single-crystal film including crystal grains with a size of 1 to 10 nm may be formed immediately after the start of the film deposition. Note that it can be said that the presence or absence of crystal grains or the density of crystal grains can be adjusted and the diameter size can be adjusted within the range of 1 to 10 nm by appropriate adjustment of the composition ratio in the target, the film deposition pressure (0.1 to 2.0 Pa), the power (250 to 3000 W: 8 inches ø), the temperature (room temperature to 100° C.), the reactive sputtering deposition conditions, and/or the like. The first In—Ga—Zn—O-based non-single-crystal film has a thickness of 5 to 20 nm. Needless to say, when the film includes crystal grains, the size of the crystal grains does not exceed the thickness of the film. In this embodiment, the thickness of the first In—Ga—Zn—O-based non-single-crystal film is 5 nm.

Next, a second photolithography step is performed to form a resist mask, and the first In—Ga—Zn—O-based non-single-crystal film is etched. In this embodiment, wet etching using ITO07N (manufactured by Kanto Chemical Co., Inc.) is performed to remove an unnecessary portion in a pixel portion, so that first In—Ga—Zn—O-based non-single-crystal films 111a and 111b are formed. The etching here is not limited to wet etching and may be dry etching.

Figure 6:
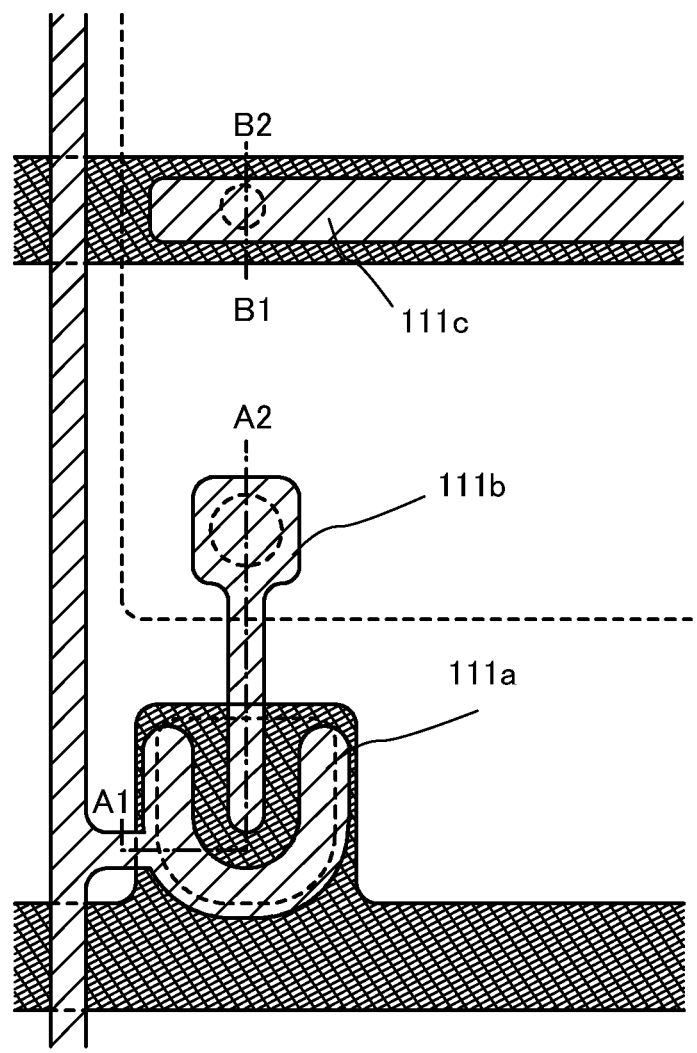
FIG. 6 is a top view showing one example of a method for manufacturing a semiconductor device.
Figure 7:
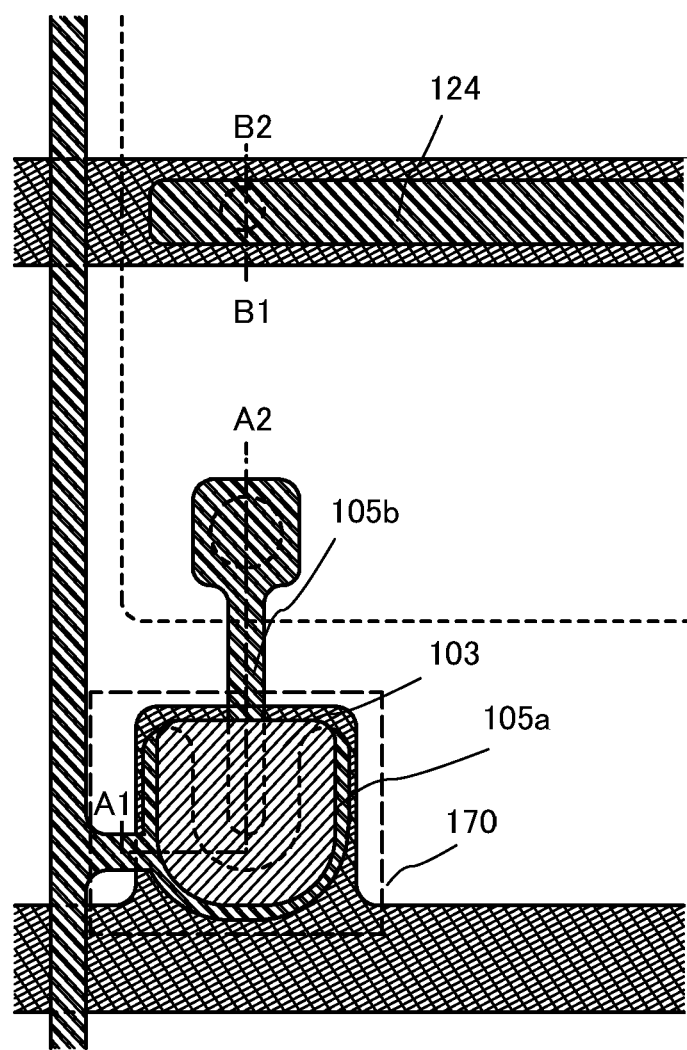
FIG. 7 is a top view showing one example of a method for manufacturing a semiconductor device.

Next, with use of the same resist mask as used for the etching of the first In—Ga—Zn—O-based non-single-crystal film, an unnecessary portion is removed by etching to form a source electrode layer 105a and a drain electrode layer 105b. Wet etching or dry etching is used as the etching method at this time. Here, dry etching using a mixed gas of $SiCl_4$, $Cl_2$, and $BCl_3$ is performed to etch the conductive film in which the Al film and the Ti film are stacked, so that a source electrode layer 105a and a drain electrode layer 105b are formed. The cross-section at this stage is illustrated in FIG. 3B. FIG. 6 is a top view at this stage.

By this etching, angle θ1 of the side surface of the source electrode layer 105a and angle θ2 of the side surface of the drain electrode layer 105b which are in contact with an oxide semiconductor layer formed later are made to be greater than or equal to 20° and less than 90°. Tapered shapes of the side surfaces of the electrodes which face each other with the oxide semiconductor layer interposed therebetween enable respective regions of the oxide semiconductor layer, which overlap with the side surfaces of the source electrode layer and the drain electrode layer to function as electric-field relaxation regions.

In the second photolithography process, a second terminal 122 formed using the same material as the material of the source electrode layer 105a and the drain electrode layer 105b remains in a terminal portion. Note that the second terminal 122 is electrically connected to a source wiring (a source wiring including the source electrode layer 105a). In the terminal portion, a first In—Ga—Zn—O-based non-single-crystal film 123 remains over the second terminal 122 to overlap with the second terminal 122.

In a capacitor portion, a capacitor electrode layer 124 which is made from the same material as the material of the source electrode layer 105a and the drain electrode layer 105b remains. In addition, in the capacitor portion, a first In—Ga—Zn—O-based non-single-crystal film 111c remains over the capacitor electrode layer 124 to overlap with capacitor electrode layer 124.

Next, the resist mask is removed, and then, a second oxide semiconductor film (a second In—Ga—Zn—O-based non-single-crystal film in this embodiment) formed without exposure to the air. Formation of the second In—Ga—Zn—O-based non-single-crystal film without exposure to the air after the plasma treatment is effective in preventing dust and the like from attaching to the interface between the gate insulating layer and the semiconductor film. In this embodiment, the second In—Ga—Zn—O-based non-single-crystal film is formed in an argon or oxygen atmosphere using an oxide semiconductor target having a diameter of 8 inches and containing In, Ga, and Zn ($In_2O_3$:$Ga_2O_3$:$ZnO$=1:1:1), with the distance between the substrate and the target set to 170 mm, under a pressure of 0.4 Pa, and with a direct-current (DC) power source of 0.5 kW. Note that it is preferable to use a pulsed direct-current (DC) power source with which dust can be reduced and thickness distribution can be evened. The second In—Ga—Zn—O-based non-single-crystal film is formed to have a thickness of 5 to 200 nm. In this embodiment, the thickness of the second In—Ga—Zn—O-based non-single-crystal film is 100 nm.

The film deposition condition of the second In—Ga—Zn—O-based non-single-crystal film is different from that of the first In—Ga—Zn—O-based non-single-crystal film, thereby forming the second In—Ga—Zn—O-based non-single-crystal film to have a higher electrical resistance than the first In—Ga—Zn—O-based non-single-crystal film. For example, the second In—Ga—Zn—O-based non-single-crystal film is formed under a condition where the ratio of an oxygen gas flow rate to argon gas flow rate is higher than the ratio of an oxygen gas flow rate to an argon gas flow rate under the deposition condition of the first In—Ga—Zn—O-based non-single-crystal film. Specifically, the first In—Ga—Zn—O-based non-single-crystal film is formed in a rare gas (e.g., argon or helium) atmosphere (or an atmosphere, less than or equal to 10% of which is an oxygen gas and greater than or equal to 90% of which is an argon gas), and the second In—Ga—Zn—O-based non-single-crystal film is formed in an oxygen atmosphere (or an atmosphere in which the ratio of an oxygen gas flow rate to an argon gas flow rate is 1:1 or higher).

Then, heat treatment is preferably performed at 200 to 600° C., typically, 300 to 500° C. In this embodiment, heat treatment is performed under a nitrogen atmosphere or the air in a furnace at 350° C. for 1 hour. Through this heat treatment, rearrangement at the atomic level occurs in the In—Ga—Zn—O-based non-single-crystal film. Because strain energy which inhibits carrier movement is released by the heat treatment, the heat treatment (including optical annealing) is important. There is no particular limitation on the timing of heat treatment as long as it is performed after formation of the second In—Ga—Zn—O-based non-single-crystal film, and for example, heat treatment may be performed after formation of a pixel electrode.

Next, a third photolithography process is performed to form a resist mask, and an unnecessary portion is removed by etching, so that a semiconductor layer 103 is formed. In this embodiment, wet etching using ITO07N (manufactured by Kanto Chemical Co., Inc.) is performed to remove the second In—Ga—Zn—O-based non-single-crystal film, so that the semiconductor layer 103 is formed. In the case of the removal by wet etching, an oxide semiconductor can be reproduced using a waste solution of the etching to use for manufacturing a target again.

Indium or gallium contained in an oxide semiconductor, which is known as a rare metal, can achieve resource saving and cost reduction of a product formed using an oxide semiconductor by recycle of it.

The same etchant is used for the first In—Ga—Zn—O-based non-single-crystal film and the second In—Ga—Zn—O-based non-single-crystal film, and therefore, the first In—Ga—Zn—O-based non-single-crystal film is removed by this etching. Therefore, a side surface of the first In—Ga—Zn—O-based non-single-crystal film, which is covered with the second In—Ga—Zn—O-based non-single-crystal film is protected whereas parts of the first In—Ga—Zn—O-based non-single-crystal films 111a and 111b, which are exposed to the outside are etched, so that a first buffer layer 104a and a second buffer layer 104b are formed. The etching of the semiconductor layer 103 is not limited to wet etching and may be dry etching. Through the above steps, a thin film transistor 170 including the semiconductor layer 103 as a channel formation region can be manufactured. A cross-sectional view at this stage is FIG. 4A. A top view at this stage is FIG. 7.

Next, the resist mask is removed, and a protective insulating film 107 is formed to cover the semiconductor layer. The protective insulating film 107 can be formed using a silicon nitride film, a silicon oxide film, a silicon oxynitride film, an aluminum oxide film, an aluminum oxynitride film, a tantalum oxide film, or the like by a sputtering method or the like.

Then, a fourth photolithography step is performed to form a resist mask, so that the protective insulating film 107 is etched to form a contact hole 125 reaching the drain electrode layer 105b. In addition, a contact hole 127 reaching the second terminal 122 is also formed in the same etching step. In addition, a contact hole 109 reaching the capacitor electrode layer 124 is also formed in the same etching step. In order to reduce the number of masks, the gate insulating layer is preferably etched using the same resist mask so that a contact hole 126 reaching the gate electrode is formed using the same resist mask. A cross-sectional view at this stage is FIG. 4B.

Then, the resist mask is removed, and a transparent conductive film is formed. The transparent conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Etching treatment of such a material is performed with a hydrochloric acid based solution. Instead, because a residue tends to be generated particularly in etching of ITO, an alloy of indium oxide and zinc oxide ($In_2O_3$—$ZnO$) may be used in order to improve etching processability.

Next, a fifth photolithography step is performed to form a resist mask, so that an unnecessary portion is removed by etching to form a pixel electrode 110.

In the fifth photolithography step, a storage capacitor is formed by the capacitor electrode layer 124 and the pixel electrode layer 110 with the gate insulating layer 102 in the capacitor portion, used as a dielectric. The capacitor wiring 108 is electrically connected to the capacitor electrode layer 124 through the contact hole 109.

Furthermore, in the fifth photolithography step, the first terminal and the second terminal are covered with the resist mask so that transparent conductive films 128 and 129 remain in the terminal portion. The transparent conductive films 128 and 129 serve as electrodes or wirings that are used for connection with an FPC. The transparent conductive film 129 formed over the second terminal 122 serves as a terminal electrode for connection which functions as an input terminal for the source wiring.

Figure 4:
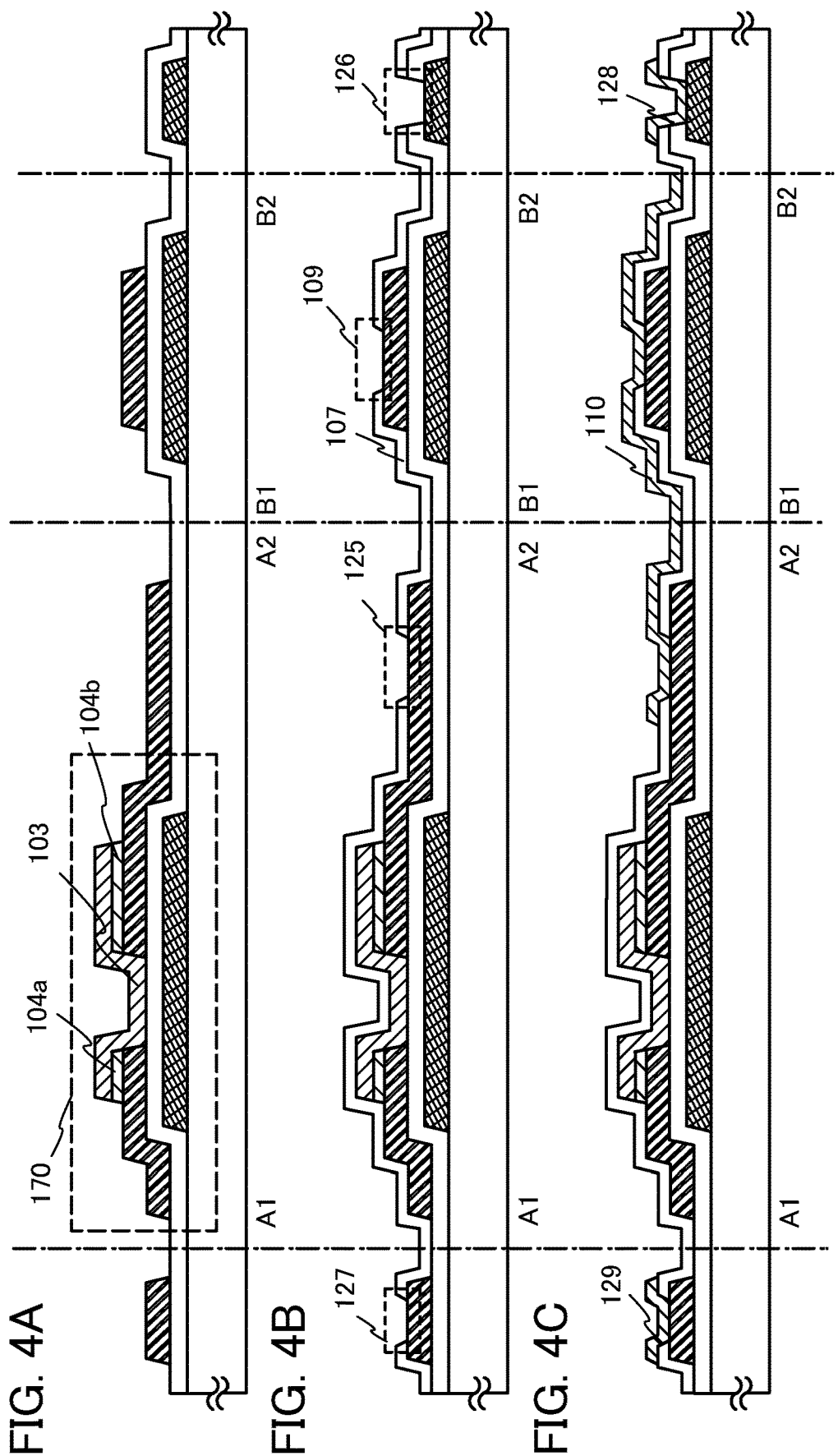
FIGS. 4A to 4C are cross-sectional views showing one example of a method for manufacturing a semiconductor device.
Figure 5:
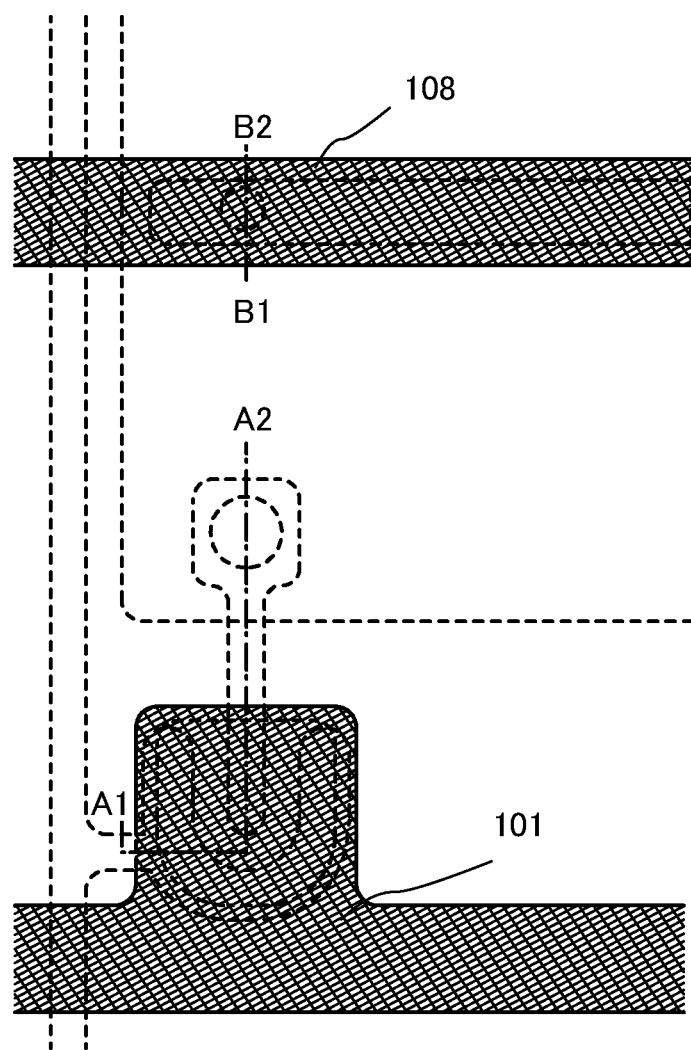
FIG. 5 is a top view showing one example of a method for manufacturing a semiconductor device.

Then, the resist mask is removed, and a cross-sectional view at this stage is FIG. 4C. A top view at this stage is FIG. 8A.

FIGS. 9A1 and 9A2 are a cross-sectional view and a top view of a gate wiring terminal portion at this stage, respectively. FIG. 9A1 is a cross-sectional view along line C1-C2 in FIG. 9A2. In FIG. 9A1, a transparent conductive film 155 formed over a protective insulating film 154 is a connecting terminal electrode which functions as an input terminal. Furthermore, in a terminal portion of FIG. 9A1, a first terminal 151 formed using the same material as the material of a gate wiring and a connection electrode 153 formed using the same material as the material of a source wiring overlap each other with a gate insulating layer 152 interposed therebetween, and are electrically connected to each other through the transparent conductive film 155. Note that a portion where the transparent conductive film 128 and the first terminal 121 shown in FIG. 4C are in contact with each other corresponds to a portion where the transparent conductive film 155 and the first terminal 151 are in contact with each other in FIG. 9A1.

FIGS. 9B1 and 9B2 are a cross-sectional view and a top view of a source wiring terminal portion which is different from the source wiring terminal portion shown in FIG. 4C, respectively. FIG. 9B1 is a cross-sectional view along line D1-D2 in FIG. 9B2. In FIG. 9B1, a transparent conductive film 155 formed over a protective insulating film 154 is a connection terminal electrode which functions as an input terminal. In a terminal portion in FIG. 9B1, an electrode 156 formed using the same material as the material of a gate wiring is located under and overlaps with a second terminal 150 electrically connected to a source wiring with a gate insulating layer 102 interposed therebetween. The electrode 156 is not electrically connected to the second terminal 150. When the electrode 156 is set to, for example, floating, GND, or 0 V such that the potential the electrode 156 is different from the potential of the second terminal 150, a capacitor for preventing noise or static electricity can be formed. In addition, the second terminal 150 is electrically connected to the transparent conductive film 155 with the protective insulating film 154 interposed therebetween.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. There is no particular limitation on the number of each of the terminals, and the number of the terminals may be determined, as appropriate.

Through these five photolithography steps, a pixel thin film transistor portion including the thin film transistor 170 which is a bottom-gate n-channel thin film transistor, and the storage capacitor can be completed using the five photomasks. When these pixel thin film transistor portion and storage capacitor are arranged in a matrix corresponding to respective pixels, a pixel portion can be formed and one of the substrates for manufacturing an active matrix display device can be obtained. In this specification, such a substrate is referred to as an active matrix substrate for convenience.

When an active matrix liquid crystal display device is manufactured, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. This fourth terminal is provided so that the common electrode is fixed to a predetermined potential such as GND or 0 V.

Figure 8:
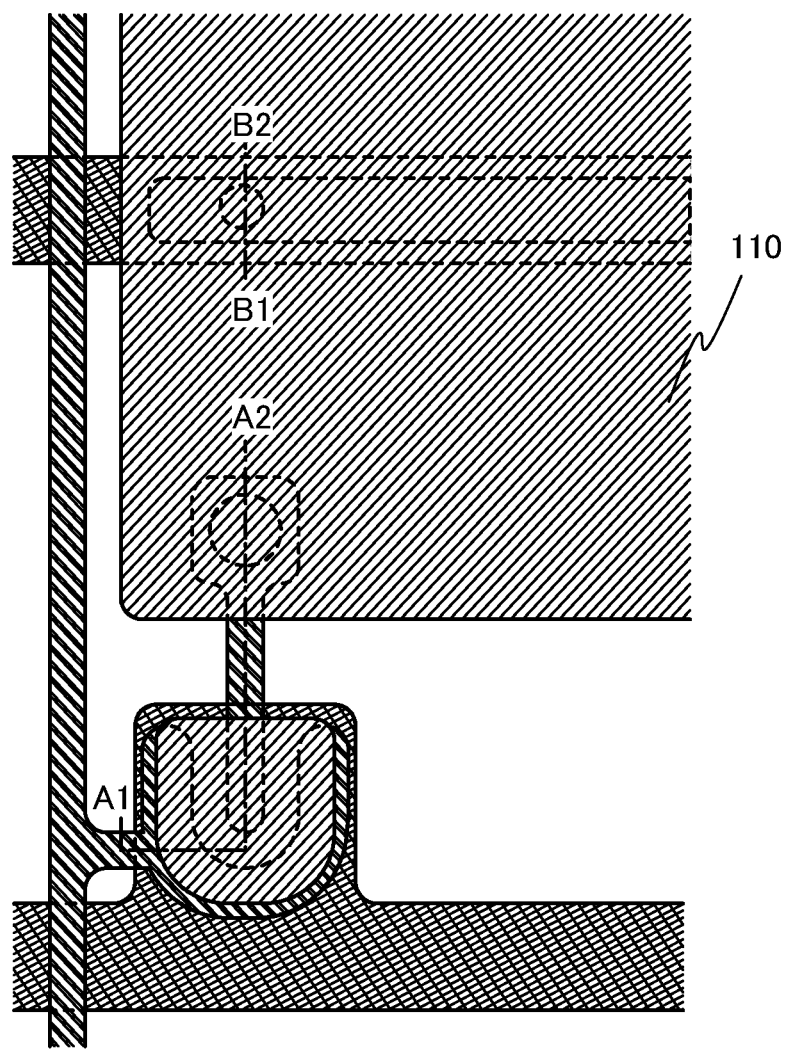
FIG. 8 is a top view showing one example of a method for manufacturing a semiconductor device.
Figure 10:
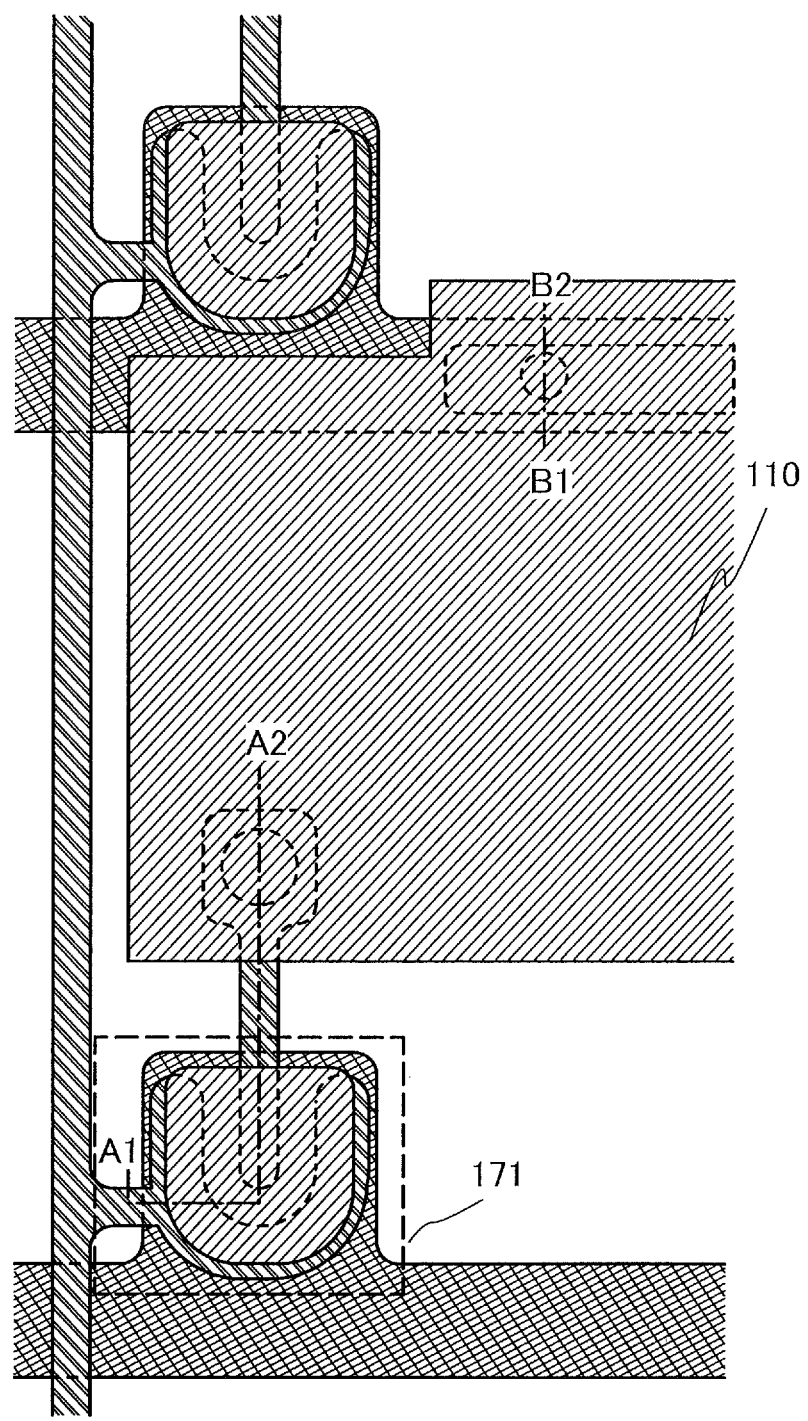
FIG. 10 is a top view showing one example of a method for manufacturing a semiconductor device.

One embodiment of the present invention is not limited to the pixel structure of FIG. 8, and an example of a top view different from FIG. 8 is illustrated in FIG. 10. FIG. 10 illustrates the example in which a capacitor wiring is not provided and a pixel electrode overlaps with a gate wiring of an adjacent pixel with a protective insulating film and a gate insulating layer interposed therebetween to form a storage capacitor. In that case, the capacitor wiring and a third terminal connected to the capacitor wiring can be omitted. Note that in FIG. 10, the same portions as those in FIG. 8 are denoted by the same reference numerals.

In an active matrix liquid crystal display device, display patterns are formed on a screen by driving pixel electrodes arranged in a matrix. Specifically, when voltage is applied between a selected pixel electrode and a counter electrode that corresponds to the selected pixel electrode, a liquid crystal layer provided between the pixel electrode and the counter electrode is optically modulated, and this optical modulation is recognized as a display pattern.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which the vertical cycle is 1.5 or 2 times as long as usual to improve the moving-image characteristics.

Further alternatively, in order to improve the moving-image characteristics of a liquid crystal display device, a driving method may be employed in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

The n-channel transistor obtained in Embodiment 3 includes an In—Ga—Zn—O-based non-single-crystal semiconductor film in a channel formation region and has good dynamic characteristics. Thus, these driving methods can be applied in combination to the n-channel transistor of this embodiment.

When a light-emitting display device is manufactured, one electrode (also referred to as a cathode) of an organic light-emitting element is set to a low power supply potential such as GND or 0 V; therefore, a terminal portion is provided with a fourth terminal for setting the cathode to a low power supply potential such as GND or 0 V. In addition, when a light-emitting display device is manufactured, a power supply line is provided in addition to a source wiring and a gate wiring. Therefore, a terminal portion is provided with a fifth terminal electrically connected to the power supply line.

According to this embodiment, the thin film transistor has a stacked-layer structure in which a gate electrode layer, a gate insulating layer, a source and drain electrode layers, a source and drain regions (an oxide semiconductor layer containing In, Ga, and Zn), and a semiconductor layer (an oxide semiconductor layer containing In, Ga, and Zn), and the quality of the surface of the gate insulating layer is changed by plasma treatment, so that the semiconductor film is kept to be thin and parasitic capacitance can be suppressed. Note that the parasitic capacitance is sufficiently suppressed even when the semiconductor layer is thin, because the thickness is sufficient with respect to that of the gate insulating layer.

According to this embodiment, a thin film transistor with high on-off ratio can be obtained, so that a thin film transistor having high dynamic characteristics can be manufactured. Thus, a semiconductor device including a thin film transistor with high electrical characteristics and high reliability can be provided.

Embodiment 4

In this embodiment, an example of electronic paper will be described as a semiconductor device.

Figure 11:
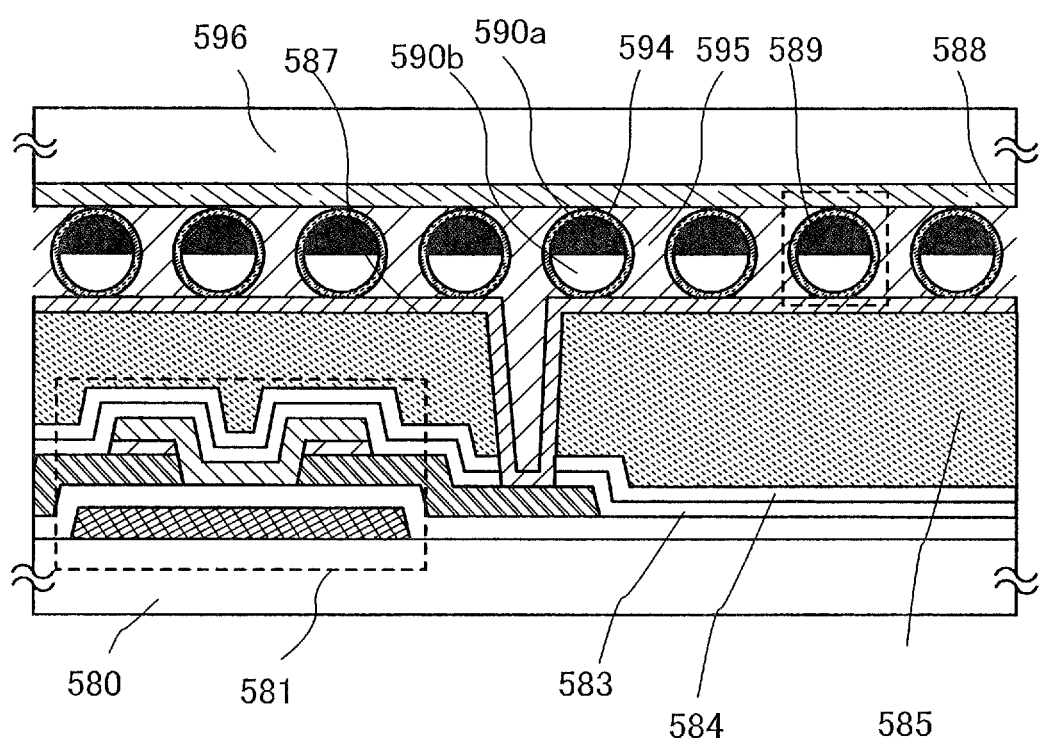
FIG. 11 is a cross-sectional view showing one example of a semiconductor device.

FIG. 11 illustrates active-matrix electronic paper as an example of a semiconductor device, which is different from a liquid crystal display device. A thin film transistor 581 used in a pixel portion of the semiconductor device can be manufactured in a manner similar to the manner of the thin film transistor in the pixel portion described in Embodiment 3 and is a thin film transistor including an In—Ga—Zn—O-based non-single-crystal film as a semiconductor layer. Further, as described in Embodiment 1, tapered shapes of side surfaces of two electrodes which face each other with an oxide semiconductor layer interposed therebetween enables electronic paper including a highly reliable thin film transistor provided with an electric-field relaxation region to be manufactured.

The electronic paper in FIG. 11 is an example of a display device using a twisting ball display system. A twisting ball display method employs a method in which display is performed by arranging spherical particles each of which is colored separately in black and white between the first electrode layer and the second electrode layer which are electrode layers used for display elements, and generating a potential difference between the first electrode layer and the second electrode layer so as to control the directions of the spherical particles.

The thin film transistor 581 is a bottom-gate thin film transistor, and a source or drain electrode layer thereof is in contact with a first electrode layer 587 through an opening formed in an insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions which is filled with liquid are provided. A space around the spherical particles 589 is filled with a filler 595 such as a resin (see FIG. 11).

Instead of the twisting ball, an electrophoretic element can also be used. A microcapsule having a diameter of approximately 10 μm to 200 μm, in which a transparent liquid and positively charged white microparticles and negatively charged black microparticles are encapsulated, is used. In the microcapsule that is provided between the first electrode layer and the second electrode layer, when an electric field is applied by the first electrode layer and the second electrode layer, the white microparticles and the black microparticles migrate to opposite sides to each other, so that white or black can be displayed. A display element using this principle is an electrophoretic display element, and is generally called an electronic paper. The electrophoretic display element has higher reflectivity than a liquid crystal display element; thus, an auxiliary light is unnecessary, less power is consumed, and a display portion can be recognized even in a dusky place. In addition, even when power is not supplied to the display portion, an image which has been displayed once can be maintained; accordingly, a displayed image can be stored even if a semiconductor device having a display function (which may simply be referred to as a display device or a semiconductor device provided with a display device) is distanced from an electric wave source.

Through the above process, electronic paper as a semiconductor device can be manufactured at reduced cost.

This embodiment can be implemented in appropriate combination with any of the structures described in Embodiments 1 to 3.

Embodiment 5

In this embodiment, an example will be described below, in which at least part of a driver circuit and a thin film transistor arranged in a pixel portion are formed over one substrate in a display device which is one example of a semiconductor device.

The thin film transistor arranged in the pixel portion is formed according to Embodiment 1 or 2. Further, the thin film transistor described in Embodiment 1 or 2 is an n-channel TFT, and thus a part of a driver circuit that can include an n-channel TFT among driver circuits is formed over the same substrate as the substrate of the thin film transistor of the pixel portion.

Figure 12A:
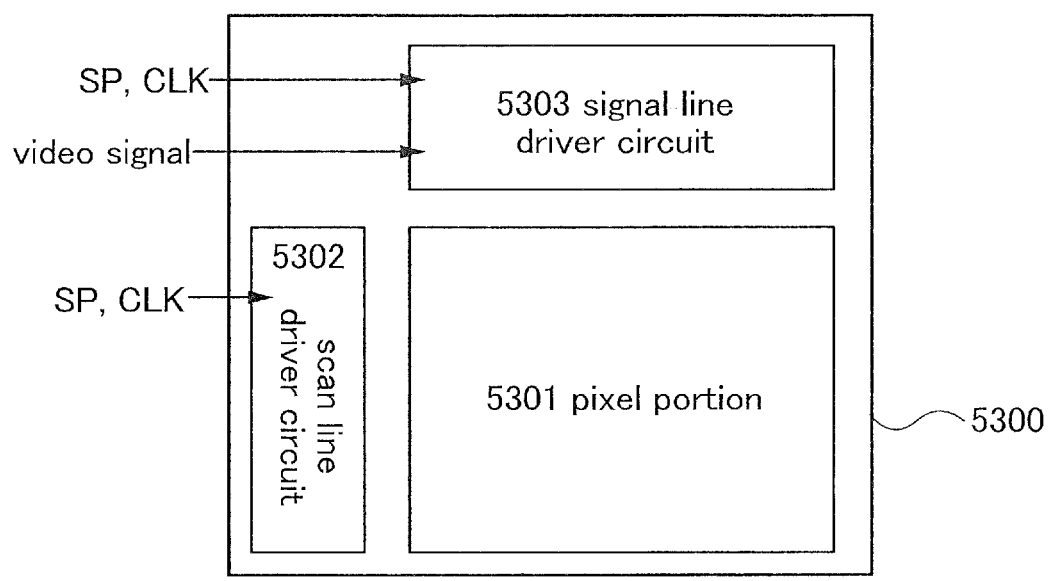
FIGS. 12A and 12B are views showing examples of a block diagram of semiconductor device.

FIG. 12A illustrates an example of a block diagram of an active-matrix liquid crystal display device which is an example of a semiconductor device. The display device illustrated in FIG. 12A includes, over a substrate 5300, a pixel portion 5301 including a plurality of pixels that are each provided with a display element; a scan line driver circuit 5302 that selects a pixel; and a signal line driver circuit 5303 that controls a video signal input to the selected pixel.

The pixel portion 5301 is connected to the signal line driver circuit 5303 by a plurality of signal lines S1 to Sm (not shown) which extend in a column direction from the signal line driver circuit 5303, and to the scan line driver circuit 5302 by a plurality of scan lines G1 to Gn (not shown) that extend in a row direction from the scan line driver circuit 5302. The pixel portion 5301 includes a plurality of pixels (not shown) arranged in matrix so as to correspond to the signal lines S1 to Sm and the scan lines G1 to Gn. Each pixel is connected to a signal line Sj (one of the signal lines S1 to Sm) and a scan line Gj (one of the scan lines G1 to Gn).

The thin film transistor described in Embodiment 1 or 2 is an n-channel TFT, and a signal line driver circuit including the n-channel TFT is described with reference to FIG. 13.

Figure 13:
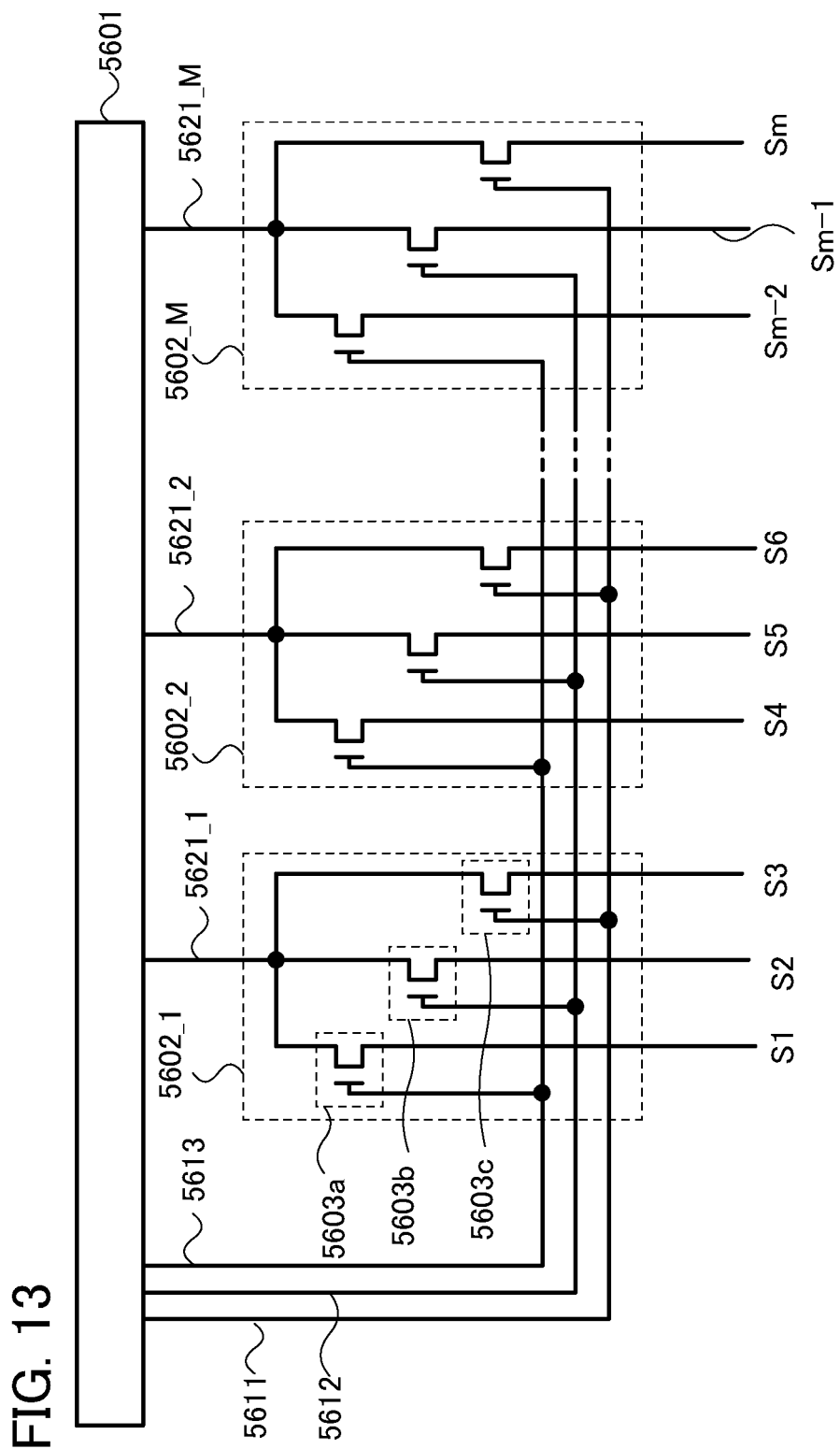
FIG. 13 is a diagram showing one example of a structure of a signal line driver circuit.

The signal line driver circuit illustrated in FIG. 13 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602M includes a first thin film transistor 5603$a$, a second thin film transistor 5603$b$, and a third thin film transistor 5603$c$.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, the third wiring 5613, and the wirings 5621_1 to 5621_M corresponding to the switch groups 5602_1 to 5602_M, respectively. Each of the wirings 5621_1 to 5621_M is connected to three signal lines via the first thin film transistor 5603$a$, the second thin film transistor 5603$b$, and the third thin film transistor 5603$c$. For example, the wiring 5621_J of the J-th column (one of the wirings 5621_1 to 5621_M) is connected to a signal line Sj−1, a signal line Sj, and a signal line Sj+1 via the first thin film transistor 5603$a$, the second thin film transistor 5603$b$, and the third thin film transistor 5603$c$ which are included in the switch group 5602_J.

A signal is input to each of the first wiring 5611, the second wiring 5612, and the third wiring 5613.

Note that the driver IC 5601 is preferably formed over a single crystalline semiconductor substrate. Further, the switch groups 5602_1 to 5602_M are preferably formed over the same substrate as the substrate of the pixel portion. Therefore, the driver IC 5601 and the switch groups 5602_1 to 5602_M are preferably connected through an FPC or the like.

Figure 14:
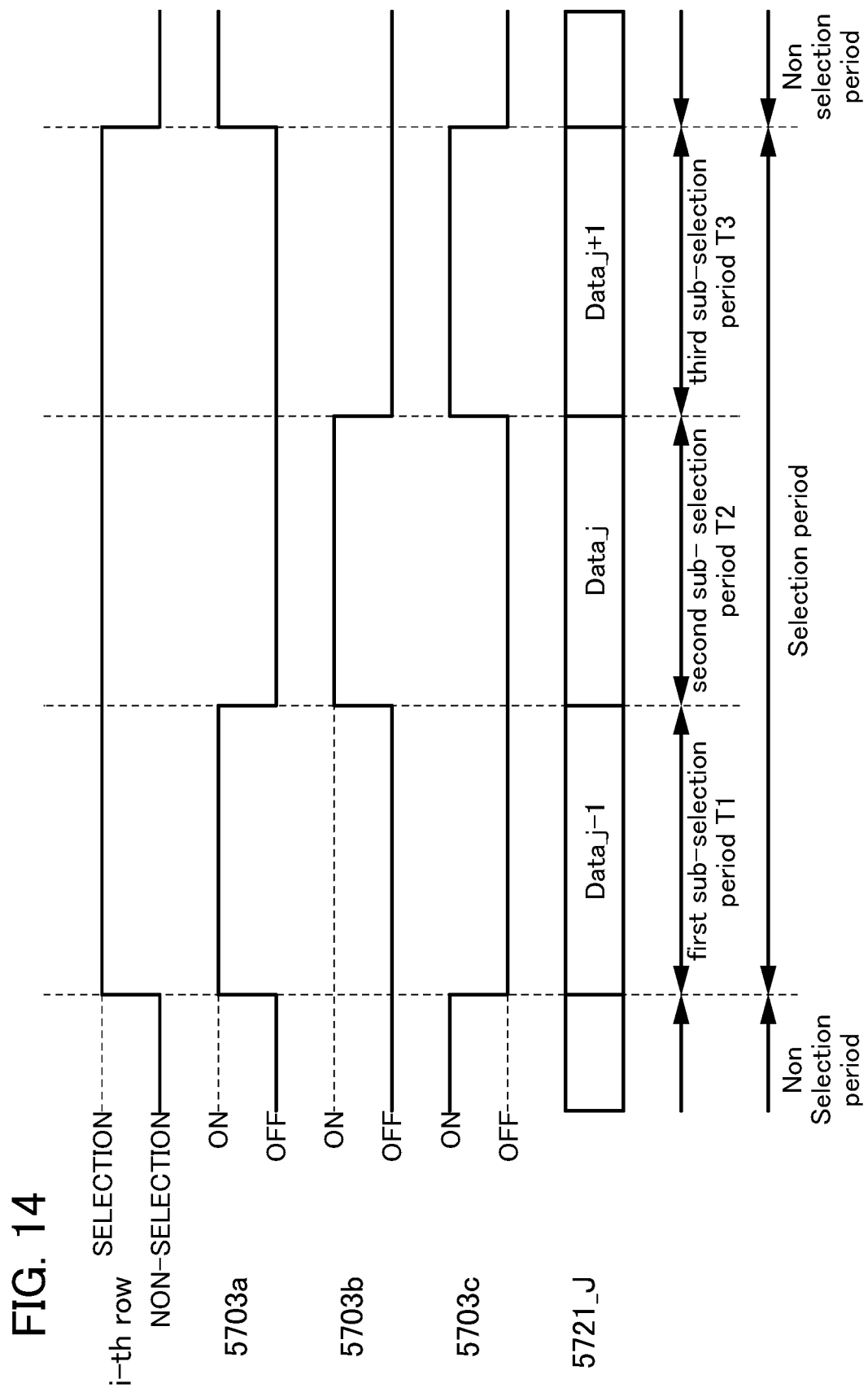
FIG. 14 is a timing chart showing an operation of a signal line driver circuit.

Next, operation of the signal line driver circuit illustrated in FIG. 13 is described with reference to a timing chart in FIG. 14. The timing chart in FIG. 14 illustrates the case where the scan line Gi of the i-th row is selected. A selection period of the scan line Gi of the i-th row is divided into a first sub-selection period T1, a second sub-selection period T2, and a third sub-selection period T3. The signal line driver circuit in FIG. 13 operates similarly to that in FIG. 14 even when a scan line of another row is selected.

Note that the timing chart in FIG. 14 shows the case where the wiring 5621_J of the J-th column is connected to the signal line Sj−1, the signal line Sj, and the signal line Sj+1 via the first thin film transistor 5603$a$, the second thin film transistor 5603$b$, and the third thin film transistor 5603$c$.

The timing chart in FIG. 14 shows timing at which the scan line Gi of the i-th row is selected, timing 5703$a$ of on/off of the first thin film transistor 5603$a$, timing 5703$b$ of on/off of the second thin film transistor 5603$b$, timing 5703$c$ of on/off of the third thin film transistor 5603$c$, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. The video signals input to the wiring 5621_J in the first sub-selection period T1, the second sub-selection period T2, and the third sub-selection period T3 are denoted by Data_j−1, Data_j, and Data_j+1, respectively.

As shown in FIG. 14, in the first sub-selection period T1, the first thin film transistor 5603$a$ is turned on, and the second thin film transistor 5603$b$ and the third thin film transistor 5603$c$ are turned off. At this time, Data_j−1 input to the wiring 5621_J is input to the signal line Sj−1 via the first thin film transistor 5603$a$. In the second sub-selection period T2, the second thin film transistor 5603$b$ is turned on, and the first thin film transistor 5603$a$ and the third thin film transistor 5603$c$ are turned off. At this time, Data_j input to the wiring 5621_J is input to the signal line Sj via the second thin film transistor 5603$b$. In the third sub-selection period T3, the third thin film transistor 5603$c$ is turned on, and the first thin film transistor 5603$a$ and the second thin film transistor 5603$b$ are turned off. At this time, Data_j+1 input to the wiring 5621_J is input to the signal line Sj+1 via the third thin film transistor 5603$c$.

As described above, in the signal line driver circuit in FIG. 13, by dividing one gate selection period into three, video signals can be input to three signal lines from one wiring 5621 in one gate selection period. Therefore, in the signal line driver circuit in FIG. 13, the number of connections between the substrate provided with the driver IC 5601 and the substrate provided with the pixel portion can be about ⅓ of the number of signal lines. The number of connections is reduced to about ⅓ of the number of the signal lines, so that reliability, yield, etc., of the signal line driver circuit in FIG. 13 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective sub-selection periods as shown in FIG. 13.

For example, when video signals are input to three or more signal lines from one wiring in each of three or more sub-selection periods, it is necessary to add a thin film transistor and a wiring for controlling the thin film transistor. Note that when one selection period is divided into four or more sub-selection periods, one sub-selection period becomes short. Therefore, one selection period is preferably divided into two or three sub-selection periods.

Figure 15:
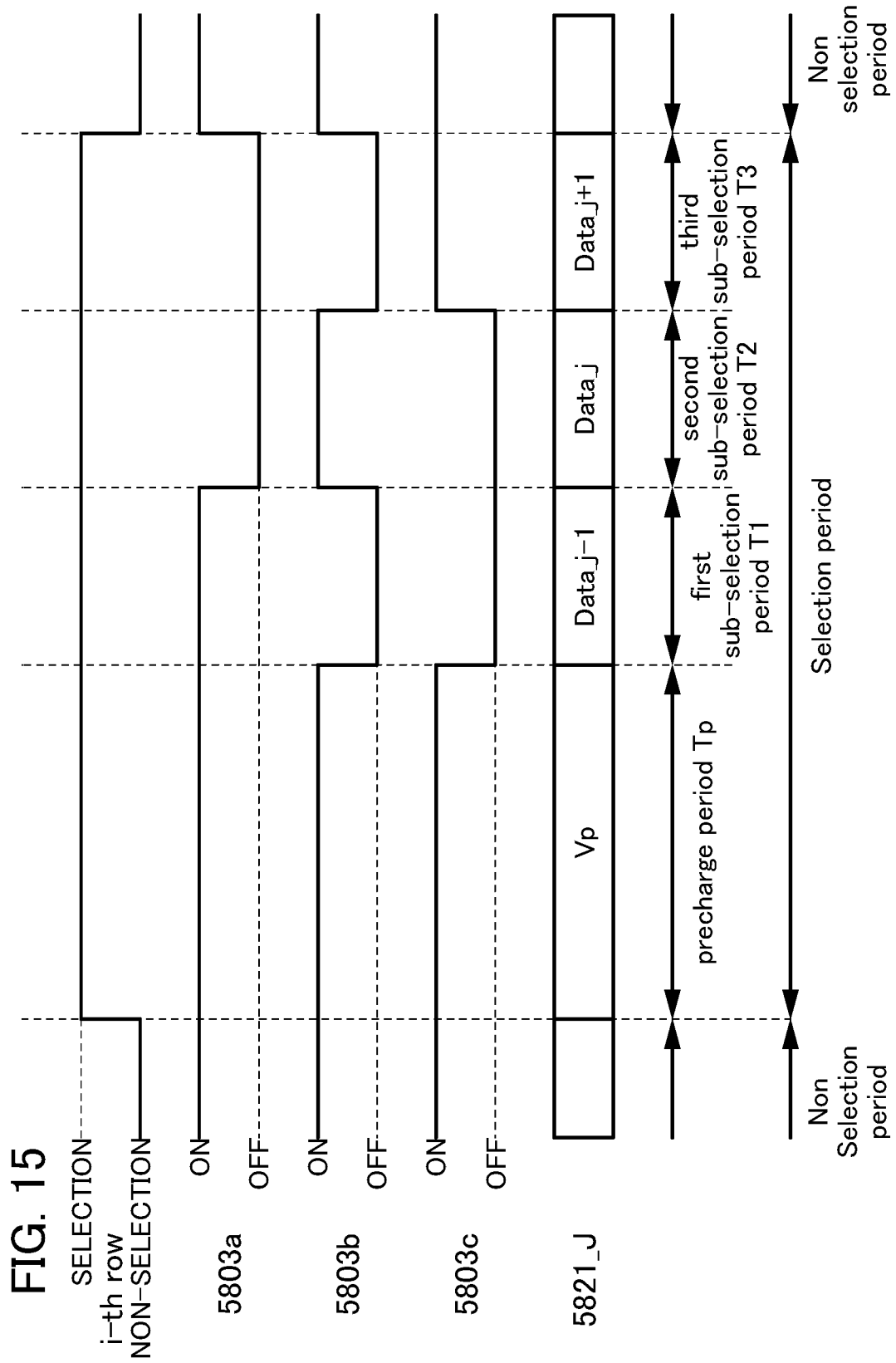
FIG. 15 is a timing chart showing one example of an operation of a signal line driver circuit.

As another example, one gate selection period may be divided into a precharge period Tp, the first sub-selection period T1, the second sub-selection period T2, and the third sub-selection period T3 as illustrated in a timing chart in FIG. 15. The timing chart in FIG. 15 illustrates timing at which the scan line Gi of the i-th row is selected, timing 5803$a$ of on/off of the first thin film transistor 5603$a$, timing 5803$b$ of on/off of the second thin film transistor 5603$b$, timing 5803$c$ of on/off of the third thin film transistor 5603$c$, and a signal 5821_J input to the wiring 5621_J of the J-th column. As shown in FIG. 15, the first thin film transistor 5603a, the second thin film transistor 5603b, and the third thin film transistor 5603c are tuned on in the precharge period Tp. At this time, precharge voltage Vp input to the wiring 5621_J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 13 to which the timing chart in FIG. 15 is applied, the video signal can be written to the pixel at high speed because the signal line can be precharged by providing a precharge selection period before a sub-selection period. Note that portions in FIG. 15 which are similar to those of FIG. 14 are denoted by common reference numerals and detailed description of the same portions and portions which have similar functions is omitted.

Further, a structure of a scan line driver circuit is described. The scan line driver circuit includes a shift register and a buffer. Also, a level shifter may be included in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

One mode of a shift register which is used in a part of a scan line driver circuit is described with reference to FIGS. 16 and 17.

Figure 16:
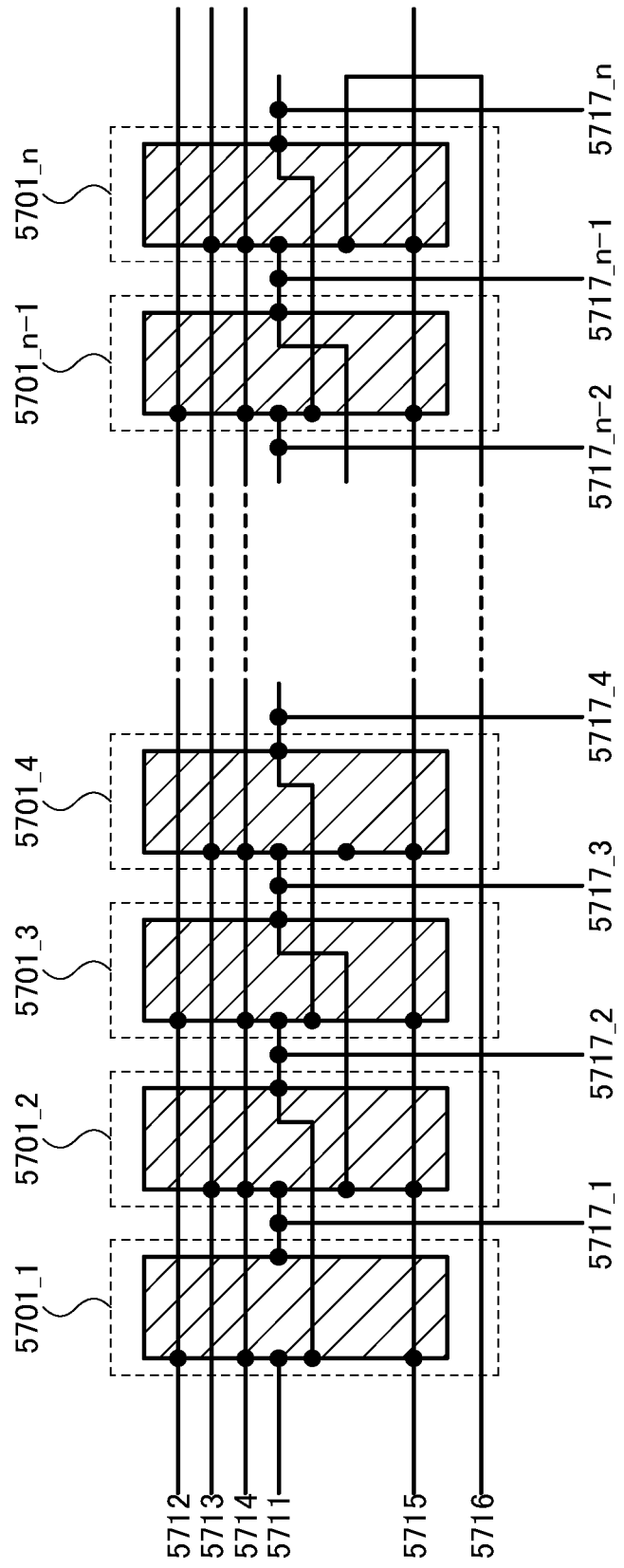
FIG. 16 is a diagram showing one example of a structure of a shift register.

FIG. 16 illustrates a circuit configuration of the shift register. The shift register illustrated in FIG. 16 includes a plurality of flip-flops 5701-i (one of flip-flops 5701-1 to 5701-n). Further, the shift register operates by inputting a first clock signal, a second clock signal, a start pulse signal, and a reset signal.

The connection relation of the shift register in FIG. 16 is described below. In the i-th stage flip-flop 5701_i (one of the flip-flops 5701_1 to 5701_n) in the shift register of FIG. 16, a first wiring 5501 illustrated in FIG. 17 is connected to a seventh wiring 5717_i−1; a second wiring 5502 illustrated in FIG. 17 is connected to a seventh wiring 5717_i+1; a third wiring 5503 illustrated in FIG. 17 is connected to a seventh wiring 5717_i; and a sixth wiring 5506 illustrated in FIG. 17 is connected to a fifth wiring 5715.

Figure 17:
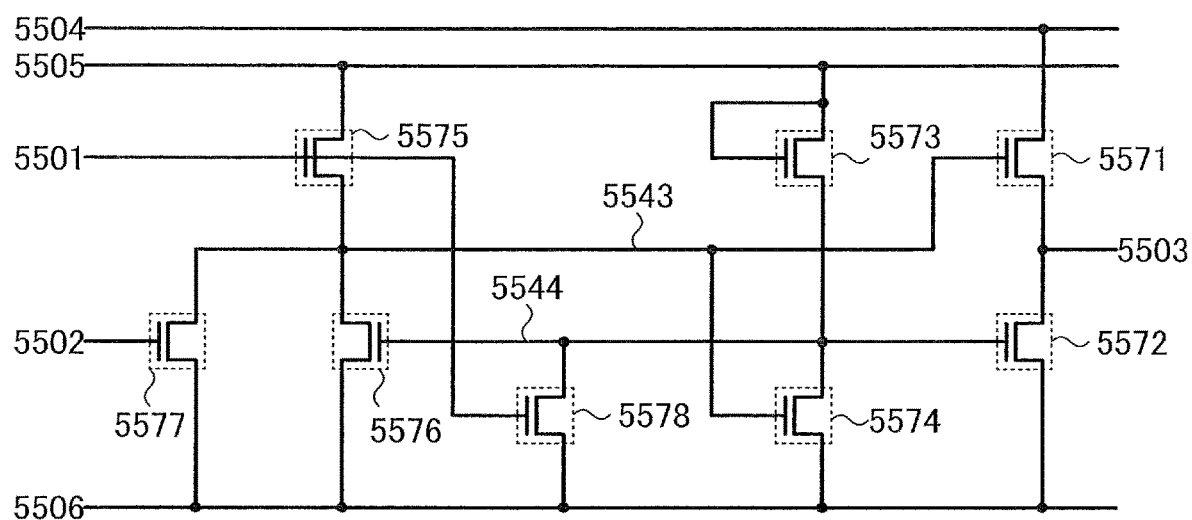
FIG. 17 is a diagram showing a connection structure of the flip-flop shown in FIG. 16.

Further, a fourth wiring 5504 shown in FIG. 17 is connected to a second wiring 5712 in flip-flops of odd-numbered stages, and is connected to a third wiring 5713 in flip-flops of even-numbered stages. A fifth wiring 5505 shown in FIG. 17 is connected to a fourth wiring 5714.

Note that the first wiring 5501 of the first stage flip-flop 5701_1 shown in FIG. 17 is connected to a first wiring 5711, and the second wiring 5502 of the n-th stage flip-flop 5701_n shown in FIG. 17 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 17 illustrates details of the flip-flop shown in FIG. 16. A flip-flop illustrated in FIG. 17 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, the connection structure of the flip-flop illustrated in FIG. 16 is described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506, and a second electrode of the second thin film transistor 5572 is connected to the third wiring 5503.

A first electrode of the third thin film transistor 5573 is connected to the fifth wiring 5505; a second electrode of the third thin film transistor 5573 is connected to a gate electrode of the second thin film transistor 5572; and a gate electrode of the third thin film transistor 5573 is connected to the fifth wiring 5505.

A first electrode of the fourth thin film transistor 5574 is connected to the sixth wiring 5506; a second electrode of the fourth thin film transistor 5574 is connected to a gate electrode of the second thin film transistor 5572; and a gate electrode of the fourth thin film transistor 5574 is connected to a gate electrode of the first thin film transistor 5571.

A first electrode of the fifth thin film transistor 5575 is connected to the fifth wiring 5505; a second electrode of the fifth thin film transistor 5575 is connected to the gate electrode of the first thin film transistor 5571; and a gate electrode of the fifth thin film transistor 5575 is connected to the first wiring 5501.

A first electrode of the sixth thin film transistor 5576 is connected to the sixth wiring 5506; a second electrode of the sixth thin film transistor 5576 is connected to the gate electrode of the first thin film transistor 5571; and a gate electrode of the sixth thin film transistor 5576 is connected to the gate electrode of the second thin film transistor 5572.

A first electrode of the seventh thin film transistor 5577 is connected to the sixth wiring 5506; a second electrode of the seventh thin film transistor 5577 is connected to the gate electrode of the first thin film transistor 5571; and a gate electrode of the seventh thin film transistor 5577 is connected to the second wiring 5502. A first electrode of the eighth thin film transistor 5578 is connected to the sixth wiring 5506; a second electrode of the eighth thin film transistor 5578 is connected to the gate electrode of the second thin film transistor 5572; and a gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

The signal line driver circuit and the scan line driver circuit can be formed using only the n-channel TFTs described in Embodiment 1 or 2. In that case, the drive frequency of the driver circuit can be increased because the mobility of a transistor using an oxide semiconductor layer is high. Further, since the parasitic capacitance is reduced by the source and drain regions in each of the n-channel TFTs described in Embodiment 1 or 2, the frequency characteristic (also called f characteristic) is high. For example, a scan line driver circuit using the n-channel TFT described in Embodiment 1 or 2 can operate at high speed, and thus a frame frequency can be increased and insertion of black images can be realized.

In addition, by increasing the channel width of the transistor in the scan line driver circuit or providing a plurality of scan line driver circuits, for example, higher frame frequency can be realized. When a plurality of scan line driver circuits are provided, a scan line driver circuit for driving even-numbered scan lines is provided on one side and a scan line driver circuit for driving odd-numbered scan lines is provided on the opposite side; thus, increase in frame frequency can be realized.

Figure 12B:
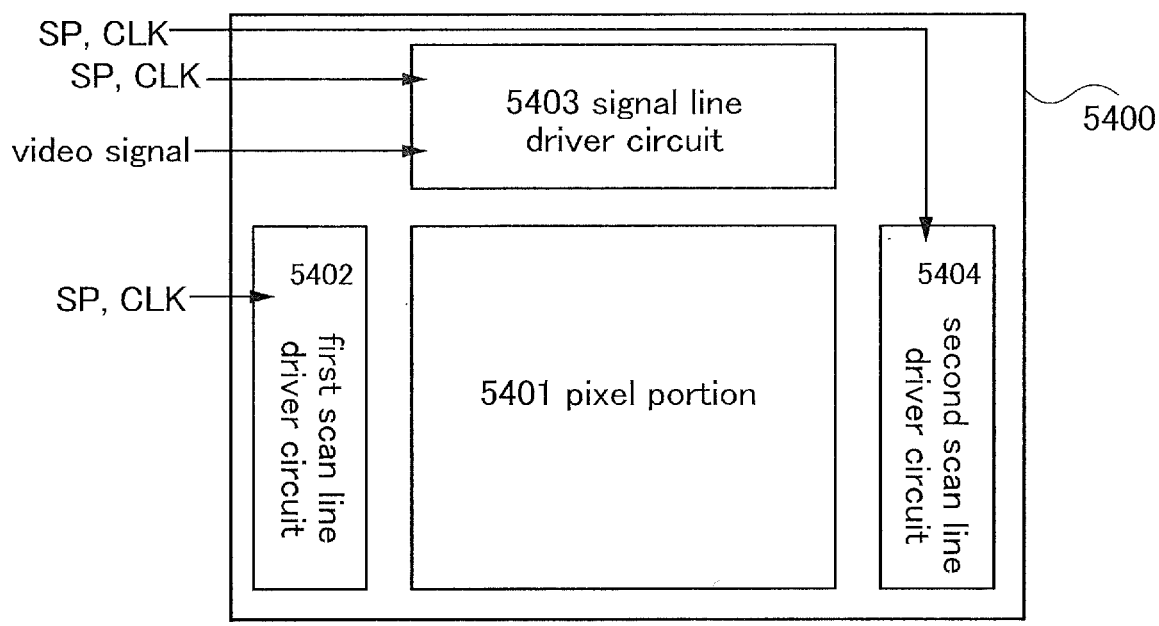

Further, when an active-matrix light-emitting display device which is an example of a semiconductor device is manufactured, a plurality of thin film transistors are arranged in at least one pixel, and thus a plurality of scan line driver circuits are preferably arranged. FIG. 12B is a block diagram illustrating an example of an active-matrix light-emitting display device.

The light-emitting display device illustrated in FIG. 12B includes, over a substrate 5400, a pixel portion 5401 having a plurality of pixels each provided with a display element, a first scan line driver circuit 5402 and a second scan line driver circuit 5404 that select a pixel, and a signal line driver circuit 5403 that controls input of a video signal to the selected pixel.

When the video signal input to a pixel of the light-emitting display device illustrated in FIG. 12B is a digital signal, a pixel is in a light-emitting state or in a non-light-emitting state by switching of ON/OFF of a transistor. Thus, grayscale can be displayed using an area ratio grayscale method or a time ratio grayscale method. An area ratio grayscale method refers to a driving method by which one pixel is divided into a plurality of subpixels and the respective subpixels are driven separately based on video signals so that grayscale is displayed. Further, a time ratio grayscale method refers to a driving method by which a period during which a pixel is in a light-emitting state is controlled so that grayscale is displayed.

Since the response speed of light-emitting elements is faster than that of liquid crystal elements or the like, the light-emitting elements are suitable for a time ratio grayscale method. Specifically, in the case of performing display with a time ratio grayscale method, one frame period is divided into a plurality of subframe periods. Then, in accordance with video signals, the light-emitting element in the pixel is set in a light-emitting state or a non-light-emitting state in each subframe period. By dividing one frame period into a plurality of subframe periods, the total length of time, in which a pixel actually emits light in one frame period, can be controlled by video signals so that grayscale can be displayed.

In the example of the light-emitting display device illustrated in FIG. 12B, in the case where two TFTs, a switching TFT and a current control TFT, are arranged in one pixel, the first scan line driver circuit 5402 generates a signal which is input to a first scan line serving as a gate wiring of the switching TFT, and the second scan line driver circuit 5404 generates a signal which is input to a second scan line serving as a gate wiring of the current control TFT; however, one scan line driver circuit may generate both the signal which is input to the first scan line and the signal which is input to the second scan line. In addition, for example, there is a possibility that a plurality of first scan lines used for controlling the operation of the switching element be provided in each pixel depending on the number of transistors included in the switching element. In that case, signals which are input to the plurality of first scan lines may be all generated by one scan line driver circuit or by an individual plurality of scan line driver circuits.

Also in the light-emitting display device, a part of a driver circuit that can include n-channel TFTs among driver circuits can be formed over the same substrate as the substrate of the thin film transistors of the pixel portion. The signal line driver circuit and the scan line driver circuit can be formed using only the n-channel TFTs described in Embodiment 1 or 2.

Through the above process, a highly reliable display device can be manufactured as a semiconductor device.

This embodiment can be implemented in appropriate combination with any of the structures disclosed in the other embodiments.

Embodiment 6

In this embodiment, an example of a light-emitting display device will be described as a semiconductor device. As a display element included in a display device, a light-emitting element utilizing electro luminescence is described in this embodiment. Light-emitting elements utilizing electroluminescence are classified according to the type of a light emitting material, that is, an organic compound or an inorganic compound. In general, the former is referred to as an organic EL element, the latter as an inorganic EL element.

In an organic EL element, voltage is applied to the light-emitting element, so that electrons are injected from an electrode into a layer including a light-emitting organic compound, and holes are injected from the other electrode into the layer including the light-emitting organic compound, and there flows electric current. Then, by recombination of these carriers (electrons and holes), the organic compound having a light-emitting property gets in an excited state, and light is emitted when the excited state returns to a ground state. From such a mechanism, such a light emitting element is referred to as a current-excitation-type light-emitting element.

Inorganic EL elements are classified in a dispersive inorganic EL element and a thin-film inorganic EL element. A dispersive inorganic EL element includes a light-emitting layer in which particles of a light-emitting material are dispersed in a binder, and light emission mechanism thereof is donor-acceptor recombination light emission, in which a donor level and an acceptor level are utilized. In a thin film inorganic EL element, a light-emitting layer is sandwiched between dielectric layers, and the dielectric layers are sandwiched between electrodes. Light emission mechanism of the thin film inorganic EL element is local light emission, in which inner-shell electron transition of a metal ion is utilized. In this embodiment, description will be made using an organic EL element as a light-emitting element.

Figure 18:
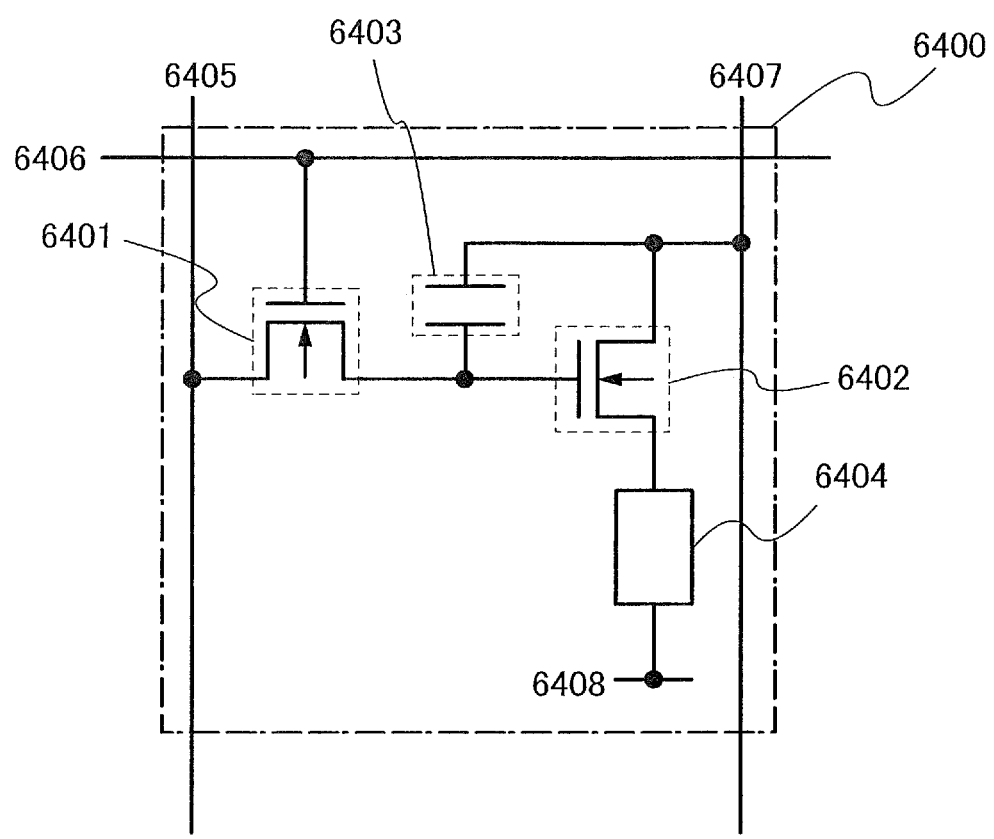
FIG. 18 is a diagram showing one example of a pixel equivalent circuit of a semiconductor device.

FIG. 18 illustrates an example of a pixel structure to which digital time grayscale driving can be applied, as an example of a semiconductor device.

A structure and an operation of the pixel to which digital time grayscale driving can be applied are described below. An example is described in this embodiment in which one pixel includes two n-channel transistors using an oxide semiconductor layer (an In—Ga—Zn—O-based non-single-crystal film) in a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408.

The second electrode of the light-emitting element 6404 (the common electrode 6408) is set to a low power supply potential. The low power supply potential is a potential satisfying the low power supply potential<a high power supply potential with the high power supply potential set to the power supply line 6407 as a reference. As the low power supply potential, GND, 0 V, or the like may be employed, for example. A potential difference between the high power supply potential and the low power supply potential is applied to the light-emitting element 6404, and a current is supplied to the light-emitting element 6404. Here, in order to make the light-emitting element 6404 emit light, each potential is set so that the potential difference between the high power supply potential and the low power supply potential is a forward threshold voltage or higher.

Gate capacitance of the driving transistor 6402 may be used as a substitute for the capacitor 6403, so that the capacitor 6403 can be omitted. The gate capacitance of the driving transistor 6402 may be formed between a channel region and a gate electrode.

In the case of voltage-input voltage-driving method, a video signal is input to the gate of the driving transistor 6402 so that the driving transistor 6402 is in either of two states of being sufficiently turned on and turned off. That is, the driving transistor 6402 operates in a linear region. Since the driving transistor 6402 operates in a linear region, a voltage higher than the voltage of the power supply line 6407 is applied to the gate of the driving transistor 6402. Note that a voltage greater than or equal to the sum voltage of the power supply line voltage and $V_{th}$ of the driving transistor 6402 is applied to the signal line 6405.

In the case of performing analog grayscale driving instead of digital time grayscale driving, the same pixel structure as that in FIG. 18 can be used by changing signal input.

In the case of performing the analog grayscale driving, a voltage greater than or equal to the sum of the forward voltage of the light-emitting element 6404 and $V_{th}$ of the driving transistor 6402 is applied to the gate of the driving transistor 6402. The forward voltage of the light-emitting element 6404 refers to a voltage to obtain a desired luminance, and includes at least a forward threshold voltage. The video signal such that the driving transistor 6402 operates in a saturation region is input, so that a current can be supplied to the light-emitting element 6404. In order that the driving transistor 6402 can operate in the saturation region, the potential of the power supply line 6407 is higher than the gate potential of the driving transistor 6402. Since the video signal is an analog signal, a current in accordance with the video signal flows in the light-emitting element 6404, and the analog grayscale driving can be performed.

Note that the pixel structure illustrated in FIG. 18 is not limited thereto. For example, a switch, a resistor, a capacitor, a transistor, a logic circuit, or the like may be added to the pixel illustrated in FIG. 18.

Next, structures of a light-emitting element will be described using FIGS. 19A to 19C. In this embodiment, cross-sectional structures of pixels are described taking the case where a driving TFT is the thin film transistor 170, as an example. Driving TFTs 7001, 7011, and 7021 used in semiconductor devices illustrated in FIGS. 19A to 19C can be manufactured in a manner similar to that of the thin film transistor 170 described in Embodiment 1 and are thin film transistors having high electrical characteristics, each including an In—Ga—Zn—O-based non-single-crystal film as a semiconductor layer.

In order to extract light emission from the light-emitting element, at least one of the anode and the cathode of the light-emitting element is required to be transparent. The thin film transistors and the light-emitting element are formed over the substrate. A light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure illustrated in FIG. 18 can be applied to a light-emitting element having any of these emission structures.

A light-emitting element having a top emission structure is described with reference to FIG. 19A.

Figure 19A:
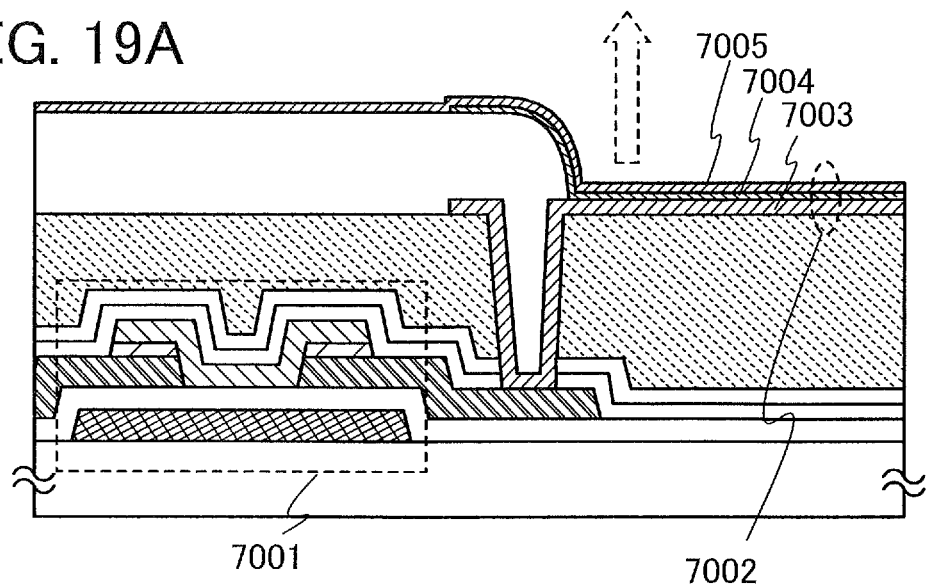
FIGS. 19A to 19C are cross-sectional views showing examples of a semiconductor device.

FIG. 19A is a cross-sectional view of a pixel in the case where a driving TFT 7001 is the thin film transistor 170 shown in FIG. 1B and light emission from a light-emitting element 7002 passes to an anode 7005 side. In FIG. 19A, a cathode 7003 of the light-emitting element 7002 is electrically connected to the driving TFT 7001, and a light-emitting layer 7004 and the anode 7005 are stacked in this order over the cathode 7003. The cathode 7003 can be formed using various conductive materials as long as they have a low work function and reflect light. For example, Ca, Al, CaF, MgAg, AlLi, or the like is preferably used. The light-emitting layer 7004 may be formed using either a single layer or a stacked layer of a plurality of layers. If the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, or indium tin oxide to which silicon oxide is added.

A region where the light-emitting layer 7004 is sandwiched between the cathode 7003 and the anode 7005 corresponds to the light-emitting element 7002. In the case of the pixel illustrated in FIG. 19A, light emitted from the light-emitting element 7002 is ejected to the anode 7005 side as indicated by an arrow.

A light-emitting element having a bottom emission structure is described next with reference to FIG. 19B. FIG. 19B is a cross-sectional view of a pixel in the case where a driving TFT 7011 is the thin film transistor 170 shown in FIG. 1A and light emission from a light-emitting element 7012 passes to a cathode 7013 side. In FIG. 19B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A blocking film 7016 for reflecting or blocking light may be formed so as to cover the anode 7015 when the anode 7015 has a light-transmitting property. For the cathode 7013, a variety of materials can be used as in the case of FIG. 19A as long as they are conductive materials having a low work function. The cathode 7013 has a thickness that can transmit light (preferably, about 5 to 30 nm). For example, an aluminum film with a thickness of 20 nm can be used as the cathode 7013. In a manner similar to that of FIG. 19A, the light-emitting layer 7014 may be formed using either a single-layer structure or a layered structure of a plurality of layers. Although the anode 7015 does not need to transmit light, the anode 7015 can be formed using a light-transmitting conductive material in a manner similar to that of FIG. 19A. For the blocking film 7016, a metal or the like that reflects light can be used; however, it is not limited to a metal film. For example, a resin or the like to which black pigments are added can be used.

A region where the light-emitting layer 7014 is sandwiched between the cathode 7013 and the anode 7015 corresponds to the light-emitting element 7012. In the case of the pixel illustrated in FIG. 19B, light emitted from the light-emitting element 7012 is ejected to the cathode 7013 side as indicated by an arrow.

Next, a light-emitting element having a dual emission structure is described with reference to FIG. 19C. In FIG. 19C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 19A, the cathode 7023 can be formed using a variety of conductive materials as long as they have a low work function. The cathode 7023 has a thickness that can transmit light. For example, an Al film having a thickness of 20 nm can be used as the cathode 7023. In a manner similar to that of FIG. 19A, the light-emitting layer 7024 may be formed using either a single-layer structure or a layered structure of a plurality of layers. In a manner similar to that of FIG. 19A, the anode 7025 can be formed using a light-transmitting conductive material.

A region where the cathode 7023, the light-emitting layer 7024, and the anode 7025 overlap with each other corresponds to the light-emitting element 7022. In the case of the pixel illustrated in FIG. 19C, light emitted from the light-emitting element 7022 is ejected to both an anode 7025 side and a cathode 7023 side as indicated by arrows.

Although an organic EL element is described as a light-emitting element in this embodiment, an inorganic EL element may be provided as a light-emitting element.

This embodiment describes the example in which a thin film transistor for controlling the drive of a light-emitting element (the driving TFT) is electrically connected to the light-emitting element. However, a current control TFT may be connected between the driving TFT and the light-emitting element.

Figure 19B:
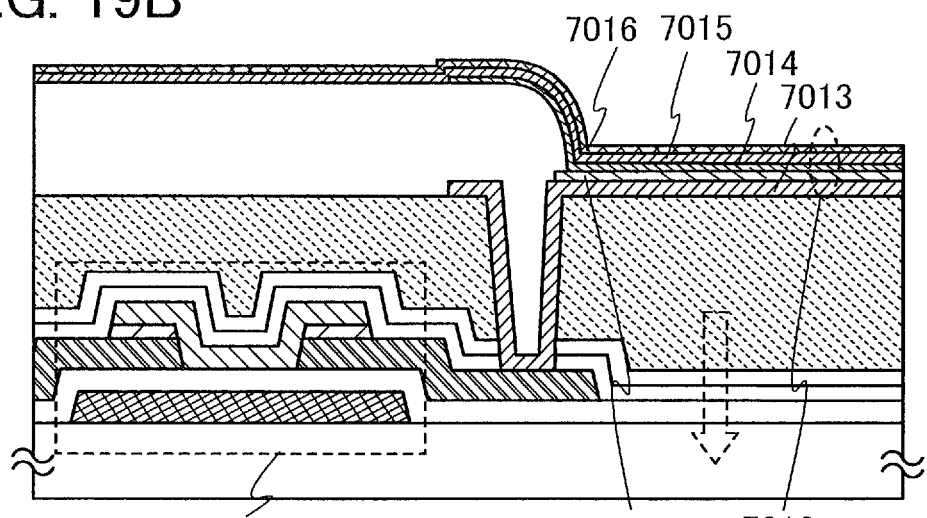
Figure 19C:
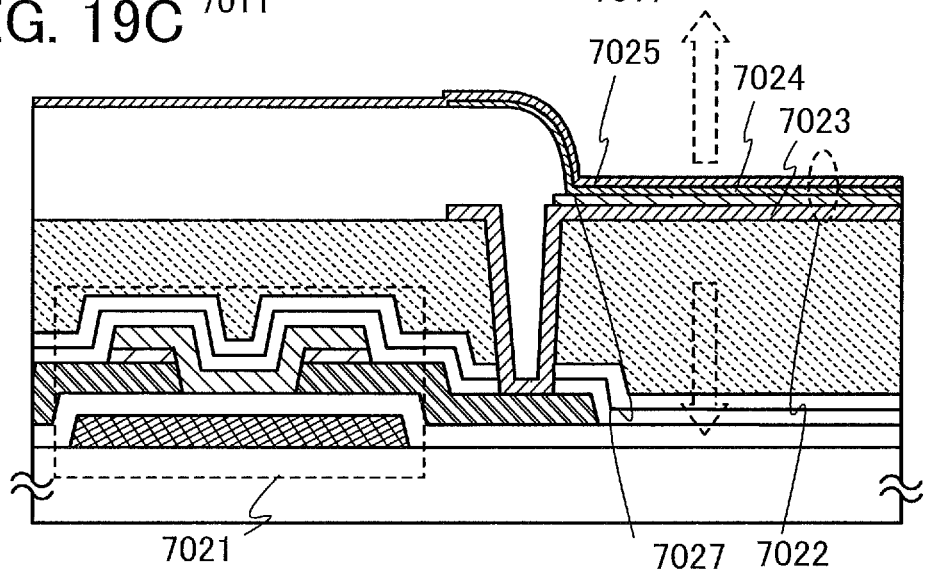

A semiconductor device described in this embodiment is not limited to the structures illustrated in FIGS. 19A to 19C and can be modified in various ways based on the spirit of techniques according to the present invention disclosed in this specification.

Figure 22A:
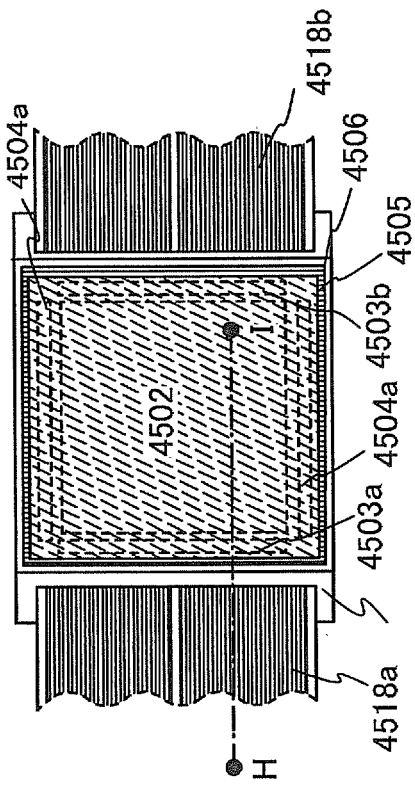
FIGS. 22A and 22B are a top view and a cross-sectional view showing one example of a semiconductor device.
Figure 22B:
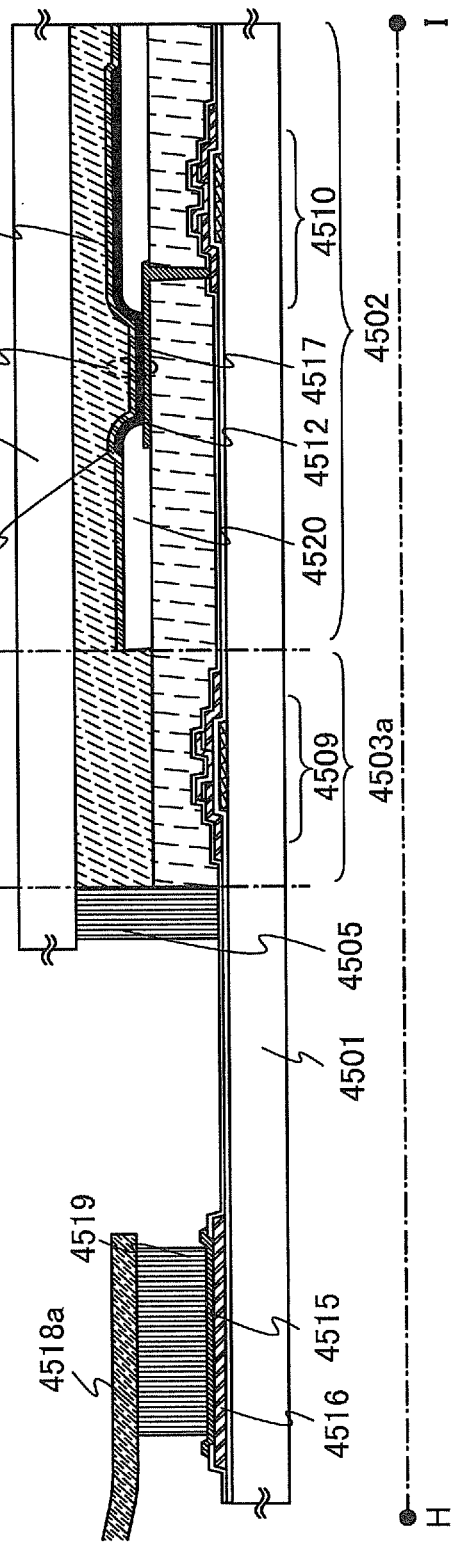

Next, a top surface and a cross section of a light-emitting display panel (also referred to as a light-emitting panel), which is one embodiment of the semiconductor device will be described with reference to FIGS. 22A and 22B. FIG. 22A is a top view of a panel in which a thin film transistor and a light-emitting element are sealed between a first substrate and a second substrate with a sealant. FIG. 22B is a cross-sectional view taken along line H-I of FIG. 22A.

A sealant 4505 is provided to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 20B.

As the thin film transistors 4509 and 4510, the highly reliable thin film transistors described in Embodiment 1, each including an In—Ga—Zn—O-based non-single-crystal film as a semiconductor layer can be used.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that a structure of the light-emitting element 4511 which includes the first electrode layer 4517, an electroluminescent layer 4512, and the second electrode layer 4513 is not limited to the structure described in Embodiment 6. The structure of the light-emitting element 4511 can be changed as appropriate depending on the direction in which light is extracted from the light-emitting element 4511, or the like.

A bank 4520 is formed using an organic resin film, an inorganic insulating film, or organic polysiloxane. It is particularly preferable that the bank 4520 be formed using a photosensitive material to have an opening over the first electrode layer 4517 so that a sidewall of the opening is formed as an inclined surface with continuous curvature.

The electroluminescent layer 4512 may be formed as a single layer or a plurality of layers stacked.

A protective film may be formed over the second electrode layer 4513 and the bank 4520 in order to prevent oxygen, hydrogen, moisture, carbon dioxide, or the like from entering into the light-emitting element 4511. As the protective film, a silicon nitride film, a silicon nitride oxide film, a DLC film, or the like can be formed.

A variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

In Embodiment 6, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal of the FPC 4518*a* through an anisotropic conductive film 4519.

As the second substrate located in the direction in which light is extracted from the light-emitting element 4511 needs to have a light-transmitting property. In that case, a material with a light-transmitting property, such as a glass plate, a plastic sheet, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, the polarizing plate or the circularly polarizing plate may be provided with an anti-reflection film. For example, anti-glare treatment may be carried out by which reflected light can be diffused by projections and depressions on the surface so as to reduce the glare.

The signal line driver circuits 4503*a* and 4503*b* and the scan line driver circuits 4504*a* and 4504*b* may be mounted as driver circuits formed using a single crystal semiconductor film or polycrystalline semiconductor film over a single crystal semiconductor substrate or an insulating substrate separately prepared. Alternatively, only the signal line driver circuits or part thereof, or the scan line driver circuits or part thereof may be separately formed and mounted. This embodiment is not limited to the structure illustrated in FIGS. 22A and 22B.

Through the above process, a light-emitting display device (display panel) can be manufactured at low cost.

This embodiment can be implemented in appropriate combination with any of the structures described in Embodiments 1 to 3.

Embodiment 7

In this embodiment, top surfaces and a cross section each of a liquid crystal display panel which corresponds to one example of the semiconductor device will be described using FIGS. 20A1, 20A2, and 20B. FIGS. 20A1 and 20A2 are each a top view of a panel in which thin film transistors 4010 and 4011 formed over a first substrate 4001 and a liquid crystal element 4013 are sealed between the first substrate 4001 and a second substrate 4006 with a sealant 4005. The thin film transistors 4010 and 4011 are according to Embodiment 1 and each includes an In—Ga—Zn—O-based non-single-crystal film as a semiconductor layer. FIG. 20B is a cross-sectional view along line M-N of each of FIGS. 20A1 and 20A2.

The sealant 4005 is provided so as to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 20A1 illustrates an example of mounting the signal line driver circuit 4003 by a COG method, and FIG. 20A2 illustrates an example of mounting the signal line driver circuit 4003 by a TAB method.

The pixel portion 4002 and the scan line driver circuit 4004 provided over the first substrate 4001 each include a plurality of thin film transistors. FIG. 20B illustrates the thin film transistor 4010 included in the pixel portion 4002 and the thin film transistor 4011 included in the scanning line driver circuit 4004. Insulating layers 4020 and 4021 are provided over the thin film transistors 4010 and 4011.

As each of the thin film transistors 4010 and 4011, the thin film transistor including an In—Ga—Zn—O-based non-single-crystal film as a semiconductor layer, which is described in Embodiment 1 can be employed. The thin film transistor 4011 corresponds to the thin film transistor 170 shown in FIG. 1 of Embodiment 1.

A pixel electrode layer 4030 included in the liquid crystal element 4013 is electrically connected to the thin film transistor 4010. A counter electrode layer 4031 of the liquid crystal element 4013 is formed over the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

The first substrate 4001 and the second substrate 4006 can be formed using glass, metal (typically, stainless steel), ceramic, or plastic. As for plastic, an FRP (fiberglass-reinforced plastics) plate, a PVF (polyvinyl fluoride) film, a polyester film, or an acrylic resin film can be used. Further, a sheet in which aluminum foil is sandwiched by PVF films or polyester films can also be used.

A columnar spacer denoted by reference numeral 4035 is obtained by selective etching of an insulating film and is provided in order to control the distance (a cell gap) between the pixel electrode layer 4030 and the counter electrode layer 4031. Note that a spherical spacer may be used. The counter electrode layer 4031 is electrically connected to a common potential line provided over the same substrate as the substrate of the thin film transistor 4010. With the use of the common connection portion, the counter electrode layer 4031 can be electrically connected to the common potential line through conductive particles provided between the pair of substrates. Note that the conductive particles are contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at 5 wt % or more is used for the liquid crystal layer 4008 in order to improve the temperature range. The liquid crystal composition which includes a liquid crystal showing a blue phase and a chiral agent has a small response time of 10 to 100 µs, has optical isotropy, which makes the alignment process unneeded, and has a small viewing angle dependence.

Although an example of a transmissive liquid crystal display device is described in this embodiment, the present invention can also be applied to a reflective liquid crystal display device or a transflective liquid crystal display device.

In Embodiment 7, an example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stack structure of the polarizing plate and the coloring layer is not limited to that described in Embodiment 7 and may be set as appropriate depending on materials of the polarizing plate and the coloring layer or conditions of manufacturing steps. Furthermore, a light-blocking film serving as a black matrix may be provided.

In this embodiment, in order to reduce surface roughness of the thin film transistor and to improve reliability of the thin film transistor, the thin film transistor obtained by Embodiment 1 is covered with the insulating layers (the insulating layer 4020 and the insulating layer 4021) each functioning as a protective film or a planarizing insulating film. The protective film is provided to prevent entry of impurities floating in air, such as an organic substance, a metal substance, or moisture, and is preferably a dense film. The protective film may be formed by a sputtering method to be a single-layer film or a stack of a silicon oxide film, a silicon nitride film, a silicon oxynitride film, a silicon nitride oxide film, an aluminum oxide film, an aluminum nitride film, an aluminum oxynitride film, and/or an aluminum nitride oxide film. Although an example in which the protective film is formed by a sputtering method is described in this embodiment, the present invention is not limited to this example, and the protective film may be formed by a variety of methods such as a PCVD method.

In this embodiment, the insulating layer 4020 having a stack structure is formed as the protective film. As a first layer of the insulating layer 4020, a silicon oxide film is formed by a sputtering method. The use of the silicon oxide film as the protective film has the effect of preventing a hillock of an aluminum film used for the source and drain electrode layers.

In addition, an insulating layer is formed as a second layer of the protective film. In this embodiment, as the second layer of the insulating layer 4020, a silicon nitride film is formed by a sputtering method. The use of the silicon nitride film as the protective film can prevent the entry of mobile ions of sodium or the like to a semiconductor region so that variation in electrical characteristics of the TFT can be suppressed.

After the protective film is formed, the semiconductor layer may be subjected to annealing (at 300 to 400° C.).

Then, the insulating layer 4021 is formed as the planarizing insulating film. The insulating layer 4021 can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using any of these materials.

Note that a siloxane resin is a resin formed from a siloxane material as a starting material and having the bond of Si—O—Si. A siloxane-based resin may use, as a substituent, an organic group (e.g., an alkyl group, and an aryl group) or a fluoro group. The organic group may have a fluoro group.

There is no particular limitation on the method for forming the insulating layer 4021, and the insulating layer 4021 can be formed, depending on the material, by a sputtering method, an SOG method, a spin coating method, a dipping method, a spray coating method, a droplet discharge method (e.g., an inkjet method, screen printing, offset printing, or the like), a doctor knife, a roll coater, a curtain coater, a knife coater, or the like. In the case where the insulating layer 4021 is formed using a material solution, the semiconductor layer may be annealed (at 300 to 400° C.) at the same time as a baking step. The baking step of the insulating layer 4021 also serves as the annealing step of the semiconductor layer, whereby a semiconductor device can be manufactured efficiently.

The pixel electrode layer 4030 and the counter electrode layer 4031 can be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for forming the pixel electrode layer 4030 and the counter electrode layer 4031. It is preferable that the pixel electrode formed using a conductive composition have sheet resistance of 10000 Ω/square or less, and light transmittance of greater than or equal to 70% at a wavelength of 550 nm. Further, it is preferable that the conductive high molecule contained in the conductive composition have resistance of less than or equal to 0.1 Ω·cm.

As the conductive high molecule, a so-called π electron conjugated conductive high molecule can be used. For example, polyaniline and/or a derivative thereof, polypyrrole and/or a derivative thereof, polythiophene and/or a derivative thereof, and a copolymer of two or more kinds of those materials can be given.

The variety of signals and potentials are supplied to the signal line driver circuit 4003 that is formed separately, and the scan line driver circuit 4004 or the pixel portion 4002 from an FPC 4018.

In Embodiment 7, a connection terminal electrode 4015 is formed from the same conductive film as the pixel electrode layer 4030 included in the liquid crystal element 4013, and a terminal electrode 4016 is formed from the same conductive film as source and drain electrode layers of the thin film transistors 4010 and 4011.

The connection terminal electrode 4015 is electrically connected to a terminal included in the FPC 4018 through an anisotropic conductive film 4019.

Although FIGS. 20A1 and 20A2 illustrate an example in which the signal line driver circuit 4003 is formed separately and mounted on the first substrate 4001, this embodiment is not limited to this structure. The scan line driver circuit may be formed separately and then mounted, or only a part of the signal line driver circuit or a part of the scan line driver circuit may be formed separately and then mounted.

Figure 21:
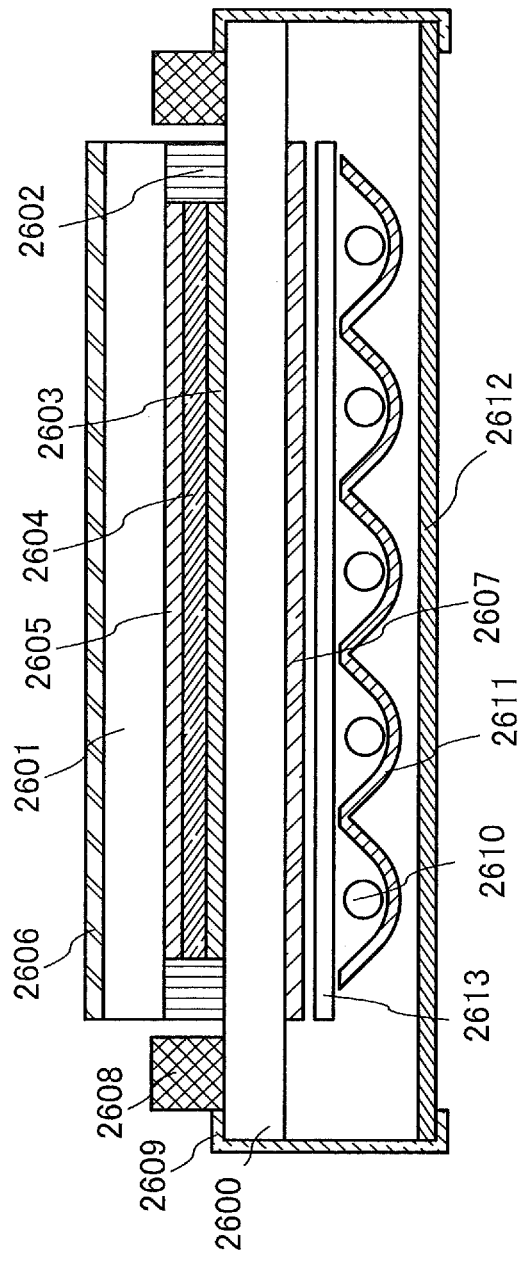
FIG. 21 is a cross-sectional view showing one example of a semiconductor device.

FIG. 21 illustrates an example of a liquid crystal display module which is formed as a semiconductor device by using a TFT substrate 2600.

FIG. 21 shows an example of a liquid crystal display module, in which the TFT substrate 2600 and a counter substrate 2601 are fixed to each other with a sealant 2602, and a pixel portion 2603 including a TFT and the like, a display element 2604 including a liquid crystal layer, a coloring layer 2605, and a polarizing plate 2606 are provided between the substrates to form a display region. A coloring layer 2605 is necessary to perform color display. In the case of the RGB system, respective coloring layers for red, green, and blue colors are provided for respective pixels. Polarizing plates 2606 and 2607 and a diffuser plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit and a power source circuit. The polarizing plate and the liquid crystal layer may be stacked with a retardation film interposed therebetween.

The liquid crystal display module can use any of the following modes: a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, and the like.

Through the above process, a liquid crystal display panel as a semiconductor device can be manufactured at reduced cost.

This embodiment can be implemented in appropriate combination with any of the structures described in Embodiments 1 to 3.

Embodiment 8

Electronic paper can be used for electronic devices of a variety of fields as long as they display data. For example, an electronic paper can be applied to an e-book reader (electronic book), a poster, an advertisement in a vehicle such as a train, or displays of various cards such as a credit card. Examples of the electronic devices are illustrated in FIGS. 23A and 23B and FIG. 24.

Figure 23A:
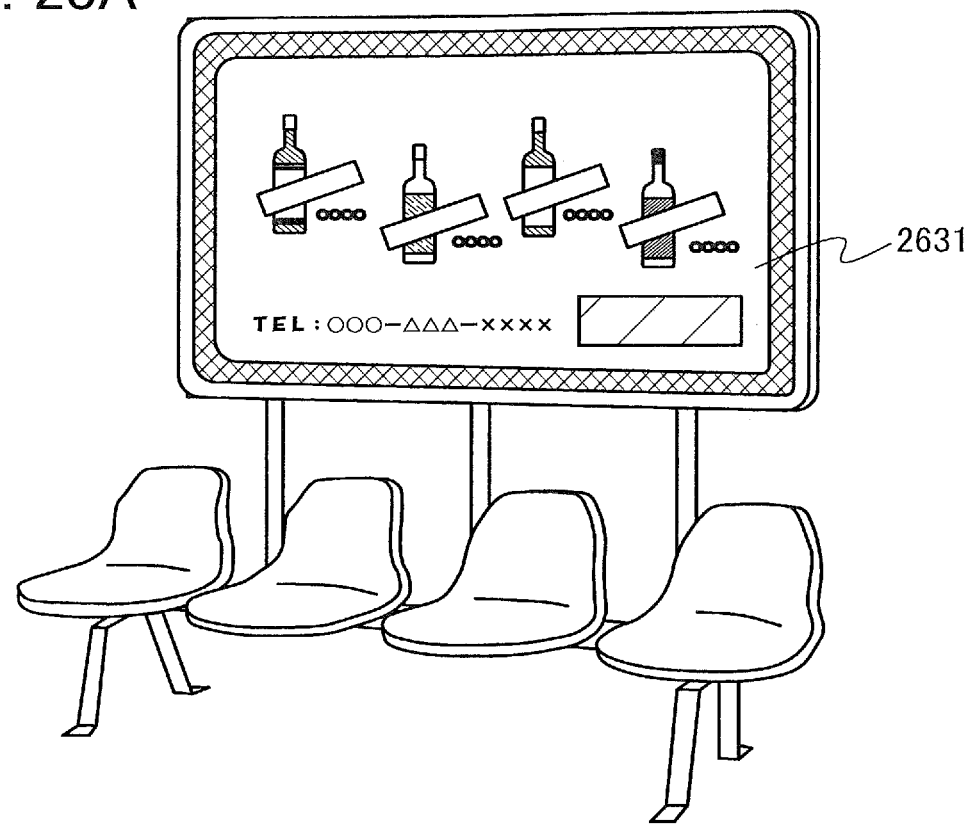
FIGS. 23A and 23B are views showing examples of a usage pattern of electronic paper.

FIG. 23A illustrates a poster 2631 formed using electronic paper. In the case where an advertising medium is printed paper, the advertisements are replaced by hands; however, by using electronic paper to which Embodiment 3 is applied, the advertisements can be changed in a short period of time. Further, stable images can be obtained without display defects. The poster may have a configuration capable of wirelessly transmitting and receiving data.

Figure 23B:
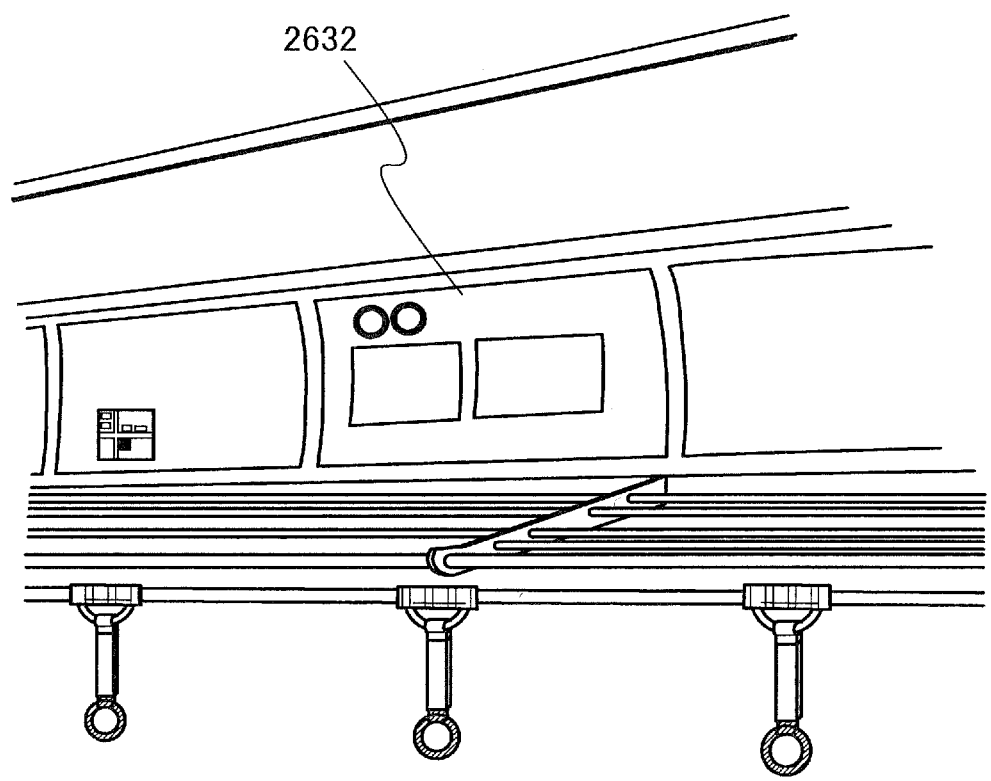

FIG. 23B illustrates an advertisement 2632 in a vehicle such as a train. In the case where an advertising medium is printed paper, the advertisement is replaced by hands; however, by using electronic paper to which Embodiment 3 is applied, the advertising display can be changed in a short period of time with less manpower. Furthermore, stable images can be obtained without display defects. The poster may have a configuration capable of wirelessly transmitting and receiving data.

Figure 24:
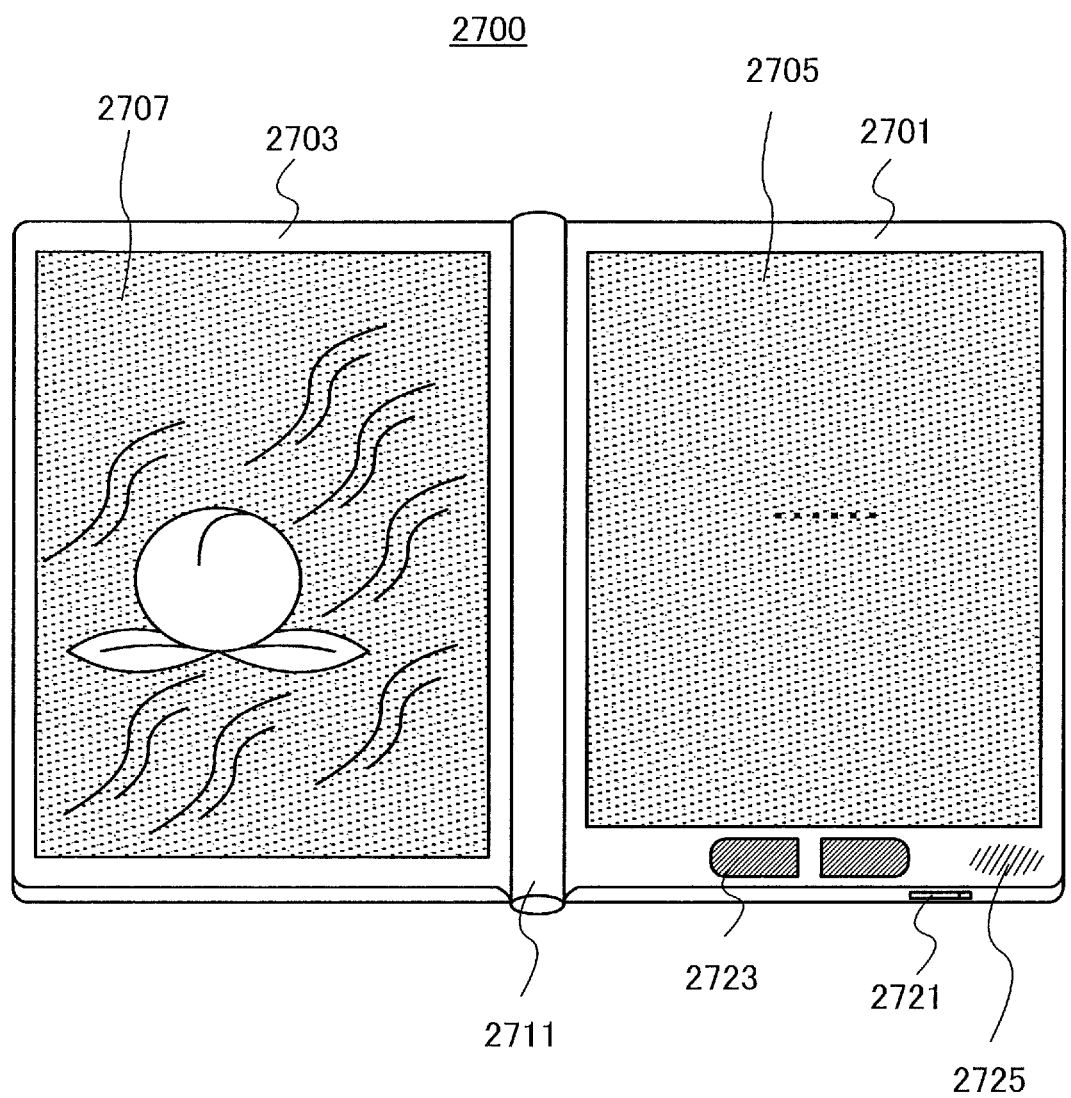
FIG. 24 is an external view of one example of an electronic book reader.

FIG. 24 illustrates an example of an e-book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 24) can display text and a display portion on the left side (the display portion 2707 in FIG. 24) can display graphics.

FIG. 24 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Embodiment 9

A semiconductor device according to one embodiment of the present invention can be applied to a variety of electronic devices (including an amusement machine). Examples of electronic devices include: television sets (also referred to as televisions or television receivers), monitor of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 25A:
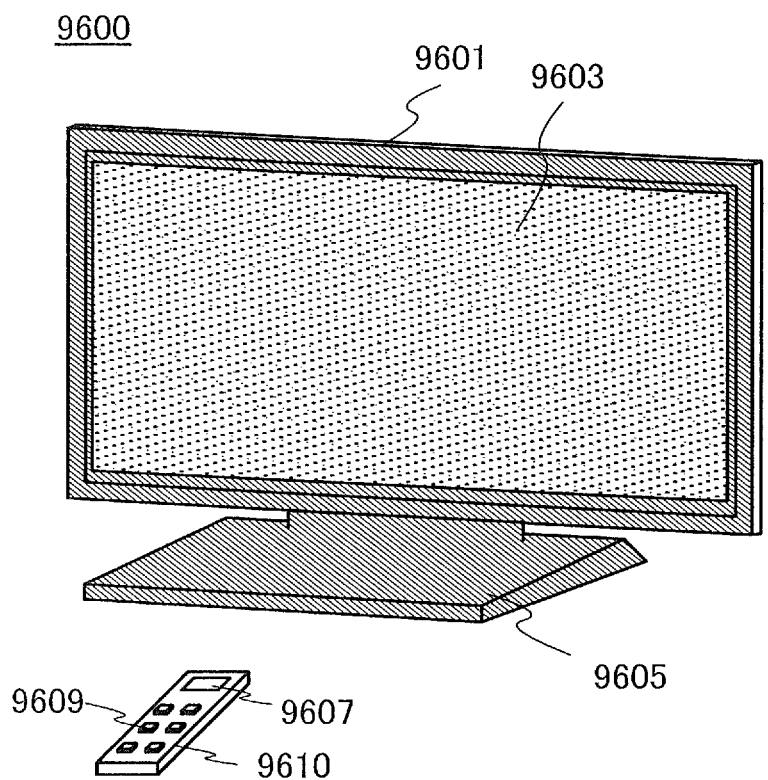
FIGS. 25A and 25B are external views showing respective examples of a television device and a digital photo frame.

FIG. 25A illustrates an example of a television set 9600. In the television set 9600, a display portion 9603 is incorporated in a housing 9601. The display portion 9603 can display images. In FIG. 25A, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 25B:
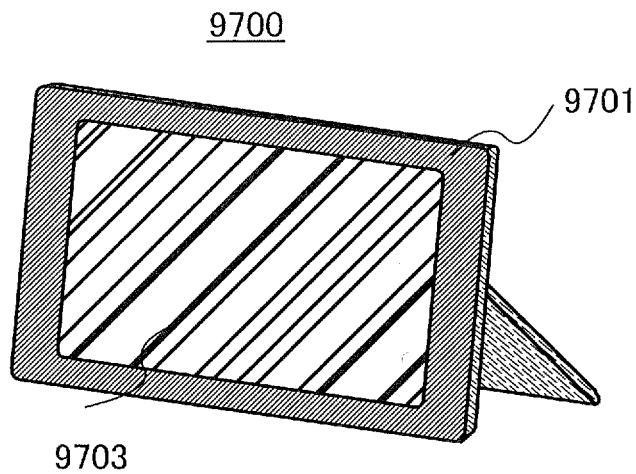

FIG. 25B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be downloaded and displayed on the display portion 9703.

The digital photo frame 9700 may transmit and receive data wirelessly. Through wireless communication, desired image data can be downloaded to be displayed.

Figure 26A:
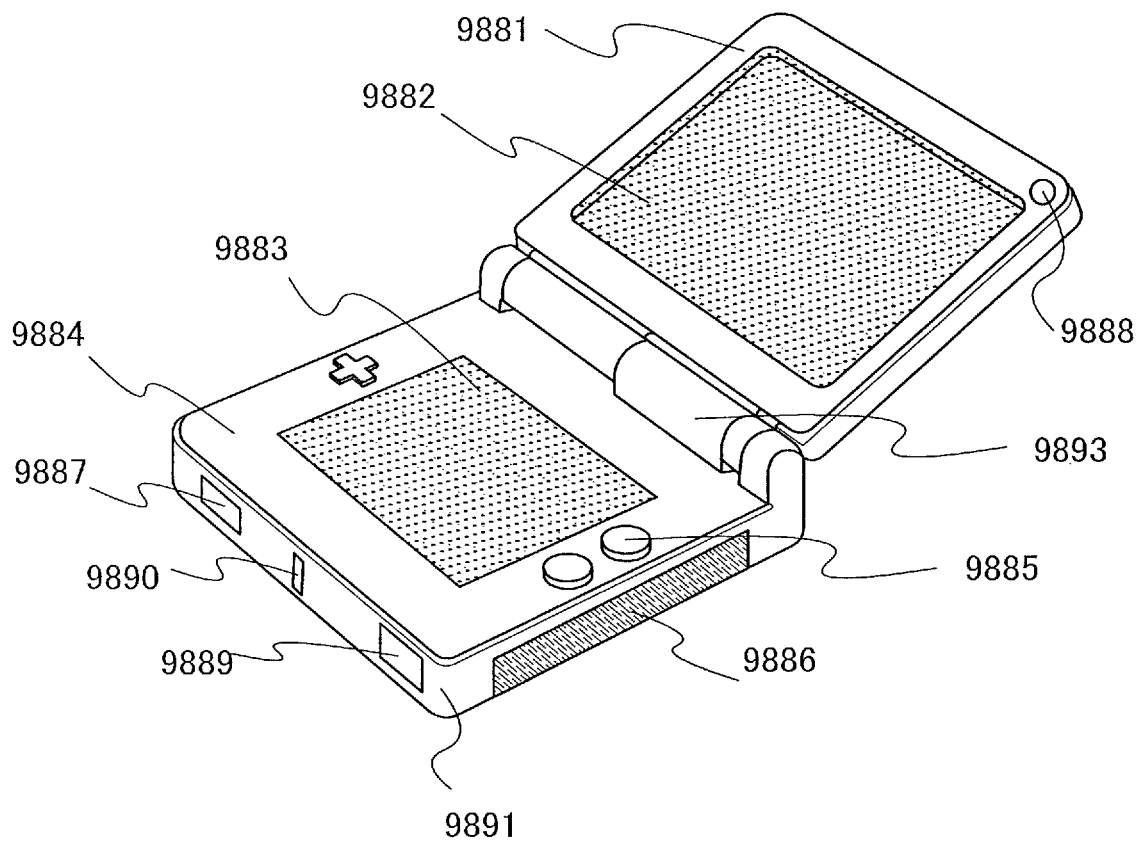
FIGS. 26A and 26B are external views showing examples of an amusement machine.

FIG. 26A is a portable game machine and includes two housings, a housing 9881 and a housing 9891, which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 26A is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable amusement machine is not limited to the above as long as the structure is provided with at least a semiconductor device including the thin film transistor described in Embodiment 1 or 2. The portable amusement machine may include other accessory equipment as appropriate. The portable game machine illustrated in FIG. 26A has a function of reading a program or data stored in a recording medium to display it on the display portion, and a function of sharing information with another portable game machine by wireless communication. Note that the function of the portable game machine illustrated in FIG. 26A is not limited to those described above, and the portable game machine can have a variety of functions.

Figure 26B:
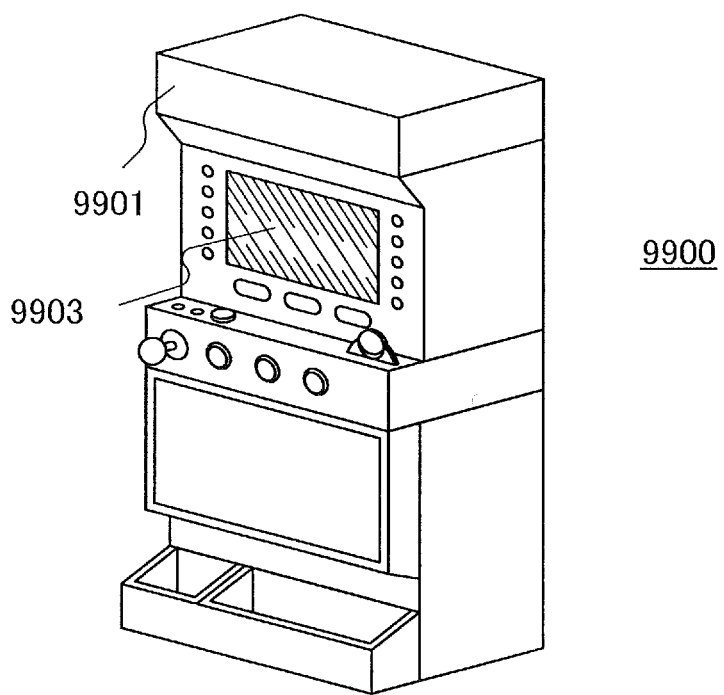

FIG. 26B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above as long as the structure is provided with at least a semiconductor device including the thin film transistor described in Embodiment 1 or 2. The slot machine 9900 may include other accessory equipment as appropriate.

Figure 27:
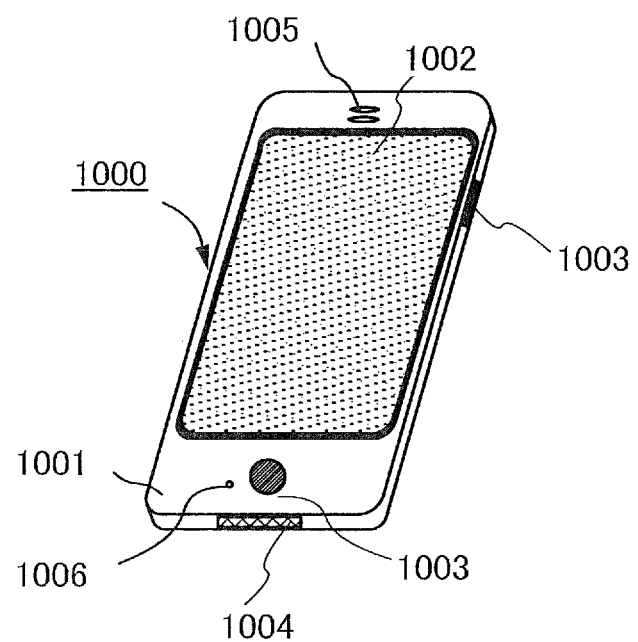
FIG. 27 is an external view showing one example of a mobile phone.

FIG. 27 illustrates an example of a mobile phone 1000. The mobile phone 1000 is provided with a display portion 1002 incorporated in a housing 1001, operation buttons 1003, an external connection port 1004, a speaker 1005, a microphone 1006, and the like.

When the display portion 1002 of the mobile phone 1000 illustrated in FIG. 27 is touched with a finger or the like, data can be input into the mobile phone 1000. Furthermore, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting information such as text. The third mode is a display-and-input mode in which two modes of the display mode and the input mode are mixed.

For example, in the case of making a call or composing a mail, a text input mode mainly for inputting text is selected for the display portion 1002 so that text displayed on a screen can be input. In that case, it is preferable to display a keyboard or number buttons on almost all the area of the screen of the display portion 1002.

When a detection device including a sensor for detecting inclination, such as a gyroscope or an acceleration sensor, is provided inside the mobile phone 1000, display on the screen of the display portion 1002 can be automatically switched by determining the direction of the mobile phone 1000 (whether the mobile phone 1000 is placed horizontally or vertically for a landscape mode or a portrait mode).

The screen mode is switched by touching the display portion 1002 or operating the operation buttons 1003 of the housing 1001. Alternatively, the screen modes can be switched depending on kinds of images displayed in the display portion 1002. For example, when a signal for an image displayed in the display portion is data of moving images, the screen mode is switched to the display mode, and whereas when the signal is text data, the screen mode is switched to the input mode.

Moreover, in the input mode, when input by touching the display portion 1002 is not performed within a specified period while a signal detected by the optical sensor in the display portion 1002 is detected, the screen mode may be controlled so as to be switched from the input mode to the display mode.

The display portion 1002 can also function as an image sensor. For example, an image of a palm print, a fingerprint, or the like is taken by touching the display portion 1002 with the palm or the finger, whereby personal authentication can be performed. Furthermore, by providing a backlight or a sensing light source emitting a near-infrared light for the display portion, an image of a finger vein, a palm vein, or the like can also be taken.

Embodiment 10

The examples in which a buffer layer is provided are described in Embodiments 1 and 2. In this embodiment, an example in which a buffer layer is not provided will be described. Further, an example in which an inverter circuit is formed using two n-channel thin film transistors will be described below.

A driver circuit for driving a pixel portion is formed using an inverter circuit, a capacitor, a resistor, and the like. When two n-channel TFTs are combined to form an inverter circuit, there are two types of combinations: a combination of an enhancement type transistor and a depletion type transistor (hereinafter, a circuit formed by such a combination is referred to as an "EDMOS circuit") and a combination of enhancement type TFTs (hereinafter, a circuit formed by such a combination is referred to as an "EEMOS circuit"). Note that when the threshold voltage of the n-channel TFT is positive, the n-channel TFT is defined as an enhancement type transistor, while when the threshold voltage of the n-channel TFT is negative, the n-channel TFT is defined as a depletion type transistor, and this specification follows the above definitions.

The pixel portion and the driver circuit are formed over the same substrate. In the pixel portion, ON/OFF of voltage application to a pixel electrode is switched using enhancement type transistors arranged in a matrix. An oxide semiconductor is used for these enhancement type transistors arranged in the pixel portion. Since the enhancement type transistor has electric characteristics such as an on/off ratio of greater than or equal to $10^9$ at a gate voltage of ±20 V, leakage current is small and low power consumption drive can be realized.

Figure 32A:
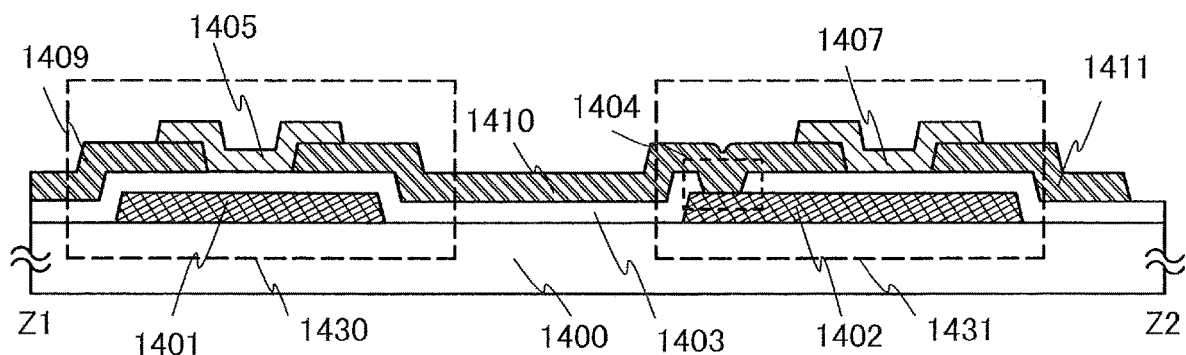
FIG. 32A is a view showing one example of a cross-sectional structure of a semiconductor device.

FIG. 32A illustrates a cross-sectional structure of the inverter circuit of the driver circuit. In FIG. 32A, a first gate electrode 1401 and a second gate electrode 1402 are provided over a substrate 1400. The first gate electrode 1401 and the second gate electrode 1402 each can be formed to have a single-layer structure or a stacked-layer structure using a metal material such as molybdenum, titanium, chromium, tantalum, tungsten, aluminum, copper, neodymium, or scandium, or an alloy material containing any of these materials as its main component.

For example, as a two-layer structure of each of the first gate electrode 1401 and the second gate electrode 1402, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable.

Further, a first wiring 1409, a second wiring 1410, and a third wiring 1411 are provided over a gate insulating layer 1403 that covers the first gate electrode 1401 and the second gate electrode 1402. The second wiring 1410 is directly connected to the second gate electrode 1402 through a contact hole 1404 formed in the gate insulating layer 1403.

Further, a first oxide semiconductor layer 1405 which is on and in contact with the first wiring 1409 and the second wiring 1410 is provided at a position overlapping with the first gate electrode 1401, and a second oxide semiconductor layer 1407 which is on and in contact with the second wiring 1410 and the third wiring 1411 is provided at a position overlapping with the second gate electrode 1402.

A first thin film transistor 1430 includes the first gate electrode 1401 and the first oxide semiconductor layer 1405 that overlaps with the first gate electrode 1401 with the gate insulating layer 1403 interposed therebetween, and the first wiring 1409 is a power supply line at a ground potential (a ground power supply line). This power supply line at a ground potential may be a power supply line to which a negative voltage VDL is applied (a negative power supply line).

In addition, the second thin film transistor 1431 includes the second gate electrode 1402 and the second oxide semiconductor layer 1407 overlapped with the second gate electrode 1402 with the gate insulating layer 1403 interposed therebetween, and the third wiring 1411 is a power supply line to which a positive voltage VDD is applied (a positive power supply line).

Tapered shapes of the side surfaces of the first wiring 1409 and the second wiring 1410 which face each other with the first oxide semiconductor layer 1405 interposed therebetween enable respective regions of the oxide semiconductor layer, which overlap with the side surfaces of the source electrode layer and the drain electrode layer to function as electric-field relaxation regions.

Further, tapered shapes of the side surfaces of the second wiring 1410 and the third wiring 1411 which face each other with the second oxide semiconductor layer 1407 interposed therebetween enable respective regions of the oxide semiconductor layer, which overlap with the side surfaces of the source electrode layer and the drain electrode layer to function as electric-field relaxation regions.

As illustrated in FIG. 32A, the second wiring 1410 which is electrically connected to both the first oxide semiconductor layer 1405 and the second oxide semiconductor layer 1407 is directly connected to the second gate electrode 1402 of the second thin film transistor 1431 through the contact hole 1404 formed in the gate insulating layer 1403. The second wiring 1410 and the second gate electrode 1402 are directly connected to each other, whereby favorable contact can be obtained, which leads to reduction in contact resistance. In comparison with the case where the second gate electrode 1402 and the second wiring 1410 are connected to each other with another conductive film, e.g., a transparent conductive film interposed therebetween, a reduction in the number of contact holes and a reduction in an area occupied by the driver circuit by the reduction in the number of contact holes can be achieved.

Figure 32B:
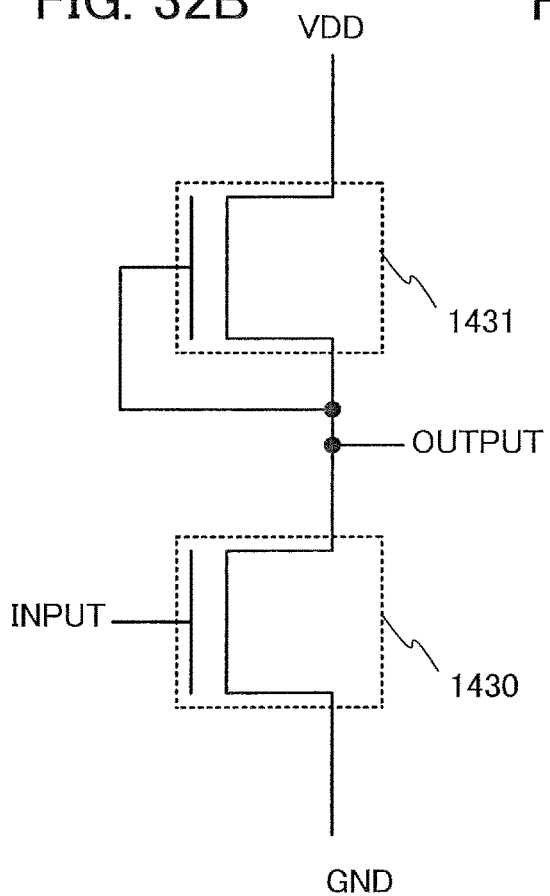
FIG. 32B is an equivalent circuit diagram thereof.
Figure 32C:
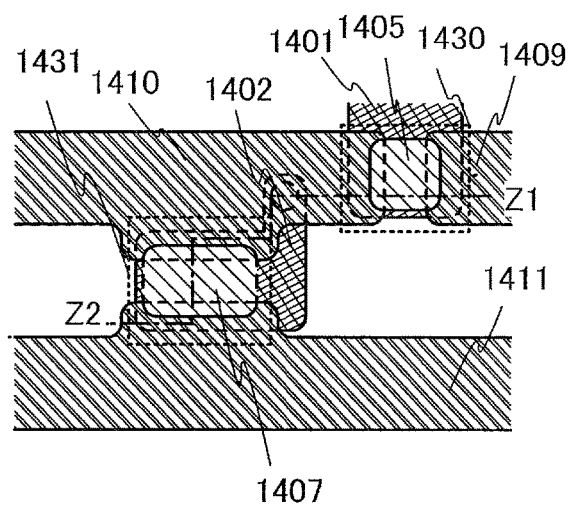
FIG. 32C is a top view thereof.

Further, FIG. 32C is a top view of the inverter circuit of the driver circuit. A cross section taken along chain line Z1-Z2 of FIG. 32C corresponds to FIG. 32A.

Further, FIG. 32B illustrates an equivalent circuit of the EDMOS circuit. The circuit connection illustrated in FIGS. 32A and 32C corresponds to that illustrated in FIG. 32B. Illustrated is an example in which the first thin film transistor 1430 is an enhancement-type n-channel transistor and the second thin film transistor 1431 is a depletion-type n-channel transistor.

Although the example of an EDMOS circuit is described in this embodiment, the driver circuit may be formed using an EEMOS circuit in which enhancement-type n-channel transistors are used.

Further, although the example in which a buffer layer is not provided is described in this embodiment, the present invention is not limited thereto and a buffer layer may be provided over the first wiring 1409, the second wiring 1410, and the third wiring 1411 like in Embodiment 1.

This embodiment can be freely combined with any one of Embodiments 1 to 9.

Embodiment 11

Figure 33A:
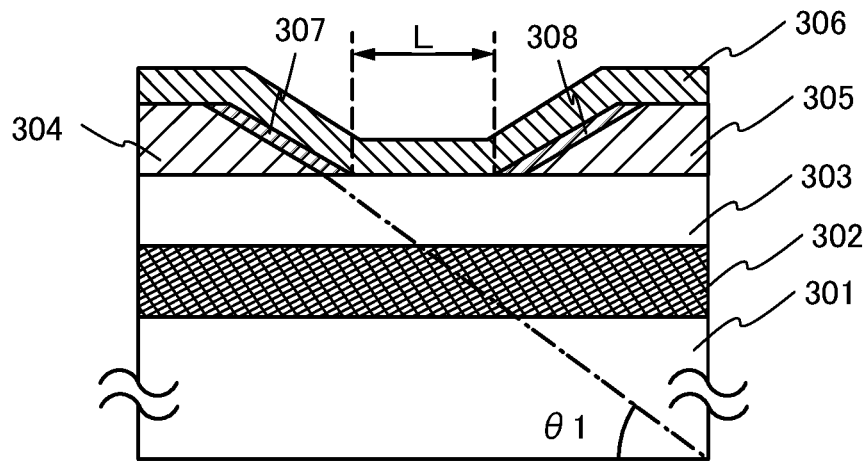
FIGS. 33A to 33C are cross-sectional views showing structures of a calculation model.
Figure 33B:
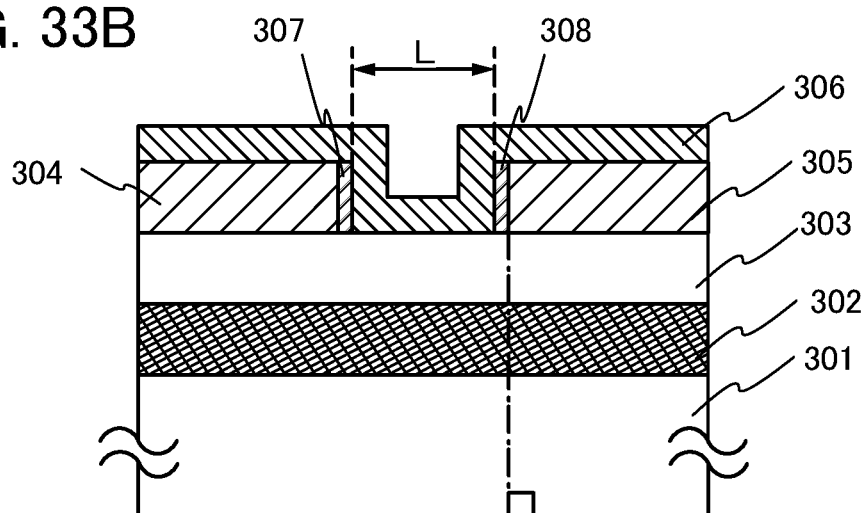
Figure 33C:
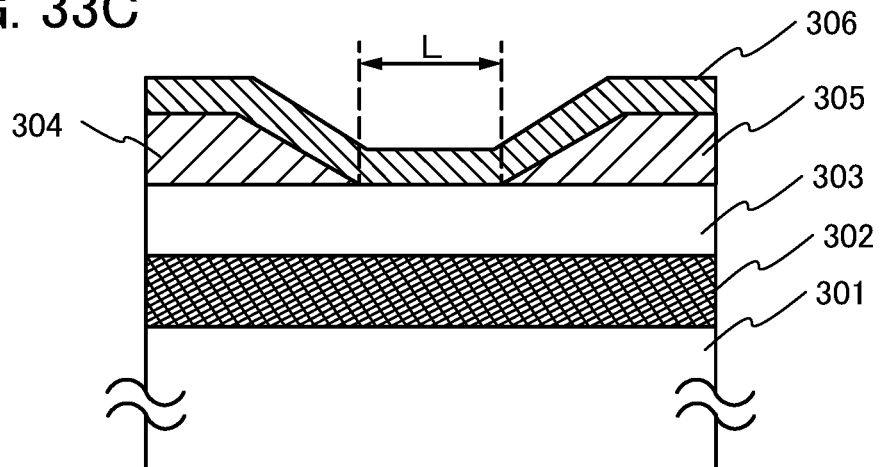

In Embodiment 11, the degradation of electrical characteristics of thin film transistors having model structures shown in FIGS. 33A to 33C when stress is applied was calculated.

In a structure shown in FIG. 33A, a gate electrode layer 302 and a gate insulating layer 303 are stacked over a glass substrate 301 in this order, and a source electrode layer 304 and a drain electrode layer 305 are formed thereover. An oxide layer 307 and an oxide layer 308 are provided on the side surface of the source electrode layer 304 and the side surface of the drain electrode layer 305 respectively. The oxide layers 307 and 308 here are respective native oxide films of the source electrode layer 304 and the drain electrode layer 305. An oxide semiconductor layer 306 is formed to cover the source electrode layer 304, the drain electrode layer 305, and the oxide layers 307 and 308.

In this embodiment, the gate electrode layer 302 was formed using molybdenum, and the source electrode layer 304 and the drain electrode layer 305 were formed using the same material as the gate electrode layer 302. The gate insulating layer 303 was a silicon oxide film, and thickness thereof was 100 nm and relative permittivity εr thereof was 4.1. The thickness of the oxide semiconductor layer 306 was 50 nm and a material thereof was an In—Ga—Zn—O-based non-single-crystal film. Channel length L of the thin film transistor was 10 μm and channel width W thereof was 10 μm.

As for the stress which was applied to the thin film transistor, gate voltage Vgs was set to 2 V and source-drain voltage Vds was set to 20 V. The period of time during which the stress is applied was 1000 seconds, and the electrical characteristics before and after the stress application were compared to each other.

Device simulator "Atlas" made by Silvaco was used for the calculation.

Further, the calculation was performed in the respective cases where the taper angles θ1 of the source electrode layer 304 are 27°, 45°, and 63°. The taper angle θ1 of the source electrode layer 304 was set to be the same angle as the taper angle θ2 of the drain electrode layer 305.

Figure 34:
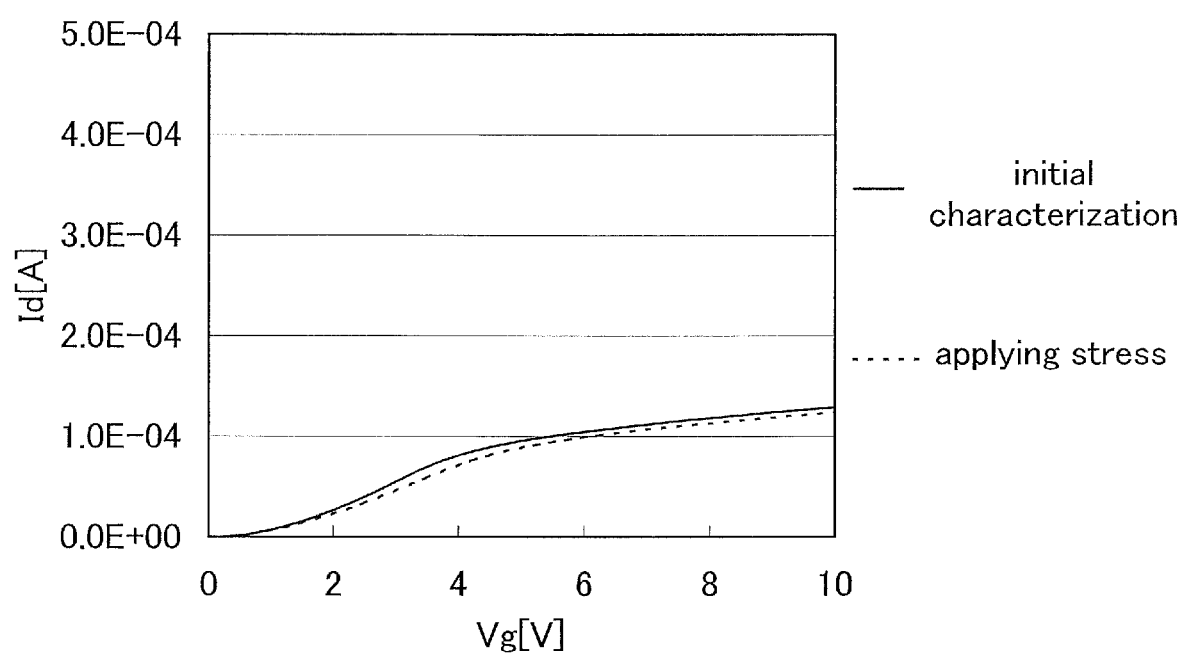
FIG. 34 is a graph showing calculation results.

Calculation results in the case where the taper angle θ1 of the source electrode layer 304 is 27° are shown in FIG. 34.

Figure 35:
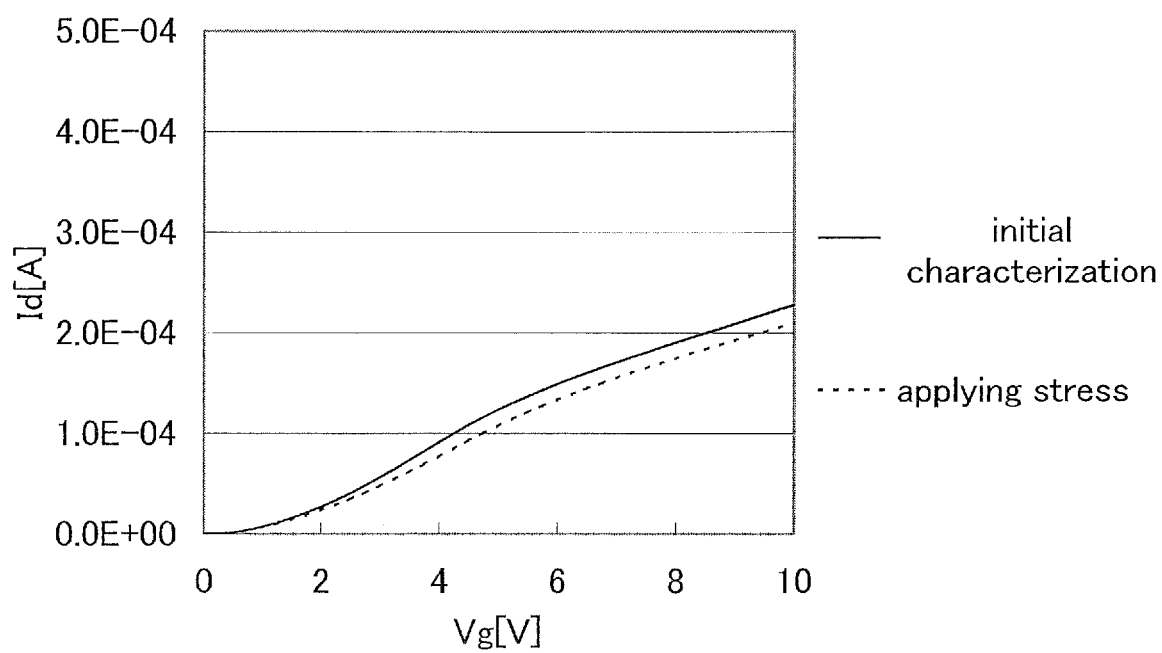
FIG. 35 is a graph showing calculation results.

Calculation results in the case where the taper angle θ1 of the source electrode layer 304 is 45° are shown in FIG. 35.

Figure 36:
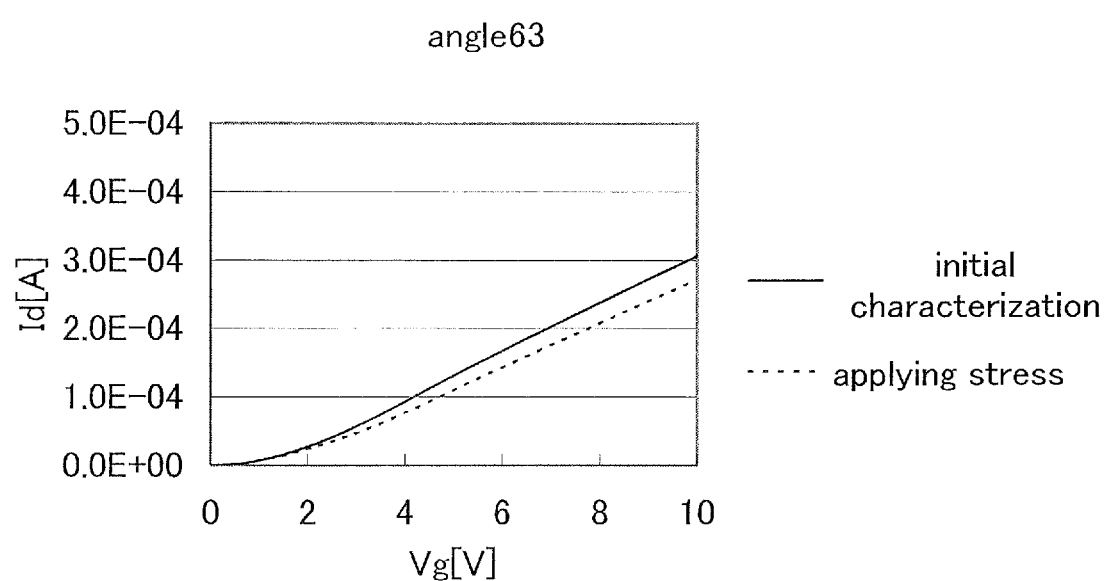
FIG. 36 is a graph showing calculation results.

Calculation results in the case where the taper angle θ1 of the source electrode layer 304 is 63° are shown in FIG. 36.

From these results of FIGS. 34 to 36, such result that the degradation becomes smaller as the taper angle θ1 of the source electrode layer 304 is smaller can be obtained.

Figure 37A:
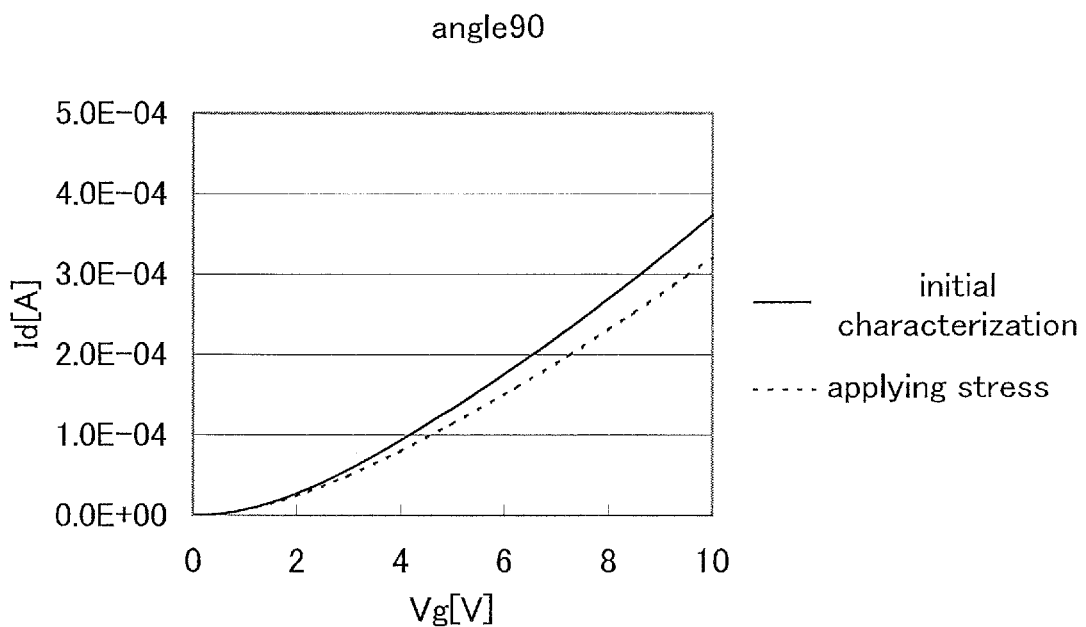
FIGS. 37A and 37B are graphs showing calculation results (comparative examples).

For comparison, the result of the calculation which was performed in the similar manner on a structure shown in FIG. 33B where taper angle θ1 is 90° is shown in FIG. 37A. The structure shown in FIG. 33B is the same as the structure shown in FIG. 33A except that the taper angle θ1 is different from that in FIG. 33A.

Figure 37B:
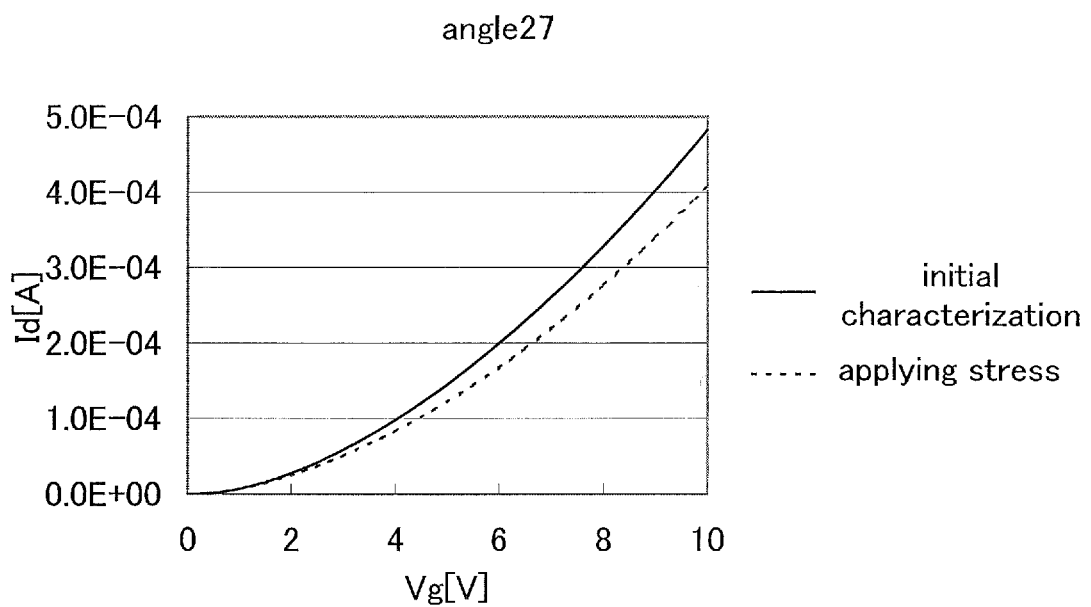

Furthermore, for comparison, the result of the calculation which was performed in the similar manner on a structure shown in FIG. 33C where taper angle θ1 is 27° and no oxide layer is formed on the side surface of each of a source electrode layer 304 and a drain electrode layer 305 is shown in FIG. 37B. Changing of the taper angle θ1 made no difference in the results as long as there is no oxide layer on the side surface of each electrode layer. In the case where there is no oxide layer on the side surface of each electrode layer, the interface between the gate insulating layer 303 and the oxide semiconductor layer 306 corresponds to a current path, and therefore, the taper angle of the side surface of the source electrode layer 304 does not affect the current path.

From these results, it can be said that degradation of the electrical characteristics of the thin film transistor can be suppressed by providing the oxide layer 307 and the oxide layer 308 on the respective side surfaces of the source electrode layer 304 and the drain electrode layer 305 and setting the taper angle θ1 to be smaller than 90°.

The embodiments described above will be described in more detail in examples below.

Example 1

In this example, characteristics of a thin film transistor manufactured using an oxide semiconductor layer will be described.

The method for manufacturing a transistor used in this example will be described below.

First, a first conductive film was formed over a substrate and patterned by a photolithography method to form a gate electrode 502. Then, a gate insulating layer 503 was formed over the gate electrode 502. Then, a second conductive film and a buffer layer were formed over the gate insulating layer 503. The second conductive film and the buffer layer were formed successively without exposing the substrate to the air. Then, the second conductive film and the buffer layer were patterned by a photolithography method, so that a source electrode layer 506a and a drain electrode layer 506b respective parts of which overlap with the gate electrode were formed. Then, an oxide semiconductor layer was formed over the gate insulating layer, the source electrode layer, and the drain electrode layer and patterned by a photolithography method to form an island-shaped oxide semiconductor layer 510 which functions as a channel formation region. Then, thermal treatment at 350° C. for 1 hour was performed under a nitrogen atmosphere.

As the substrate, a glass substrate manufactured by ASAHI GLASS CO., LTD. (product name: AN 100) was used.

As the first conductive film for forming the gate electrode 502, a tungsten film with a thickness of 100 nm was formed by a sputtering method.

As the gate insulating layer 503, a silicon oxynitride film with a thickness of 100 nm was formed by a plasma CVD method.

As the second conductive film for forming the source electrode layer 506a and the drain electrode layer 506b, a tungsten film with a thickness of 100 nm was formed by a sputtering method.

As the buffer layer, an In—Ga—Zn—O-based non-single-crystal film with a thickness of 5 to 10 nm was formed by a sputtering method. As for the film deposition condition, only an argon gas was used and a target in which $In_2O_3$: $Ga_2O_3$:ZnO=1:1:1 was used.

As the oxide semiconductor layer, an In—Ga—Zn—O-based non-single-crystal film with a thickness of 150 nm was formed by a sputtering method. The film deposition condition was as follows: the pressure was 0.4 Pa, the power was 500 W, the film deposition temperature was 25° C., the argon gas flow rate was 10 sccm, the oxygen flow rate was 5 sccm, the distance between the glass substrate and the target was 170 mm, and a direct-current (DC) power source was used. As the target, a target in which $In_2O_3$:$Ga_2O_3$: ZnO=1:1:1 (In:Ga:Zn=1:1:0.5) was used. After a plasma treatment was performed, the oxide semiconductor layer was formed successively without exposing a substrate 500 to the air. From the measurement with inductively coupled plasma mass spectrometry (ICP-MS), the composition of the oxide semiconductor layer obtained by this film deposition condition was $InGa_{0.94}Zn_{0.40}O_{3.31}$.

Figure 28:
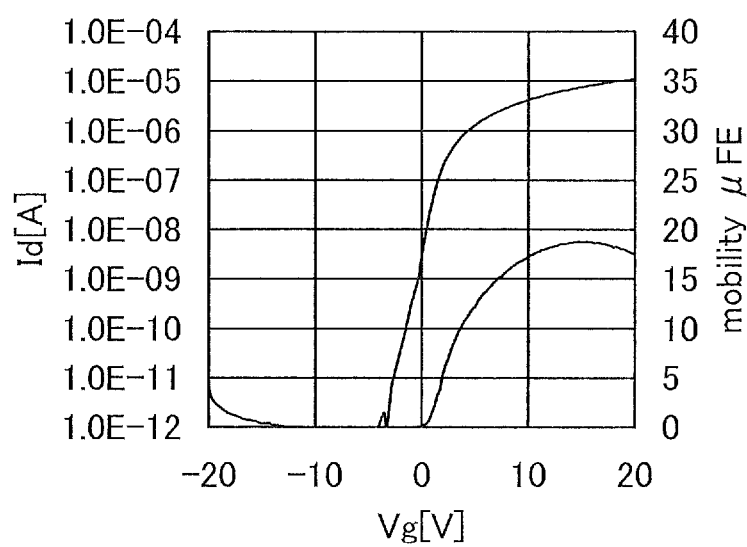
FIG. 28 is a graph showing one example of electrical characteristics of a thin film transistor.

FIG. 28 is a graph showing a $V_g$-$I_d$ curve of a thin film transistor. In this example, the drain voltage (a voltage which is applied to the drain with respect to a voltage which is applied to the source) was set to 1 V for the measurement.

Figure 29:
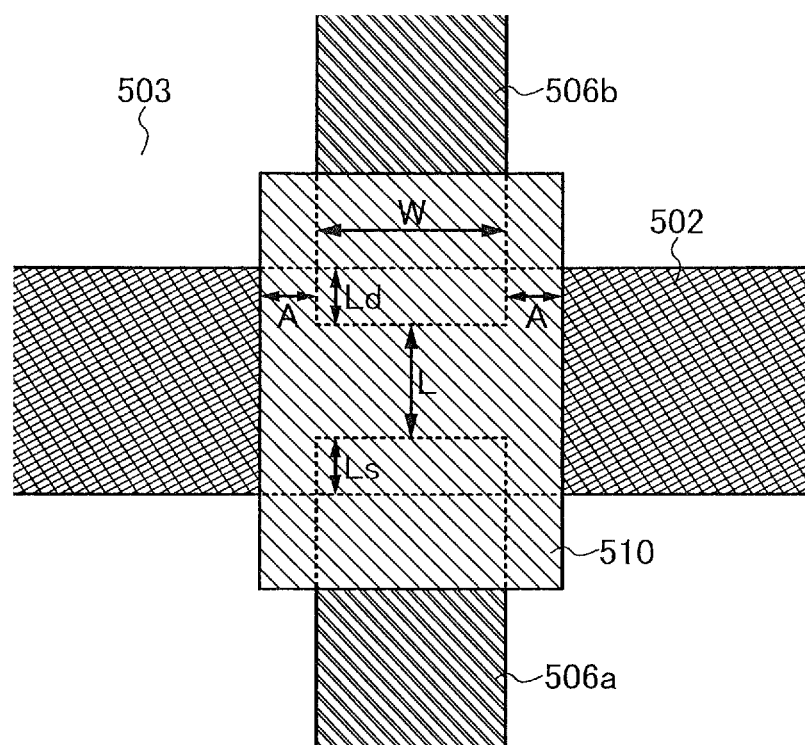
FIG. 29 is a top view of a thin film transistor manufactured to measure the electrical characteristics.

In this example also, the structure of the transistor was as follows, which is shown in FIG. 29. In specific, channel length L of the transistor was set to 100 μm, channel width W of the transistor was set to 100 μm, length Ls where the source electrode layer 506a and the gate electrode 502 overlap with each other was set to 5 μm, length Ld where the drain electrode layer 506b and the gate electrode 502 overlap with each other was set to 5 μm, and each length A where the oxide semiconductor layer 510 does not overlap with either the source electrode layer 506a or the drain electrode layer 506b in the direction which is parallel to the channel width was set to 5 μm.

Through the above, it was found that the successive formation of the second conductive film and the buffer layer without exposing the substrate to the air enables the on/off ratio of the transistor to be increased and the electron field-effect mobility to be increased.

Example 2

Figure 30A:
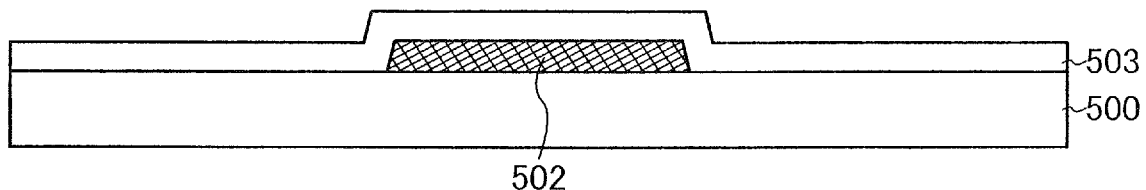
FIGS. 30A to 30C are cross-sectional views showing a process for manufacturing a sample.
Figure 30B:
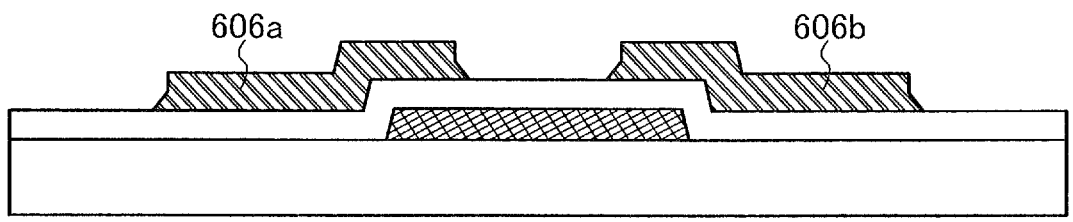

In this example, one example of the electrode shape after etching will be described. First, the process for manufacturing a sample will be described using FIGS. 30A to 30C. The sample is different from the thin film transistor described in Example 1 only in the cross-sectional shape of each of a source electrode layer and a drain electrode layer and in that a buffer layer is not formed, and will be described using the same reference numerals for the same portions as those of the thin film transistor described in Example 1.

First, a first conductive film was formed over a substrate and patterned by a photolithography method to form a gate electrode 502. Then, a gate insulating layer 503 was formed over the gate electrode 502 (see FIG. 30A). Then, a second conductive film was formed over the gate insulating layer 503. Then, the second conductive film was patterned by a photolithography method, so that a source electrode layer 606a and a drain electrode layer 606b respective parts of which overlap with the gate electrode were formed (see FIG. 30B). Then, an oxide semiconductor layer was formed over the gate insulating layer, the source electrode layer, and the drain electrode layer and patterned by a photolithography method to form an island-shaped oxide semiconductor layer 610 which functions as a channel formation region was formed (see FIG. 30C).

As the substrate, a glass substrate manufactured by ASAHI GLASS CO., LTD. (product name: AN 100) was used.

As the first conductive film for forming the gate electrode 502, a tungsten film with a thickness of 100 nm was formed by a sputtering method.

As the gate insulating layer 503, a silicon oxynitride film with a thickness of 100 nm was formed by a plasma CVD method.

As the second conductive film for forming the source electrode layer 606a and the drain electrode layer 606b, a tungsten film with a thickness of 100 nm was formed by a sputtering method.

As the oxide semiconductor layer, an In—Ga—Zn—O-based non-single-crystal film with a thickness of 150 nm was formed by a sputtering method. The film deposition condition thereof was the same as that in Example 1.

The source electrode layer 606a and the drain electrode layer 606b were etched by using an ICP etching apparatus using a coiled antenna. The etching was performed by generating plasma under the following condition: the gas flow rate of $CF_4$ was set to 25 sccm, the gas flow rate of $Cl_3$ was set to 25 sccm, the gas flow rate of $O_2$ was set to 10 sccm, and an RF (13.56 MHz) power of 500 W was applied to a coiled electrode at a pressure of 1.5 Pa. An RF (13.56 MHz) power of 10 W was applied to the substrate side (sample stage), which means that a negative self-bias voltage was substantially applied thereto. This etching was stopped when at least the gate insulating film 503 is exposed to some extent, thereby forming the side surface of the electrode, which has a step.

Figure 30C:
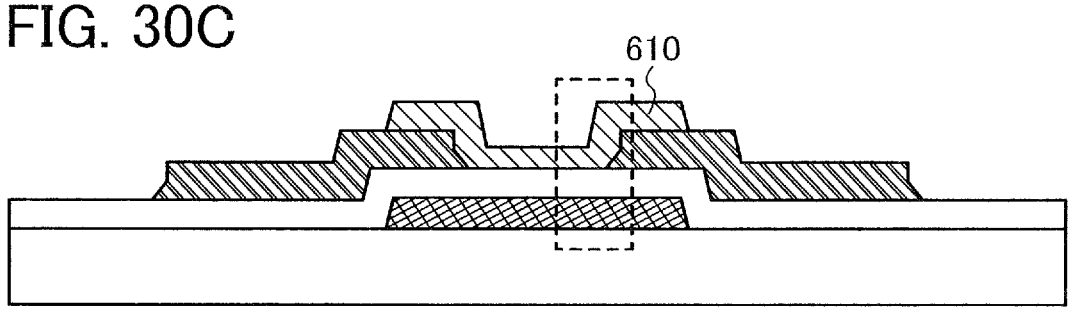
Figure 31A:
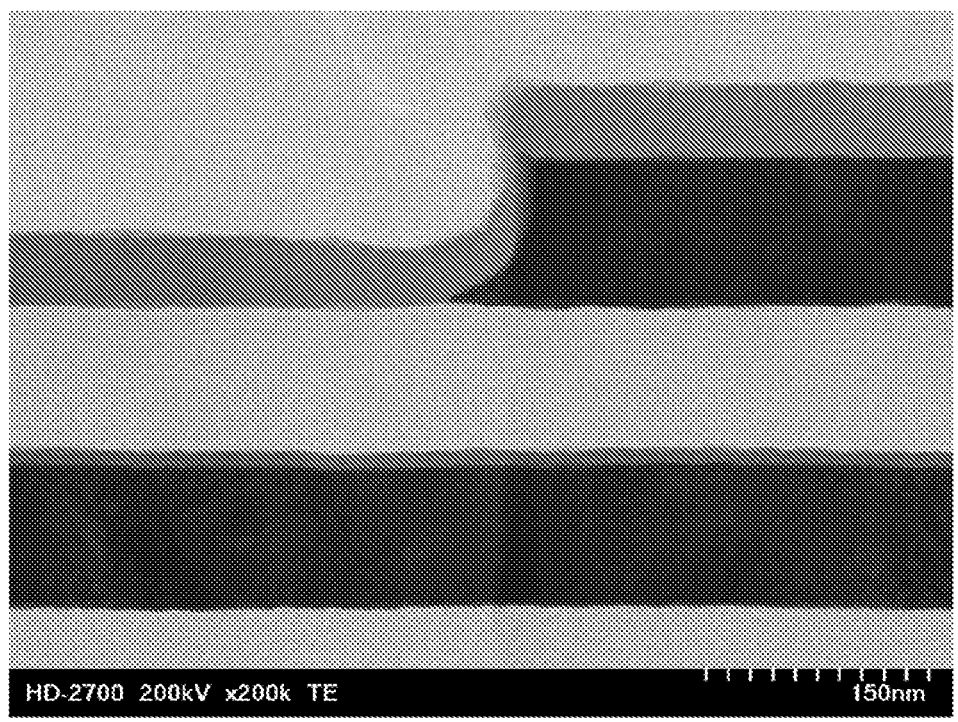
FIGS. 31A and 31B are a photograph and a cross-sectional view showing a part of the cross-section of a sample.
Figure 31B:
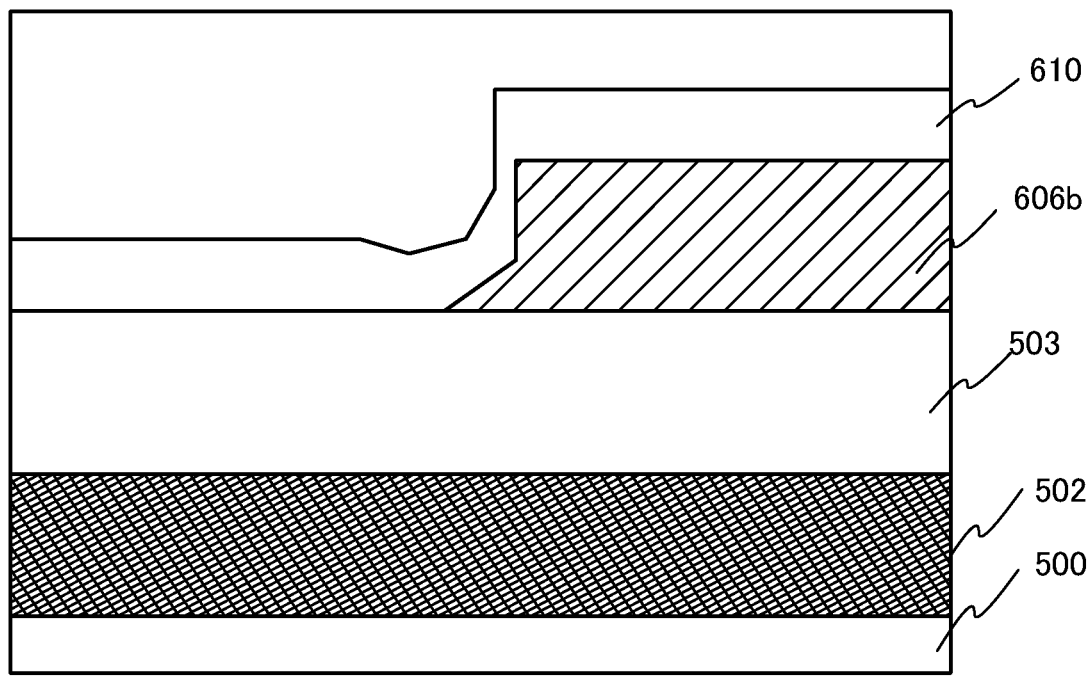

By the above etching condition, with respect to the cross-sectional shape of the source electrode layer 606a, the angle θ1 formed between the surface of the substrate and the bottom edge of the side surface of the source electrode layer 606a can be made to be greater than or equal to 20° and less than 90°. The cross-sectional photograph of the portion surrounded by a dotted line in FIG. 30C is FIG. 31A. FIG. 31B is a pattern diagram of FIG. 31A. As shown in FIG. 31A, θ1 was about 40°. Further, as shown in FIG. 31A, the angle formed between the surface of the substrate and the top edge of the side surface of the source electrode layer 606a was about 90°. The cross section of the side surface of the source electrode layer 606a and that of the side surface of the drain electrode layer 606b, which face each other with the oxide semiconductor layer 610 interposed therebetween have substantially the same shape as each other because the same etching step is performed thereon.

From this example, it can be said that it can be suggested that the cross-sectional shape of each of the source electrode layer and the drain electrode layer described in Embodiment 2 is manufactured.

This application is based on Japanese Patent Application serial no. 2008-287187 filed with Japan Patent Office on Nov. 7, 2008, the entire contents of which are hereby incorporated by reference.

What is claimed is:

1. A display device comprising:
a first driver circuit over a substrate, the first driver circuit comprising a first transistor and a second transistor;
a second driver circuit over the substrate; and
a pixel portion over the substrate, the pixel portion comprising a third transistor, a fourth transistor, and a light-emitting element,
wherein the first driver circuit comprises:
a first gate electrode and a second gate electrode over the substrate;
a first wiring over the first gate electrode, the first wiring functioning as one of a source electrode and a drain electrode of the first transistor;
a second wiring over the first gate electrode and the second gate electrode, the second wiring functioning as the other of the source electrode and the drain electrode of the first transistor and one of a source electrode and a drain electrode of the second transistor;
a third wiring over the second gate electrode, the third wiring functioning as the other of the source electrode and the drain electrode of the second transistor;
a first oxide semiconductor layer over the first wiring and the second wiring, the first oxide semiconductor layer in contact with a side surface and a top surface of the first wiring and a first side surface and a first top surface of the second wiring; and
a second oxide semiconductor layer over the second wiring and the third wiring, the second oxide semiconductor layer in contact with a second side surface and a second top surface of the second wiring and a side surface and a top surface of the third wiring,
wherein the first oxide semiconductor layer is not in contact with the second oxide semiconductor layer,
wherein the third transistor comprises:
a source electrode layer and a drain electrode layer over the substrate; and
a third oxide semiconductor layer over the source electrode layer and the drain electrode layer, the third oxide semiconductor layer in contact with a side surface of each of the source electrode layer and the drain electrode layer,
wherein a gate electrode of the third transistor is electrically connected to the first driver circuit,
wherein a gate electrode of the fourth transistor is electrically connected to the second driver circuit, and
wherein the fourth transistor is positioned between a driving transistor and the light-emitting element.

2. A display device comprising:
a first driver circuit over a substrate, the first driver circuit comprising a first transistor and a second transistor;
a second driver circuit over the substrate; and
a pixel portion over the substrate, the pixel portion comprising a third transistor, a fourth transistor, and a light-emitting element,
wherein the first driver circuit comprises:
a first gate electrode and a second gate electrode over the substrate;
a first wiring over the first gate electrode, the first wiring functioning as one of a source electrode and a drain electrode of the first transistor;
a second wiring over the first gate electrode and the second gate electrode, the second wiring functioning as the other of the source electrode and the drain electrode of the first transistor and one of a source electrode and a drain electrode of the second transistor;
a third wiring over the second gate electrode, the third wiring functioning as the other of the source electrode and the drain electrode of the second transistor;
a first oxide semiconductor layer over the first wiring and the second wiring, the first oxide semiconductor layer in contact with a side surface and a top surface of the first wiring and a first side surface and a first top surface of the second wiring; and
a second oxide semiconductor layer over the second wiring and the third wiring, the second oxide semiconductor layer in contact with a second side surface and a second top surface of the second wiring and a side surface and a top surface of the third wiring,
wherein the first oxide semiconductor layer is not in contact with the second oxide semiconductor layer,
wherein the third transistor comprises:
a source electrode layer and a drain electrode layer over the substrate; and
a third oxide semiconductor layer over the source electrode layer and the drain electrode layer, the third oxide semiconductor layer in contact with a side surface of each of the source electrode layer and the drain electrode layer,
wherein a gate electrode of the third transistor is electrically connected to the first driver circuit,
wherein a gate electrode of the fourth transistor is electrically connected to the second driver circuit,
wherein the fourth transistor is positioned between a driving transistor and the light-emitting element, and
wherein each of the first oxide semiconductor layer, the second oxide semiconductor layer, and the third oxide semiconductor layer comprises indium, gallium, and zinc.

3. A display device comprising:
a first driver circuit over a substrate, the first driver circuit comprising a first transistor and a second transistor;
a second driver circuit over the substrate; and
a pixel portion over the substrate, the pixel portion comprising a third transistor, a fourth transistor, and a light-emitting element,
wherein the first driver circuit comprises:
a first gate electrode and a second gate electrode over the substrate;
a first wiring over the first gate electrode, the first wiring functioning as one of a source electrode and a drain electrode of the first transistor;
a second wiring over the first gate electrode and the second gate electrode, the second wiring functioning as the other of the source electrode and the drain electrode of the first transistor and one of a source electrode and a drain electrode of the second transistor;
a third wiring over the second gate electrode, the third wiring functioning as the other of the source electrode and the drain electrode of the second transistor;
a first oxide semiconductor layer over the first wiring and the second wiring, the first oxide semiconductor layer in contact with a side surface and a top surface of the first wiring and a first side surface and a first top surface of the second wiring; and a second oxide semiconductor layer over the second wiring and the third wiring, the second oxide semiconductor layer in contact with a second side surface and a second top surface of the second wiring and a side surface and a top surface of the third wiring, wherein the first oxide semiconductor layer is not in contact with the second oxide semiconductor layer, wherein the third transistor comprises:
   a source electrode layer and a drain electrode layer over the substrate; and
   a third oxide semiconductor layer over the source electrode layer and the drain electrode layer, the third oxide semiconductor layer in contact with a side surface of each of the source electrode layer and the drain electrode layer, wherein a gate electrode of the third transistor is electrically connected to the first driver circuit, wherein a gate electrode of the fourth transistor is electrically connected to the second driver circuit, wherein the fourth transistor is positioned between a driving transistor and the light-emitting element, wherein each of the first oxide semiconductor layer, the second oxide semiconductor layer, and the third oxide semiconductor layer comprises indium, gallium, and zinc, and wherein the pixel portion is positioned between the first driver circuit and the second driver circuit.

\* \* \* \* \*